(12) United States Patent
Tokita et al.

(10) Patent No.: US 12,347,492 B2
(45) Date of Patent: Jul. 1, 2025

(54) THREE-DIMENSIONAL MEMORY DEVICE WITH HIGH CONTACT VIA DENSITY AND METHODS OF FORMING THE SAME

(71) Applicant: SANDISK TECHNOLOGIES LLC, Addison, TX (US)

(72) Inventors: Hirofumi Tokita, Yokkaichi (JP); Tomohiro Kubo, Yokkaichi (JP); Shiqian Shao, Fremont, CA (US); Fumiaki Toyama, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 513 days.

(21) Appl. No.: 17/810,097

(22) Filed: Jun. 30, 2022

(65) Prior Publication Data

US 2024/0005990 A1   Jan. 4, 2024

(51) Int. Cl.
*G11C 16/04*   (2006.01)
*H01L 23/522*  (2006.01)
(Continued)

(52) U.S. Cl.
CPC ...... *G11C 16/0483* (2013.01); *H01L 23/5226* (2013.01); *H01L 23/5283* (2013.01);
(Continued)

(58) Field of Classification Search
CPC ............ G11C 16/0483; H01L 23/5226; H01L 23/5283; H10B 41/10; H10B 41/27;
(Continued)

(56) References Cited

U.S. PATENT DOCUMENTS

| | | |
|---|---|---|
| 9,905,573 B1 | 2/2018 | Mada et al. |
| 10,081,443 B2 | 9/2018 | Engel et al. |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Christine S. Kim
*Assistant Examiner* — Andrew Victor Prostor
(74) *Attorney, Agent, or Firm* — THE MARBURY LAW GROUP PLLC

(57) ABSTRACT

A three-dimensional memory device includes an alternating stack of insulating layers and electrically conductive layers, a first three-dimensional memory array located in a first memory array region, and a second three-dimensional memory array located in a second memory array region that is laterally spaced from the first memory array region along a first horizontal direction by an inter-array region. The alternating stack is laterally bounded by two trench fill structures that are laterally spaced apart along a second horizontal direction by an inter-trench spacing. The inter-array region includes a stepped cavity having vertical steps of the alternating stack that laterally extend along different horizontal directions. Multiple rows of contact via structures may contact different electrically conductive layers in the stepped cavity. Alternatively or additionally, a top portion of the stepped cavity and a width of a bridge region of the electrically conductive layers in the inter-array region may have a variable lateral extent along the second horizontal direction.

23 Claims, 70 Drawing Sheets

(51) Int. Cl.
| | |
|---|---|
| *H01L 23/528* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC ............. *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/35; H10B 43/10; H10B 43/27; H10B 43/35; H10B 41/50; H10B 43/50
USPC ....................................................... 257/314
See application file for complete search history.

(56) References Cited

U.S. PATENT DOCUMENTS

| | | | |
|---|---|---|---|
| 10,115,681 B1 | 10/2018 | Ariyoshi et al. | |
| 10,192,877 B2 | 1/2019 | Norizuki et al. | |
| 10,290,803 B2 | 5/2019 | Sano et al. | |
| 10,546,870 B2 | 1/2020 | Shimabukuro et al. | |
| 10,804,284 B2 | 10/2020 | Ishii et al. | |
| 10,847,524 B2 | 11/2020 | Otsu et al. | |
| 11,114,459 B2 | 9/2021 | Iwai et al. | |
| 11,133,252 B2 | 9/2021 | Ito et al. | |
| 11,139,237 B2 | 10/2021 | Shao et al. | |
| 11,322,440 B2 | 5/2022 | Kubo | |
| 11,342,245 B2 | 5/2022 | Cui et al. | |
| 11,355,506 B2 | 6/2022 | Tokita et al. | |
| 2018/0061850 A1 | 3/2018 | Mada et al. | |
| 2018/0158873 A1 | 6/2018 | Sano et al. | |
| 2018/0261611 A1 | 9/2018 | Norizuki et al. | |
| 2019/0221574 A1 | 7/2019 | Shimabukuro et al. | |
| 2019/0319040 A1 | 10/2019 | Ishii et al. | |
| 2021/0057336 A1 | 2/2021 | Shao et al. | |
| 2021/0126008 A1* | 4/2021 | Tanabe | H01L 24/05 |
| 2021/0134827 A1 | 5/2021 | Iwai et al. | |
| 2021/0242128 A1 | 8/2021 | Ito et al. | |
| 2021/0366808 A1 | 11/2021 | Cui et al. | |
| 2021/0366920 A1 | 11/2021 | Tokita et al. | |
| 2021/0366924 A1 | 11/2021 | Tokita et al. | |
| 2021/0391257 A1* | 12/2021 | Nguyen | H10B 41/35 |
| 2022/0020681 A1* | 1/2022 | Nojima | H10B 43/50 |

OTHER PUBLICATIONS

U.S. Appl. No. 17/146,866, filed Jan. 12, 2021, SanDisk Technologies LLC.
U.S. Appl. No. 17/174,064, filed Feb. 11, 2021, SanDisk Technologies LLC.
U.S. Appl. No. 17/174,094, filed Feb. 11, 2021, SanDisk Technologies LLC.
U.S. Appl. No. 17/224,370, filed Apr. 7, 2021, SanDisk Technologies LLC.
U.S. Appl. No. 17/226,321, filed Apr. 9, 2021, SanDisk Technologies LLC.
U.S. Appl. No. 17/244,258, filed Apr. 29, 2021, SanDisk Technologies LLC.
U.S. Appl. No. 17/224,311, filed Apr. 29, 2021, SanDisk Technologies LLC.
U.S. Appl. No. 17/397,678, filed Aug. 9, 2021, SanDisk Technologies LLC.
U.S. Appl. No. 17/397,777, filed Aug. 9, 2021, SanDisk Technologies LLC.
U.S. Appl. No. 17/397,846, filed Aug. 9, 2021, SanDisk Technologies LLC.
U.S. Appl. No. 17/406,463, filed Aug. 19, 2021, SanDisk Technologies LLC.
U.S. Appl. No. 17/411,689, filed Aug. 25, 2021, SanDisk Technologies LLC.
U.S. Appl. No. 17/411,726, filed Aug. 25, 2021, SanDisk Technologies LLC.
U.S. Appl. No. 17/462,446, filed Aug. 31, 2021, SanDisk Technologies LLC.
U.S. Appl. No. 17/467,970, filed Sep. 7, 2021, SanDisk Technologies LLC.
U.S. Appl. No. 17/510,807, filed Oct. 26, 2021, SanDisk Technologies LLC.
U.S. Appl. No. 17/530,861, filed Nov. 19, 2021, SanDisk Technologies LLC.
U.S. Appl. No. 17/556,298, filed Dec. 20, 2021, SanDisk Technologies LLC.
U.S. Appl. No. 17/806,579, filed Jun. 13, 2021, SanDisk Technologies LLC.
Kubo, T. et al., "Three-Dimensional Memory Device With High Contact via Density and Methods of Forming The Same," U.S. Appl. No. 17/810,124, filed Jun. 30, 2022.

* cited by examiner

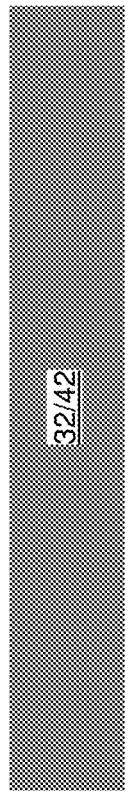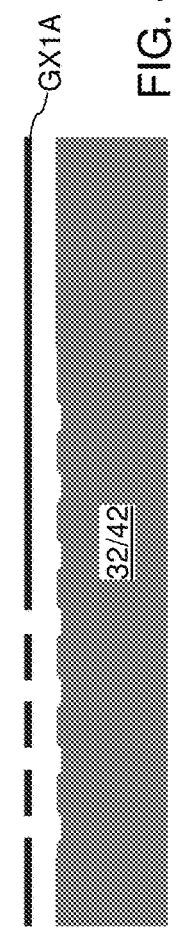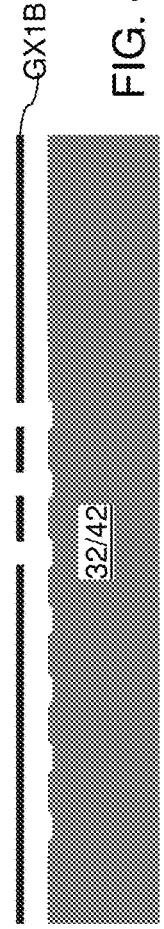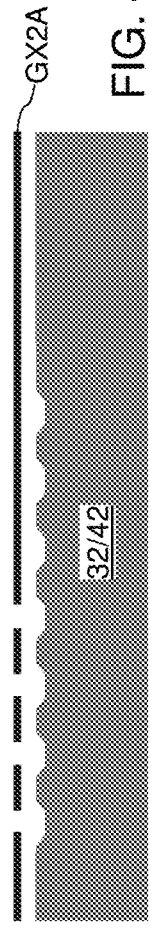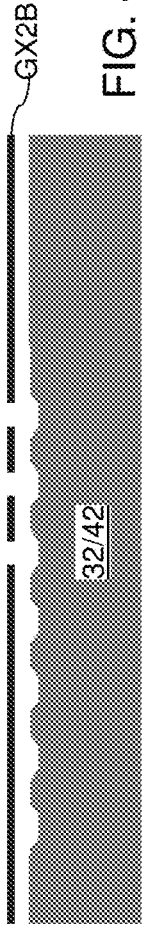

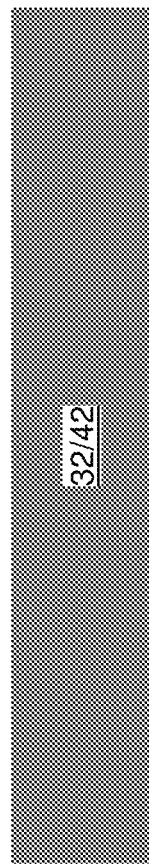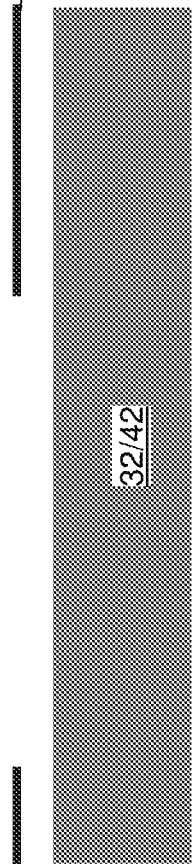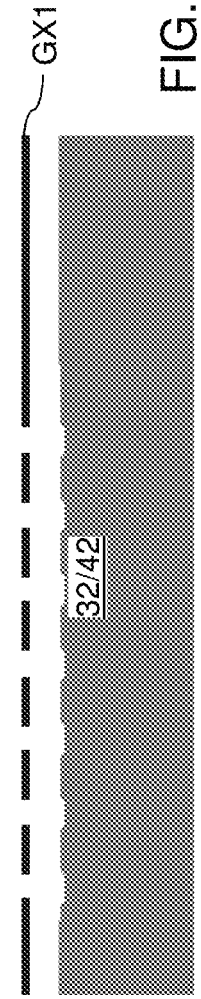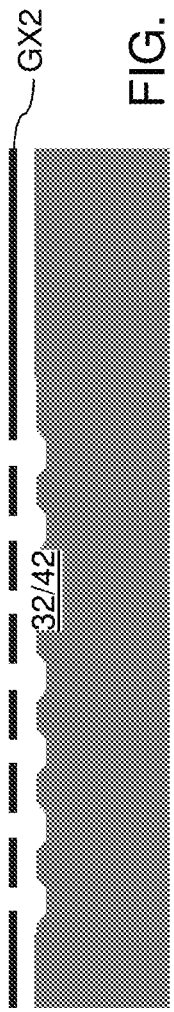

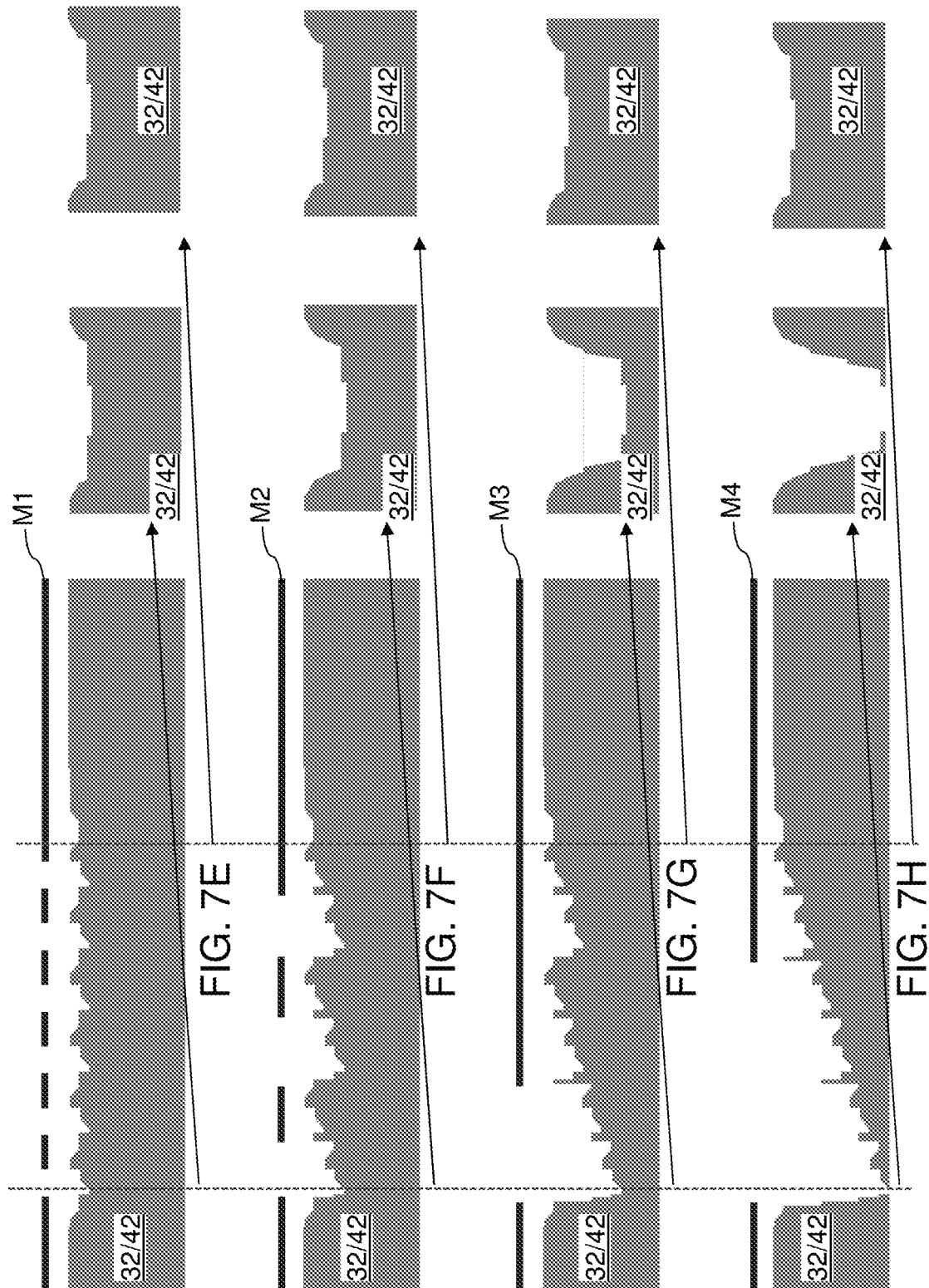

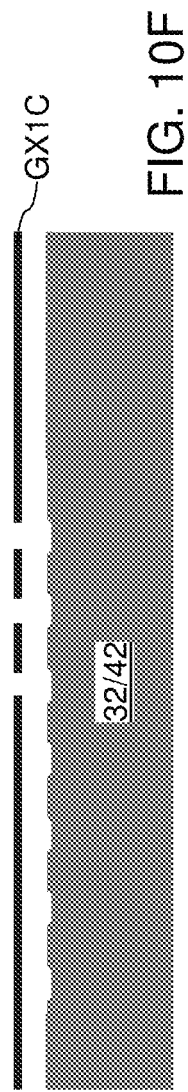
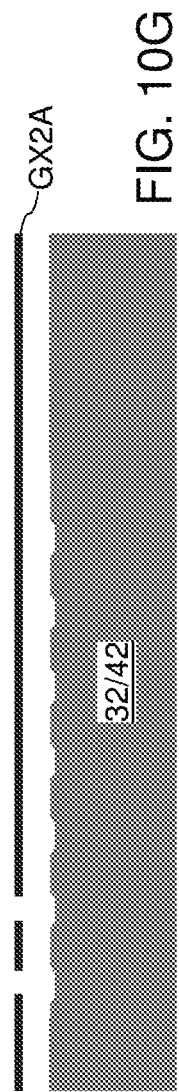
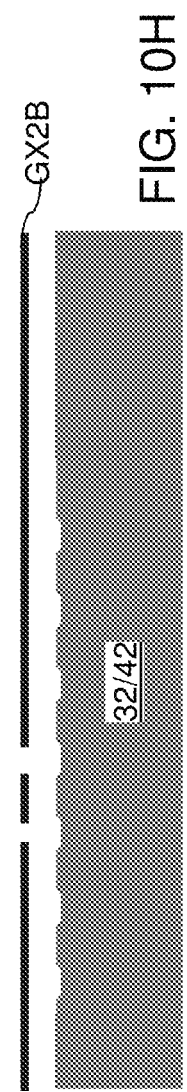
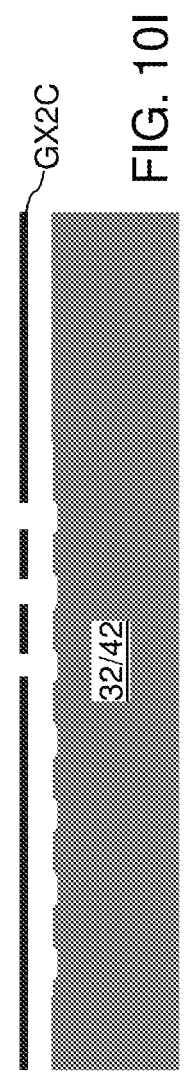

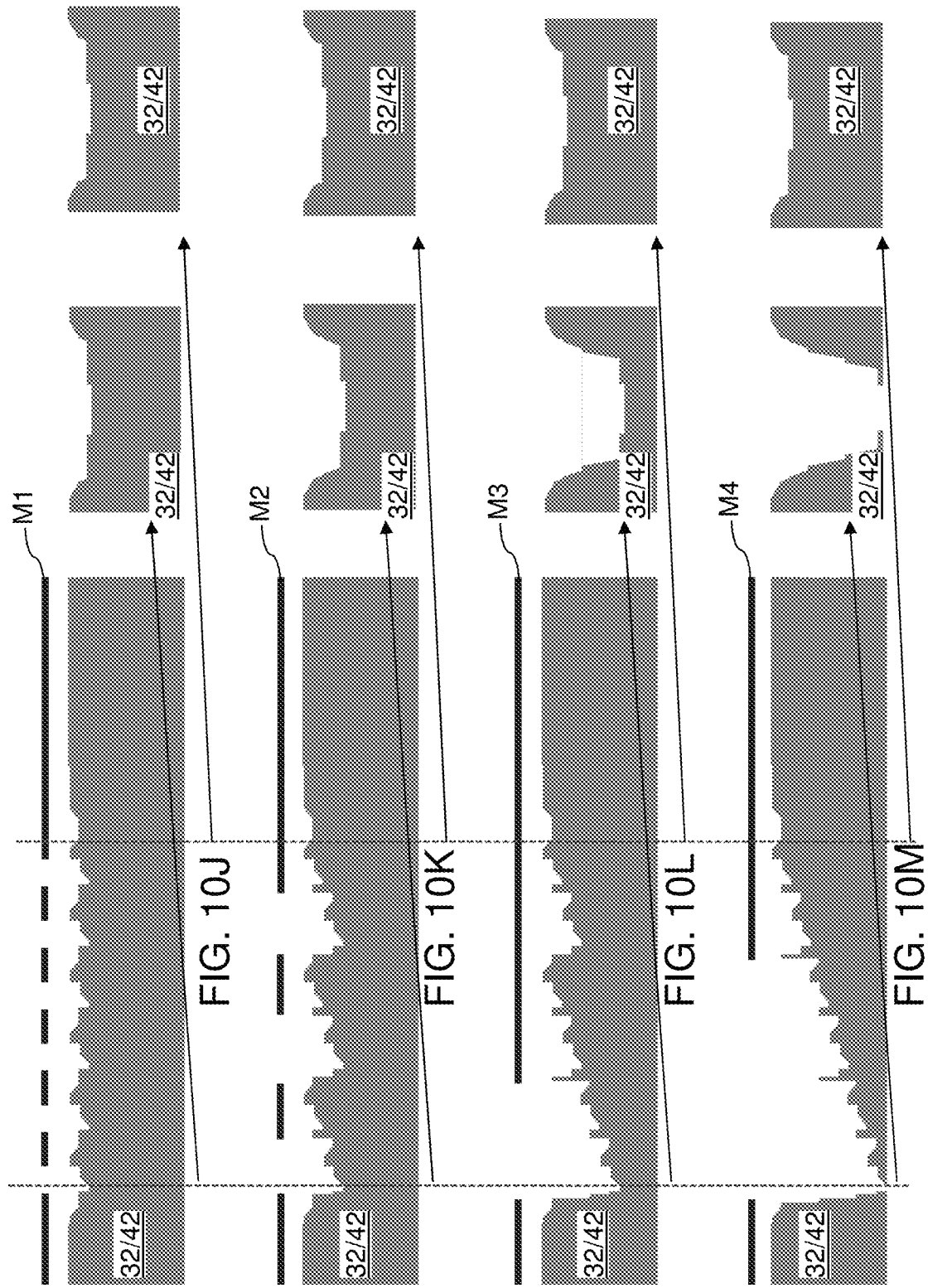

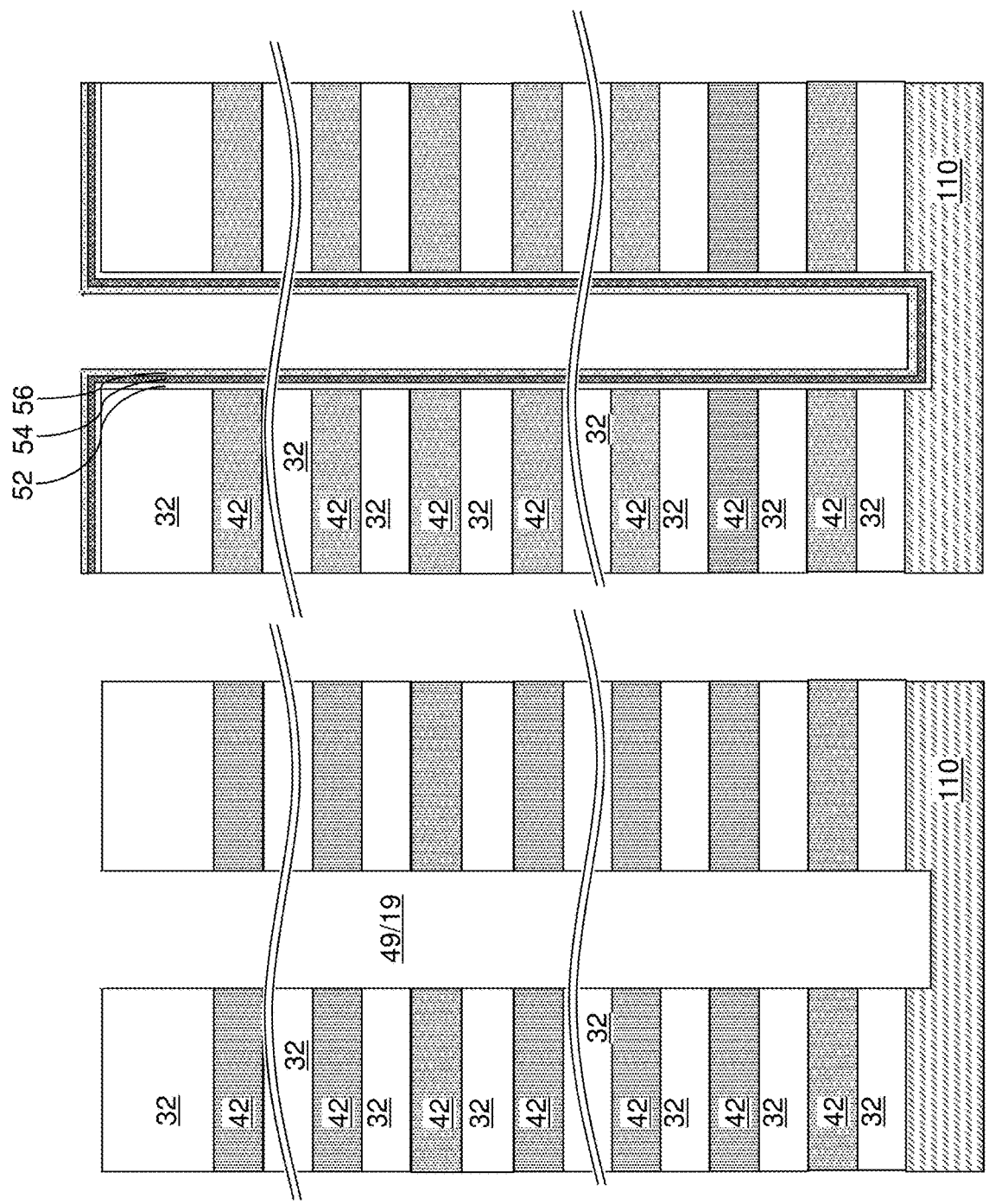

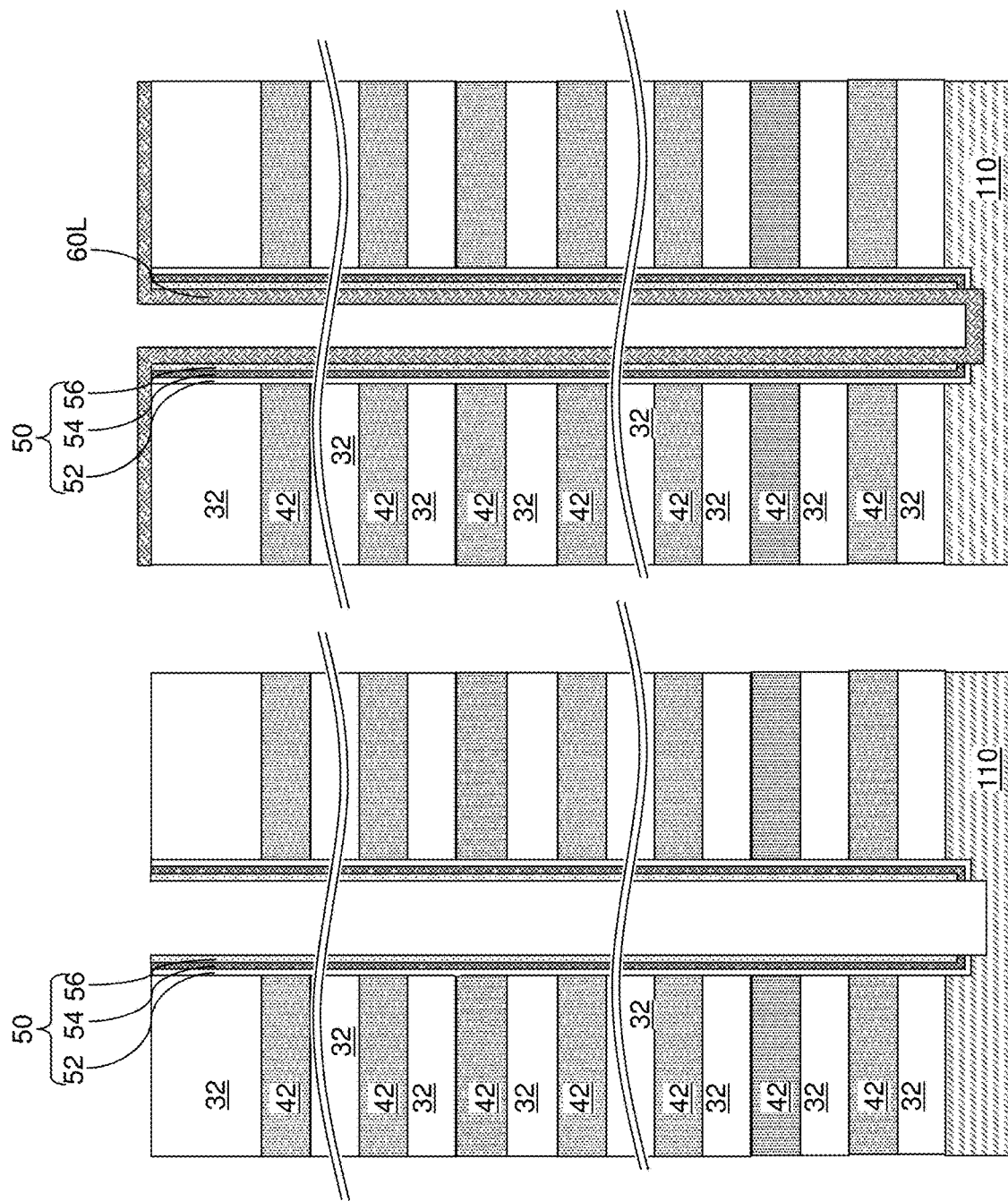

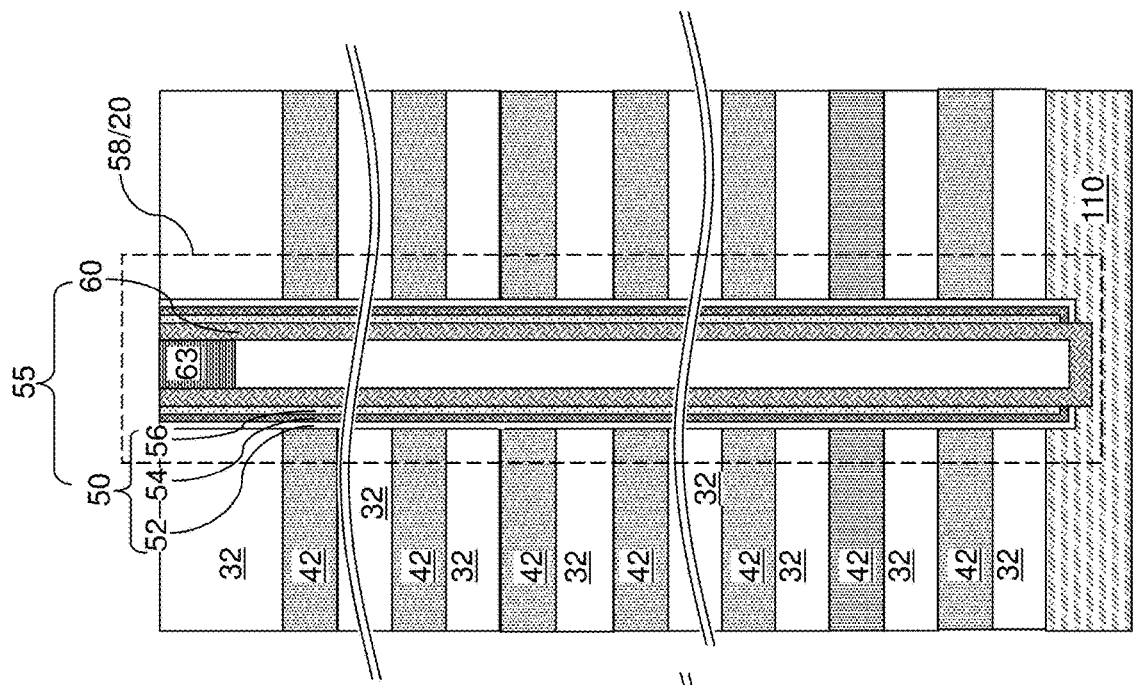
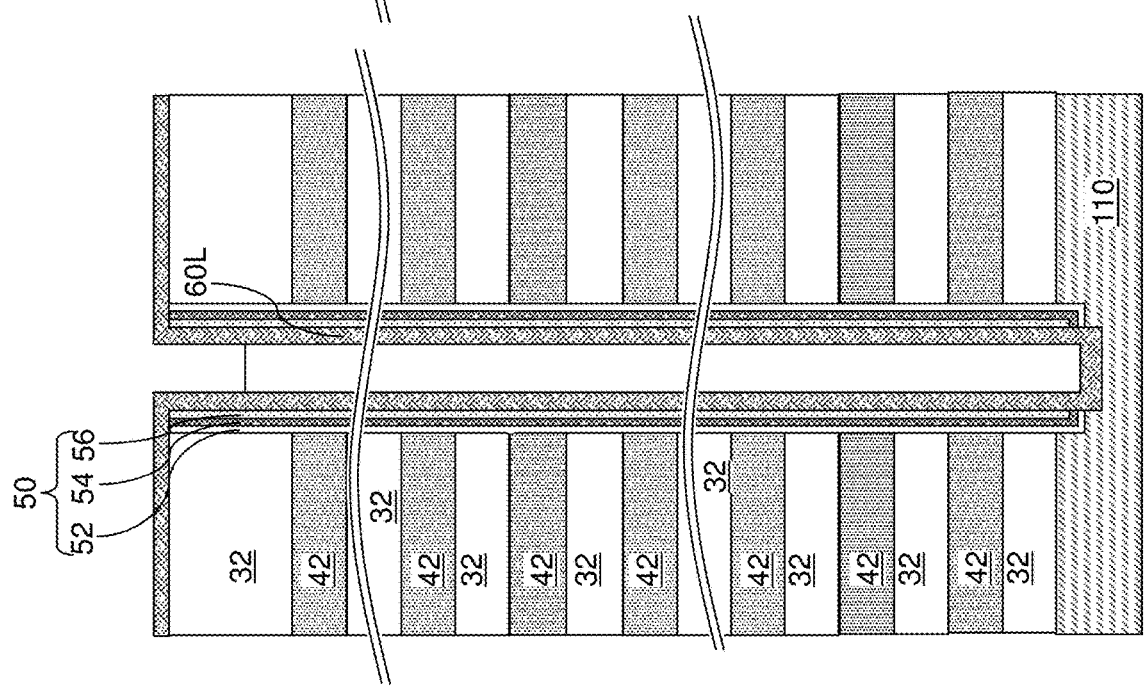

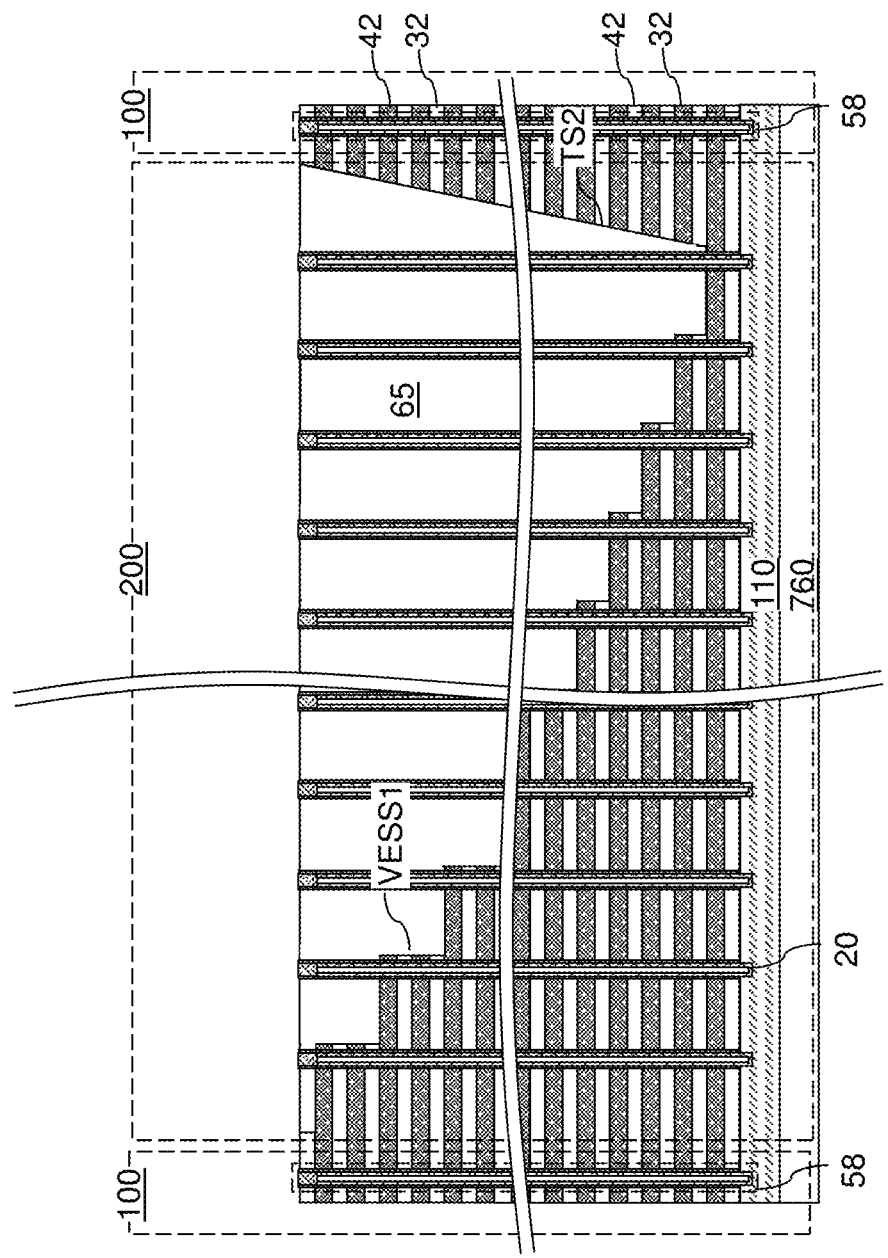

THREE-DIMENSIONAL MEMORY DEVICE WITH HIGH CONTACT VIA DENSITY AND METHODS OF FORMING THE SAME

FIELD

The present disclosure relates generally to the field of semiconductor devices, and particularly to three-dimensional memory devices having staircase configurations for increasing contact via density and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers; a first three-dimensional memory array located in a first memory array region; and a second three-dimensional memory array located in a second memory array region that is laterally spaced from the first memory array region along a first horizontal direction by an inter-array region, wherein the electrically conductive layers comprise common word lines for the first three-dimensional memory array and for the second three-dimensional memory array, wherein: the alternating stack is laterally bounded by two trench fill structures that are laterally spaced apart along a second horizontal direction by an inter-trench spacing; the electrically conductive layers continuously extend between the first memory array region and a second memory array region and comprise a respective bridge region that is located in the inter-array region and having a width along the second horizontal direction that is less than the inter-trench spacing; and the inter-array region comprises a stepped surface region comprising first vertically-extending surface segments of the alternating stack that are perpendicular to the first horizontal direction and second vertically-extending surface segments of the alternating stack that are perpendicular to the second horizontal direction.

According to another aspect of the present disclosure, a method of forming a device structure is provided, which comprises: forming a vertically alternating sequence of first insulating layers and spacer material layers over a substrate, wherein the spacer material layers are formed as, or are subsequently replaced with, electrically conductive layers; etching a region of the vertically alternating sequence by performing multiple iterations of a combination of a respective lithographic patterning process and a respective anisotropic etch process, wherein a stepped cavity having a stepped bottom surface is formed in an inter-array region located between a first memory array region and a second memory region that are laterally spaced from each other along a first horizontal direction, wherein the stepped bottom surface comprises first vertically-extending surface segments that are perpendicular to the first horizontal direction and connecting a respective pair of horizontally-extending surface segments of the stepped bottom surface that are laterally offset along the first horizontal direction, and further comprises second vertically-extending surface segments that are perpendicular to the second horizontal direction and connecting a respective pair of horizontally-extending surface segments of the stepped bottom surface that are laterally offset along the second horizontal direction; and forming a retro-stepped dielectric material portion in the stepped cavity over the stepped bottom surface.

According to yet another aspect of the present disclosure, a three-dimensional memory device is provided, which comprises: an alternating stack of insulating layers and electrically conductive layers; a first three-dimensional memory array located in a first memory array region; and a second three-dimensional memory array located in a second memory array region that is laterally spaced from the first memory array region along a first horizontal direction by an inter-array region, wherein the electrically conductive layers comprise common word lines for the first three-dimensional memory array and for the second three-dimensional memory array, wherein: the alternating stack is laterally bounded by two trench fill structures that are laterally spaced apart along a second horizontal direction by an inter-trench spacing; the electrically conductive layers continuously extend between the first memory array region and a second memory array region and comprise a respective bridge region that is located in the inter-array region; and the bridge region of at least one of the electrically conductive layers has a variable width along the second horizontal direction.

According to still another aspect of the present disclosure, a method of forming a device structure is provided, which comprises: forming a vertically alternating sequence of first insulating layers and spacer material layers over a substrate, wherein the spacer material layers are formed as, or are subsequently replaced with, electrically conductive layers; and etching a region of the vertically alternating sequence by performing multiple iterations of a combination of a respective lithographic patterning process and a respective anisotropic etch process, wherein a stepped cavity having a stepped bottom surface is formed in an inter-array region located between a first memory array region and a second memory region that are laterally spaced from each other along a first horizontal direction, wherein a horizontal cross-sectional area of the stepped cavity at a level of a topmost spacer material layer of the spacer material layers has a variable width along the first horizontal direction.

BRIEF DESCRIPTION OF THE DRAWINGS

FIGS. 4A-4F are sequential schematic vertical cross-sectional views of a portion the first exemplary structure during a first subset of processing steps for forming stepped surfaces.

FIGS. 7A-7D are sequential schematic vertical cross-sectional views of a portion the second exemplary structure during a first subset of processing steps for forming stepped surfaces.

FIGS. 7E-7H are sequential schematic vertical cross-sectional views of a portion of the second exemplary structure during a second subset of processing steps for forming stepped surfaces and accompanying cross-sectional views along perpendicular vertical planes.

FIGS. 10A-10I are sequential schematic vertical cross-sectional views of a portion the third exemplary structure during a first subset of processing steps for forming stepped surfaces.

FIGS. 10J-10M are sequential schematic vertical cross-sectional views of a portion of the third exemplary structure during a second subset of processing steps for forming stepped surfaces and accompanying cross-sectional views along perpendicular vertical planes.

FIGS. 18A-18F are sequential vertical cross-sectional views of a memory opening or a support opening during formation of a memory opening fill structure or a support pillar structure according to an embodiment of the present disclosure.

FIG. 19B is a vertical cross-sectional view of the first exemplary structure along the vertical plane B-B' of FIG. 19A.

DETAILED DESCRIPTION

Figure 1:
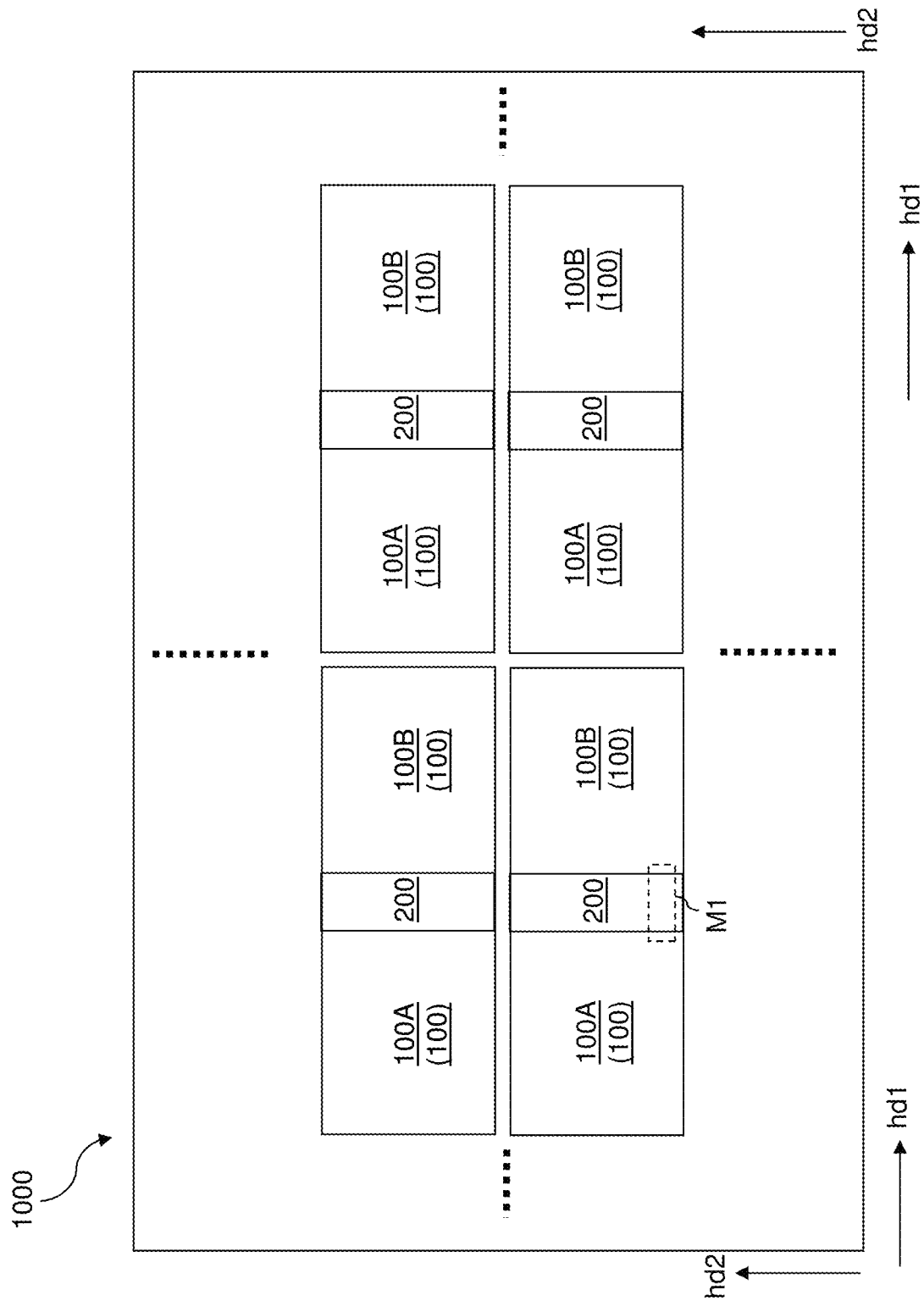
FIG. 1 is a plan view of an exemplary structure for forming multiple three-dimensional memory array regions in a semiconductor die according to an embodiment of the present disclosure.

As discussed above, the embodiments of the present disclosure are directed to a three-dimensional memory device including asymmetric and/or high contact via density stairs and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a semiconductor die 1000 including multiple three-dimensional memory array regions and inter-array region is illustrated in various views. The semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). A second horizontal direction hd2 (which may be the bit line direction) can be perpendicular to the first horizontal direction hd1.

Figure 2:
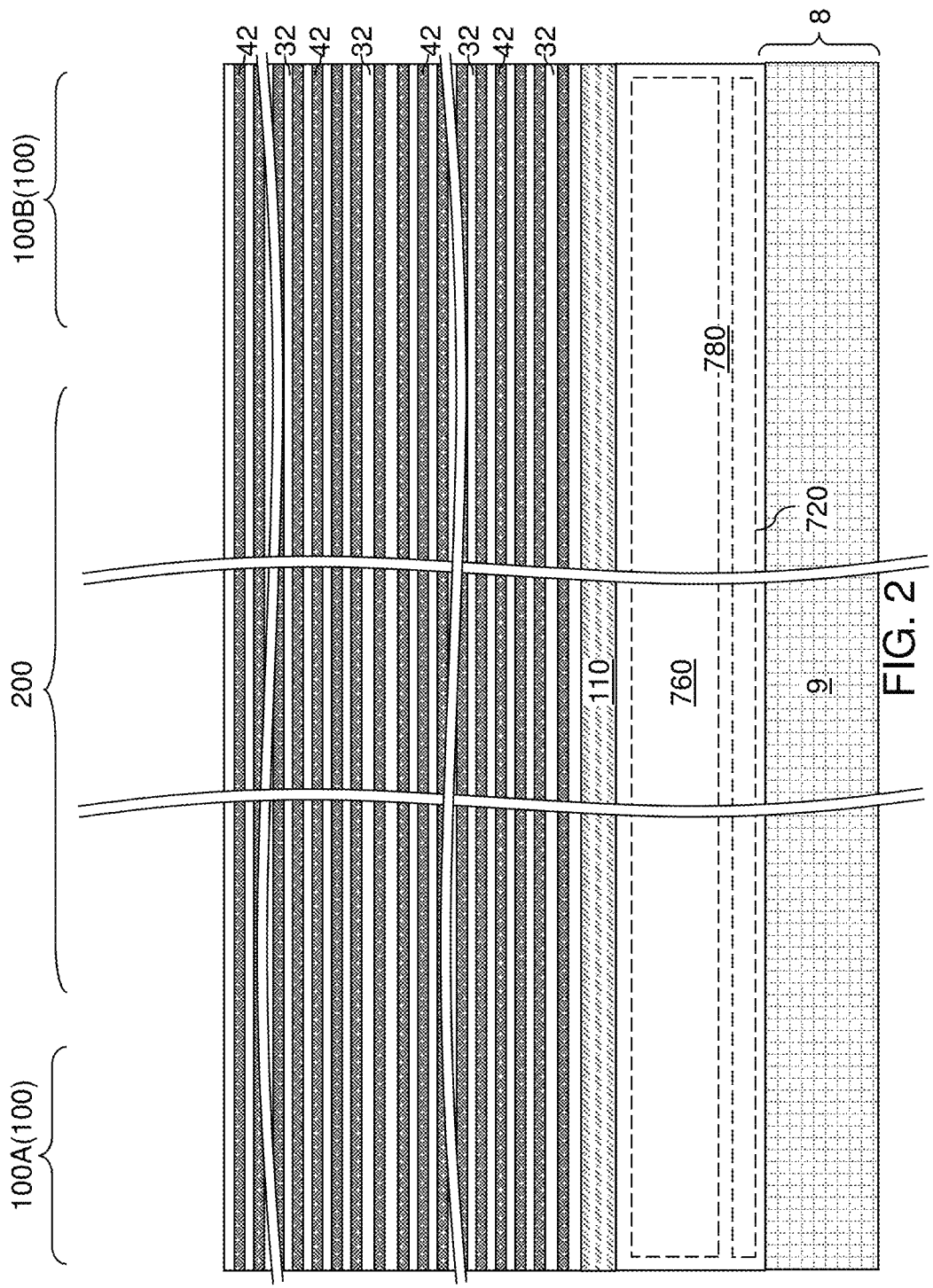
FIG. 2 is a vertical cross-sectional view a first exemplary structure after formation of optional semiconductor devices, optional dielectric material layers embedding optional lower-level metal interconnect structures, a semiconductor material layer, and an alternating stack of insulating layers and sacrificial material layers according to a first embodiment of the present disclosure. The region illustrated in FIG. 2 corresponds to region M1 in FIG. 1.

Referring to FIG. 2, a first exemplary structure according to a first embodiment of the present disclosure is illustrated. The region illustrated in FIG. 2 corresponds to region M1 in FIG. 1. The first exemplary structure comprises a substrate 8 including a substrate material layer 9. The substrate material layer 9 may comprise a semiconductor material layer, a dielectric material layer, or a combination thereof. In one embodiment, the substrate 8 may comprise a commercially available semiconductor substrate such as a single crystalline silicon wafer and the substrate material layer 9 may comprise a doped well in the top surface of the silicon wafer or an epitaxial silicon layer on the silicon wafer. Thus, in one embodiment, the substrate material layer 9 comprises a single crystalline silicon layer. In this case, semiconductor devices 720 such as complementary metal oxide semiconductor (CMOS) devices (e.g., peripheral or driver circuit devices for the overlying memory devices) may be formed in or over the substrate material layer 9.

Metal interconnect structures embedded in dielectric material layers can be formed over the substrate material layer 9. The metal interconnect structures are herein referred to as lower-level metal interconnect structures 780, and the dielectric material layers are herein referred to as lower-level dielectric material layers 760. The lower-level metal interconnect structures 760 can be electrically connected to a respective one of the semiconductor devices 720 on the substrate material layer 9.

At least one semiconductor material layer 110 may be formed over the lower-level dielectric material layers 760. The at least one semiconductor material layer 110 may function as a horizontal semiconductor channel in which, or on which, source regions can be subsequently formed. Alternatively, the at least one semiconductor material layer 110 may comprise a source semiconductor layer that functions as a common source region for vertical semiconductor channels to be subsequently formed. Additionally or alternatively, the at least one semiconductor material layer 110 may comprise a source-level sacrificial material layer that is subsequently replaced with a source contact layer that contacts bottom ends of vertical semiconductor channels to be subsequently formed, and functions as a portion of a common source region for the vertical semiconductor channels.

A vertically alternating sequence of insulating layers 32 and spacer material layers (which can be sacrificial material layers 42) can be formed over the at least one semiconductor material layer 110. As used herein, a "vertically alternating sequence" or an "alternating stack" refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element. Generally, spacer material layers within each alternating stack are formed as, or are subsequently replaced with, electrically conductive layers. As such, the spacer material layers can be formed as, or can be subsequently replaced with, electrically conductive layers.

The insulating layers 32 can be composed of the first material, and the sacrificial material layers 42 can be composed of the second material, which is different from the first material. The first material of the insulating layers 32 may be at least one insulating material. Insulating materials that may be used for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The spacer material layers may be formed as electrically conductive layers (which may include TiN, TaN, WN, W, Ru, Co, Mo, Cu, or a combination thereof), or may be formed as sacrificial material layers that are subsequently replaced within electrically conductive layers. In case the spacer material layers are formed as spacer material layers, the sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. In one embodiment, the sacrificial material layers 42 may be material layers that comprise silicon nitride. While the present disclosure is described employing an embodiment in which the spacer material layers are formed as sacrificial material layers 42, embodiments are expressly contemplated herein in which the spacer material layers are formed as electrically conductive layers. In this case, processing steps employed to replace the sacrificial material layers 42 with electrically conductive layers may be omitted.

Figure 3A:
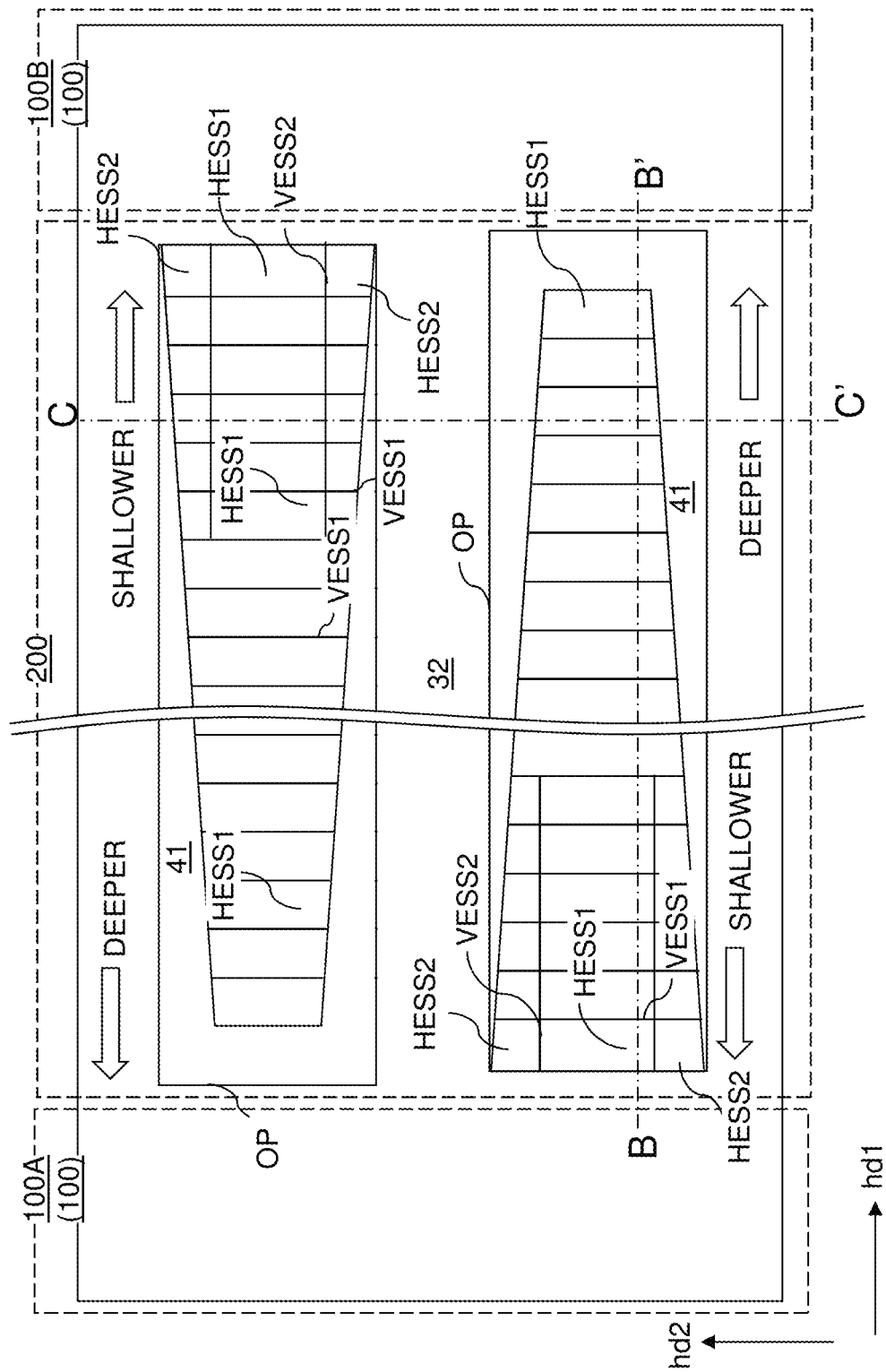
FIG. 3A is a top-down view of the first exemplary structure after formation of staircases according to the first embodiment of the present disclosure. The region illustrated in FIG. 3A corresponds to region M1 in FIG. 1.
Figure 3B:
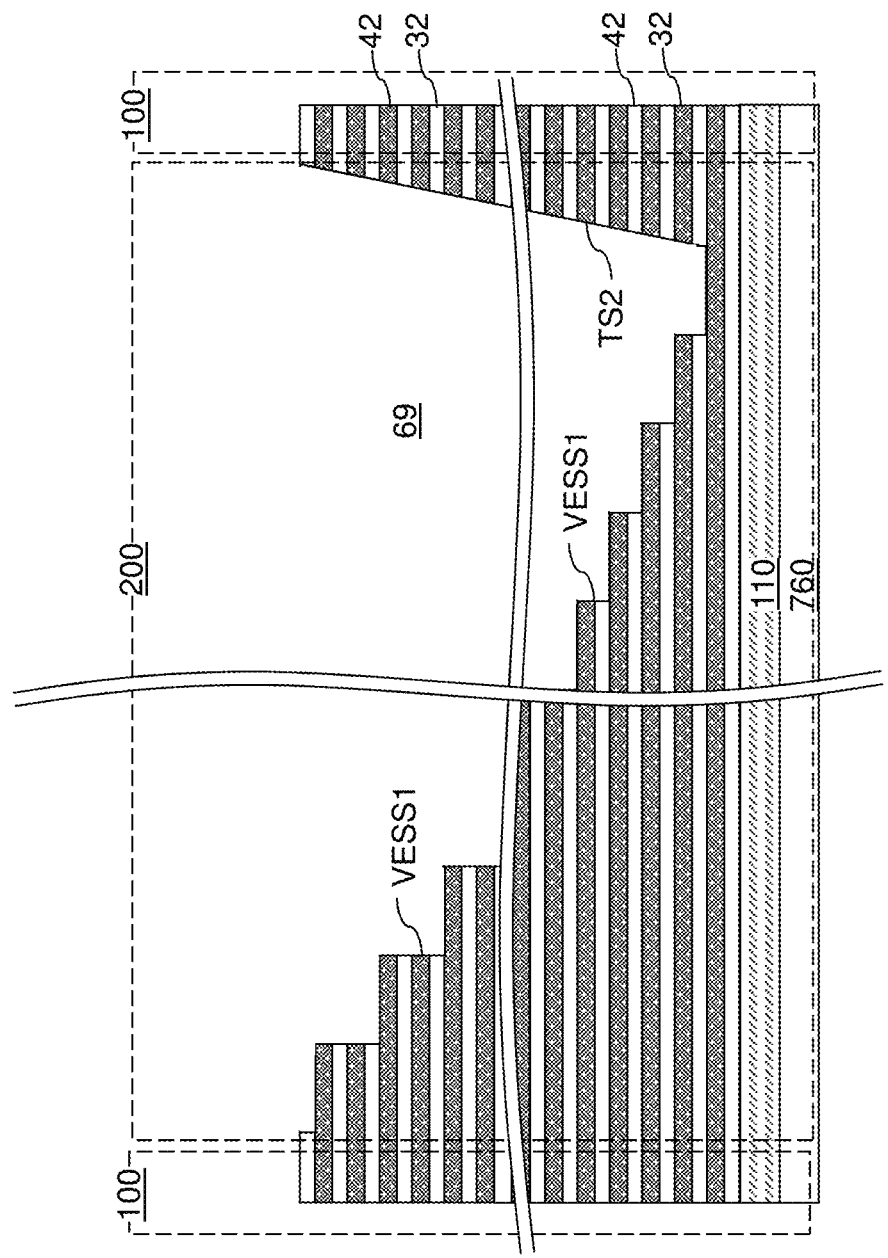
FIG. 3B is a vertical cross-sectional view of the first exemplary structure along the vertical plane B-B' of FIG. 3A.
Figure 3C:
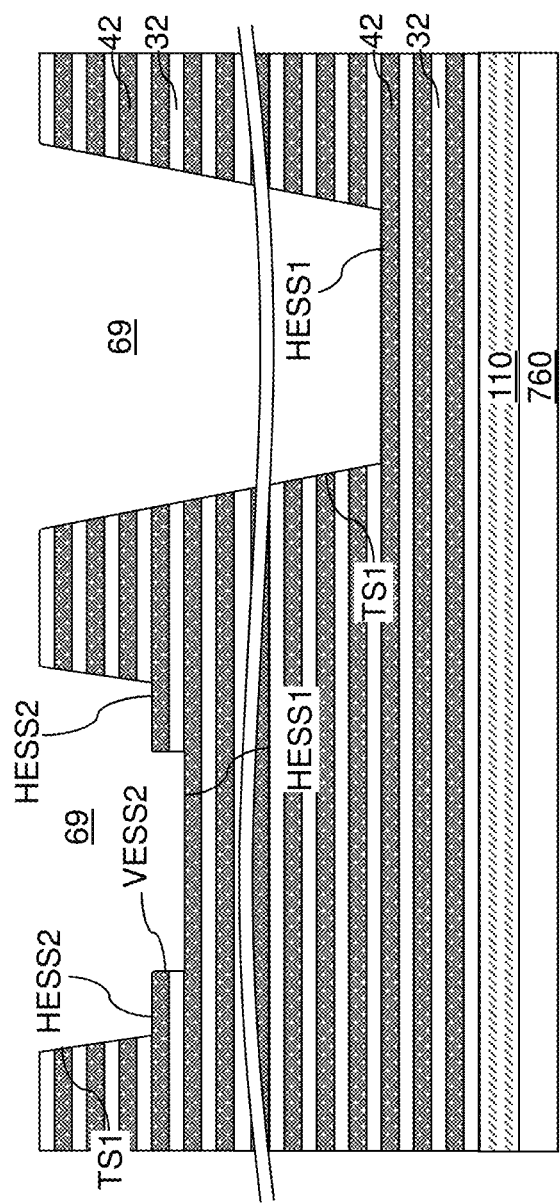
FIG. 3C is a vertical cross-sectional view of the first exemplary structure along the vertical plane C-C' of FIG. 3A.
Figure 4G:
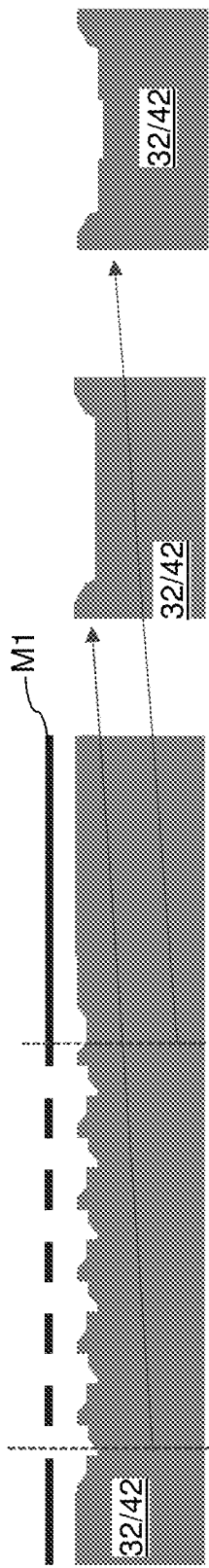
FIGS. 4G-4J are sequential schematic vertical cross-sectional views of a portion of the first exemplary structure during a second subset of processing steps for forming stepped surfaces and accompanying cross-sectional views along perpendicular vertical planes.
Figure 4H:
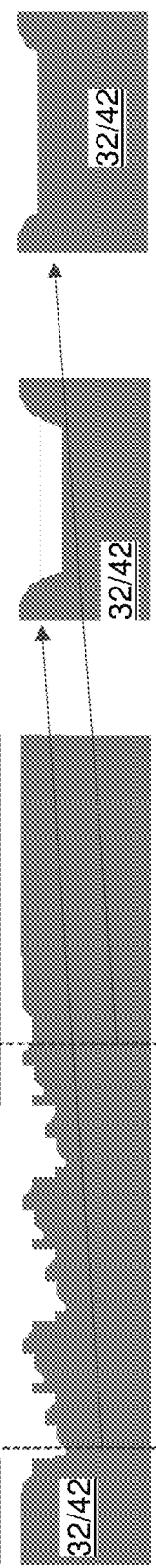
Figure 4I:
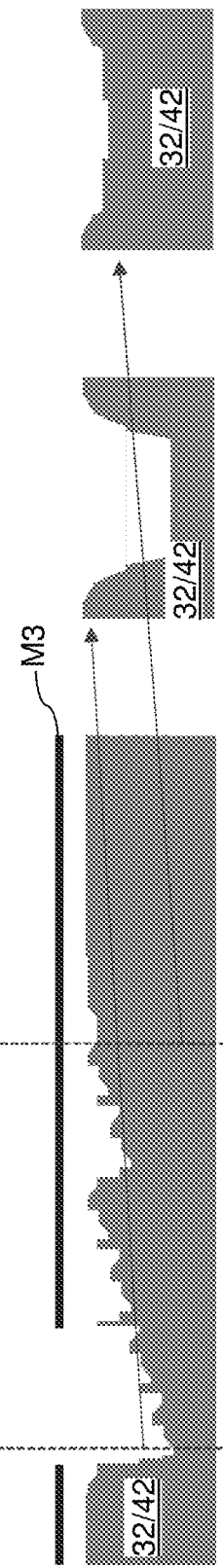
Figure 4J:
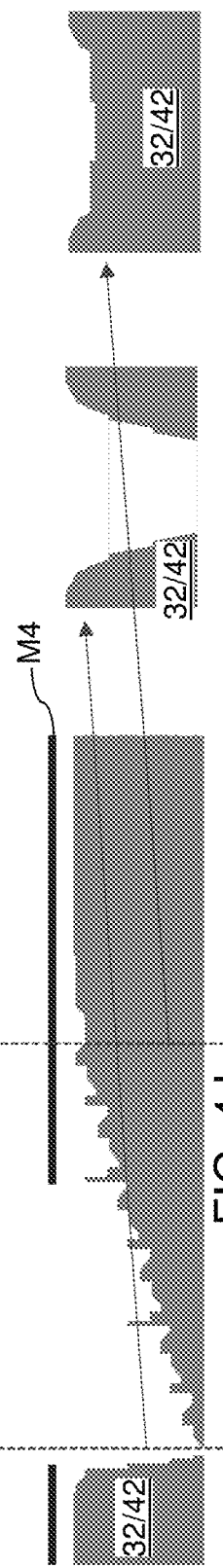

Referring to FIGS. 3A-3C, staircases can be formed through the vertically alternating sequence of insulating layers 32 and sacrificial material layers 42. Stepped surfaces can be formed within the areas of the staircases. A hard mask layer (not shown) such as a metallic or dielectric mask material layer can be formed over the vertically alternating sequence, and can be patterned to form multiple rectangular openings. The areas of the openings within the hard mask layer correspond to stairwells (i.e., areas in which staircases including stepped surfaces are to be subsequently formed). The peripheries of the opening OP (i.e., stairwell) may or may not be rectangular. Each opening through the hard mask layer may be rectangular, and may have a pair of sides that are parallel to the horizontal direction hd1 and a pair of sides that are parallel to the second horizontal direction hd2.

Regions of the vertically alternating sequence (32, 42) located within the peripheries of the openings OP in the hard mask layer can be etched by performing multiple iterations of a combination of a respective lithographic patterning process and a respective anisotropic etch process. A stepped cavity having a stepped bottom surface is formed within each area enclosed by a respective periphery of an opening OP in the hard mask layer in the inter-array region 200. The inter-array region 200 is located between the first memory array region 100A and a second memory region 100B that are laterally spaced from each other along the first horizontal direction hd1.

According to an aspect of the present disclosure, the stepped bottom surface within one, a plurality and/or each of the staircases located within the area enclosed by a respective periphery of an opening OP (i.e., in a stairwell) in the hard mask layer comprises first vertically-extending surface segments VESS1 (i.e., first risers of the staircase). Segments VESS1 are parallel to the second horizontal direction hd2 and are perpendicular to the first horizontal direction hd1. Segments VESS1 (i.e., the first risers) connect a respective pair of horizontally-extending surface segments (HESS1, HESS2) (i.e., a pair of staircase treads) of the stepped bottom surface. The segments HESS1 and HESS2 are laterally offset from each other along the first horizontal direction hd1 and extend in the second horizontal direction hd2. The staircase(s) may also include second vertically-extending surface segments VESS2 (i.e., second risers) that are parallel to the first horizontal direction hd1 and perpendicular to the second horizontal direction hd2. The segments VESS2 (i.e., the second risers) connect the respective pair of horizontally-extending surface segments (HESS1, HESS2) of the stepped bottom surface that are laterally offset from each other along the second horizontal direction hd2. Thus, the first and second risers are perpendicular to each other. In other words, the vertically-extending surface segments (VESS1, VESS2) of the stepped bottom surface(s) in one, a plurality and/or each of the staircases may comprise first vertically-extending surface segments VESS1 that are perpendicular to the first horizontal direction hd1 and parallel to the second horizontal direction hd2, and second vertically-extending surface segments VESS2 that a are perpendicular to the second horizontal direction hd2 and parallel to the first horizontal direction hd1.

According to an aspect of the present disclosure, the horizontally-extending surface segments (HESS1, HESS2) comprise first horizontally-extending surface segments HESS1 that are arranged along the first horizontal direction hd1 in a first row, and second horizontally-extending surface segments HESS2 that are arranged along the first horizontal direction hd1 in a second row that is laterally offset from the first row along the second horizontal direction hd2.

Generally, the stairwell sidewalls 41 of the vertically alternating sequence (32, 42) can be physically exposed to the staircases. The sidewalls 41 of the vertically alternating sequence (32, 42) can be formed with a taper angle such that portions of each cavity in the stairwells having a greater depth has a lesser lateral extent. While FIGS. 3B and 3C illustrate an embodiment in which the depth of each cavity in the staircases increases or decreases monotonically as a function of a lateral distance along the first horizontal direction hd1 for simplicity of illustration, the depth of each cavity in a respective stairwell containing the respective staircase can generally increase or decrease along the first horizontal direction hd1 with localized regions in which the depth changes in an opposite way. In other words, a cavity in a stairwell may have a depth that generally increases along the first horizontal direction hd1 except in localized regions in which the depth generally decreases along the first horizontal direction hd1. Alternatively, a cavity in a stairwell may have a depth that generally decreases along the first horizontal direction hd1 except in localized regions in which the depth generally increases along the first horizontal direction hd1. Such variations in the vertical cross-sectional profiles of staircases along the first horizontal direction hd1 are expressly contemplated herein.

In one embodiment, the stepped bottom surface of a staircase comprises a plurality of horizontally-extending surface segments (HESS1, HESS2) having a respective rectangular shape or a respective trapezoidal shape. In one embodiment, the horizontally-extending surface segments (HESS1, HESS2) comprise first horizontally-extending surface segments HESS1 that are arranged along the first horizontal direction hd1 in a first row, and second horizontally-extending surface segments HESS2 that are arranged along the first horizontal direction hd1 in a respective second row that is laterally offset from the first row along the second horizontal direction hd2. In one embodiment, a staircase may have a symmetric pattern with respect to a vertical plane extending along the first horizontal direction hd1, and the stepped bottom surface may comprise first horizontally-extending surface segments HESS1 arranged along the first horizontal direction hd1 from one end of a respective staircase to another end of the staircase, and two rows of second horizontally-extending surface segments HESS2 arranged along the first horizontal direction hd1 and located on either side of the row of first horizontally-extending surface segments HESS1 and laterally offset from the row of first horizontally-extending surface segments HESS1 along the second horizontal direction hd2.

In the first exemplary structure, the total number second horizontally-extending surface segments HESS2 within each row of second horizontally-extending surface segments HESS2 may be less than the total number first horizontally-extending surface segments HESS1 within the row of first horizontally-extending surface segments HESS1. Generally, the second horizontally-extending surface segments HESS2 can be formed in a region each staircase in which the lateral distance between facing pairs of sidewalls 41 of the vertically alternating sequence (32, 42) along the second horizontal direction hd2 is relatively large, and the depth of the stepped bottom surface is relatively small.

In one embodiment, a first subset of the first horizontally-extending surface segments HESS1 that are not laterally adjoined to second horizontally-extending surfaces segments HESS2 may be located at a deeper end of each staircase, and a second subset of the first horizontally-extending surface segments HESS1 that are laterally-adjoined to second horizontally-extending surfaces segments HESS2 may be located at a shallower end of each staircase. In other words, in one embodiment, there may be more rows of treads in the shallower end of the staircase than in a deeper end of the staircases, and the second risers may be present in the shallower end but not in the deeper end.

In one embodiment, each of the second vertically-extending surface segments VESS2 may be adjoined to a respective pair of the horizontally-extending surface segments (HESS1, HESS2) of the vertically alternating sequence (32, 42) that are laterally spaced from each other along the second horizontal direction hd2. The second vertically-extending surface segments VESS2 can be formed between and can be adjoined to a respective neighboring pair of a first horizontally-extending surface segment HESS1 and a second horizontally-extending surface segment HESS2.

In one embodiment, the first horizontally-extending surface segments HESS1 are adjoined to a stepped bottom edge of one of the second vertically-extending surface segments VESS2 that laterally extends along the first horizontal direction hd1, and the second horizontally-extending surface segments HESS2 are adjoined to a stepped top edge of the one of the second vertically-extending surface segments VESS2 that laterally extends along the first horizontal direction hd1.

In one embodiment, each first vertically-extending surface segment VESS1 within a first subset of the first vertically-extending surface segments VESS1 located at the deeper end of the staircase is adjoined to a respective neighboring pair of the first horizontally-extending surface segments HESS1. In contrast, each first vertically-extending surface segment VESS1 within a second subset of the first vertically-extending surface segments VESS1 located at the shallower end of the staircase is adjoined to a respective subset of at least one first horizontally-extending surface segments HESS1 and a respective subset of at least one (e.g., two) second horizontally-extending surface segments HESS2.

In one embodiment, a total number of the second horizontally-extending surface segments HESS2 is less than a total number of the first horizontally-extending surface segments HESS1. Each first horizontally-extending surface segment HESS1 in the shallower end of the staircase connects and is adjoined by a pair of second risers VESS2 to a respective pair of second horizontally-extending surface segments HESS2. Each first horizontally-extending surface segment HESS1 in the deeper end of the staircase does not connect and is not adjoined to the respective pair of second horizontally-extending surface segments HESS2.

In one embodiment, one or more of the first vertically-extending surface segments VESS1 may vertically extend over at least two insulating layers 32 and at least two sacrificial material layers 42 at the shallower end of the staircase. In other words, the height of one or more of the first vertically-extending surface segments VESS1 in the shallower end of the staircase may be the same as or may be greater than the total height of at least two insulating layers 32 and at least two sacrificial material layers 42. In this case, one or more of the first vertically-extending surface segments VESS1 (i.e., first risers at the shallower end) comprises a stepped bottom edge that is adjoined to first horizontally-extending surface segments HESS1 of the vertically alternating sequence (32, 42); and a stepped top edge that is adjoined to another first horizontally-extending surface segments HESS1 of the vertically alternating sequence (32, 42). In contrast, one or more of the first vertically-extending surface segments VESS1 may vertically extend over one insulating layer 32 and one sacrificial material layer 42 at the deeper end of the staircase where the second vertically-extending surface segments VESS2 are not present. Likewise, the second vertically-extending surface segments VESS2 may vertically extend over one insulating layer 32 and one sacrificial material layer 42.

The sidewalls 41 of the vertically alternating sequence (32, 42) that are exposed to a staircase may comprise a pair of first sidewalls TS1 that laterally extend along the first horizontal direction hd1 and having a stepped bottom edge, and a second sidewall TS2 that laterally extends along the second horizontal direction hd2 and having a straight bottom edge and adjoined to a bottommost horizontally-extending surface segment of the stepped bottom surface. A stepped cavity 69 can be formed over each staircase. Each of the stepped cavities 69 may be laterally bounded by two first sidewalls TS1, a second sidewall TS2, the first vertically-extending surface segments VESS1, and the second vertically-extending surface segments VESS2.

Referring to FIGS. 4A-4F, sequential schematic vertical cross-sectional views of a portion the first exemplary structure is illustrated during a first subset of processing steps for forming stepped surfaces.

Referring to FIG. 4A, a portion of the vertically alternating sequence (32, 42) within an area of a staircase in the inter-array region 200 is illustrated along a vertical plane that laterally extends along the first horizontal direction hd1.

Referring to FIG. 4B, a first etch mask layer (e.g., hard mask and/or photoresist layer) GY may be applied over the vertically alternating sequence (32, 42). The first etch mask layer GY includes edges that laterally extend along the first horizontal direction over the area of the staircase. While the first etch mask layer GY is illustrated above the vertically alternating sequence (32, 42) for clarity, it is understood that the first etch mask layer GY, and other etch mask layers illustrated in the drawings and/or described herebelow, are formed on a respective top surface of the vertically alternating sequence (32, 42). An anisotropic etch process can be performed to transfer the pattern of each opening in the first etch mask layer GY into an upper portion of the vertically alternating sequence (32, 42). Vertical steps (i.e., risers) are formed in each staircase region. In a plan view, locations of the vertical steps that laterally extend along the first horizontal direction hd1 coincide with locations of the second vertically-extending surface segments VESS2 to be subsequently formed. A plan view refers to a view along a vertical direction such as a top-down view. The layers that are patterned by the anisotropic etch process comprise at least one pair of an insulating layer 32 and a sacrificial material layer 42. The layers that are patterned by the anisotropic etch process may comprise a plurality of pairs of an insulating layer 32 and a sacrificial material layer 42. In one embodiment, the layers that are patterned by the anisotropic etch process may comprise a plurality of pairs of an insulating layer 32 and a sacrificial material layer 42 may be in $2^i$, in which i is a non-negative integer. The first etch mask layer GY can be subsequently removed, for example, by ashing.

Referring to FIG. 4C, a second etch mask layer GX1A may be applied over the vertically alternating sequence (32, 42). The second etch mask layer GX1A may be a trimmable etch mask layer (e.g., a photoresist layer). The second etch mask layer GX1A may include edges that laterally extend along the second horizontal direction over the area of the staircase. As discussed above, it is understood that the second etch mask layer GX1A, and other etch mask layers illustrated in the drawings and/or described herebelow, are formed on a respective top surface of the vertically alternating sequence (32, 42). An anisotropic etch process can be performed to transfer the pattern of each opening in the second etch mask layer GX1A into the vertically alternating sequence (32, 42). Vertical steps are formed in each staircase region. In a plan view, locations of the vertical steps that laterally extend along the second horizontal direction hd2 coincide with locations of a subset of the first vertically-extending surface segments VESS1 that are formed, and/or locations of all first vertically-extending surface segments VESS1 to be subsequently formed. Additionally, locations of the vertical steps that laterally extend along the first horizontal direction hd1 may coincide with boundaries along which strip portions of drain-select-level electrically conductive layers are divided.

In case the second etch mask layer GX1A is a trimmable etch mask layer, the second etch mask layer GX1A may be isotropically trimmed by performing a trimming process, and another anisotropic etch process may be performed to form additional vertical steps in the vertically alternating sequence (32, 42). Optionally, at least one additional repetition of a trimming process and an anisotropic etch process may be performed to form additional steps in the vertically alternating sequence (32, 42).

Referring to FIGS. 4D-4F, additional etch mask layers (GX1B, GX2A, GX2B) may be sequentially applied over the vertically alternating sequence (32, 42) with a respective anisotropic etch process therebetween. Each of the additional etch mask layers (GX1B, GX2A, GX2B) may be a trimmable etch mask layer. An anisotropic etch process can be performed after formation of each of the additional etch mask layers (GX1B, GX2A, GX2B) to form a respective set of vertical steps in the vertically alternating sequence (32, 42). In case the additional etch mask layers (GX1B, GX2A, GX2B) comprise trimmable etch mask layers, at least one cycle of a trimming process and an anisotropic etch process may be additionally performed to form additional steps in the vertically alternating sequence (32, 42).

FIGS. 4G-4J are sequential schematic vertical cross-sectional views of a portion of the first exemplary structure during a second subset of processing steps for forming stepped surfaces and accompanying cross-sectional views along perpendicular vertical planes.

Generally, additional etch mask layers (M1, M2, M3, M4) may be applied over the vertically alternating sequence (32, 42) and over the hard mask layer (if employed), and can be lithographically patterned a respective pattern of at least one opening therein. An anisotropic etch process can be performed to transfer the pattern of the openings in the additional etch mask layers (M1, M2, M3, M4) through a respective number of pairs of an insulating layer 32 and a sacrificial material layer 42. In one embodiment, the number of pairs of an insulating layer 32 and a sacrificial material layer 42 by a respective anisotropic etch process may be non-negative integer powers of 2, i.e., 1, 2, 4, 8, 16, 32, 64, 128, etc. The various combinations of the patterns of the openings in the etch mask layers (M1, M2, M3, M4) and the different numbers of pairs of an insulating layer 32 and a sacrificial material layer 42 that are etched in the anisotropic etch process can provide a respective horizontally-extending surface segment (HESS1, HESS2) (i.e., tread) for each of the sacrificial material layers 42 (or alternatively, for each of the insulating layers 32). In one embodiment, the total number of etch mask layers (M1, M2, M3, M4) that are employed may be N, and the total number of sacrificial material layers 42 (or alternatively, insulating layers 32) having a respective set of at least one horizontally-extending surface segment (HESS1, HESS2) may be $2^{N-1}$, or a number between $2^{N-2}$ and $2^{N-1}$. While the present disclosure is described employing an embodiment in which the number N is 4, embodiments are expressly contemplated herein in which the number N is a positive integer that is not 4.

Figure 5A:
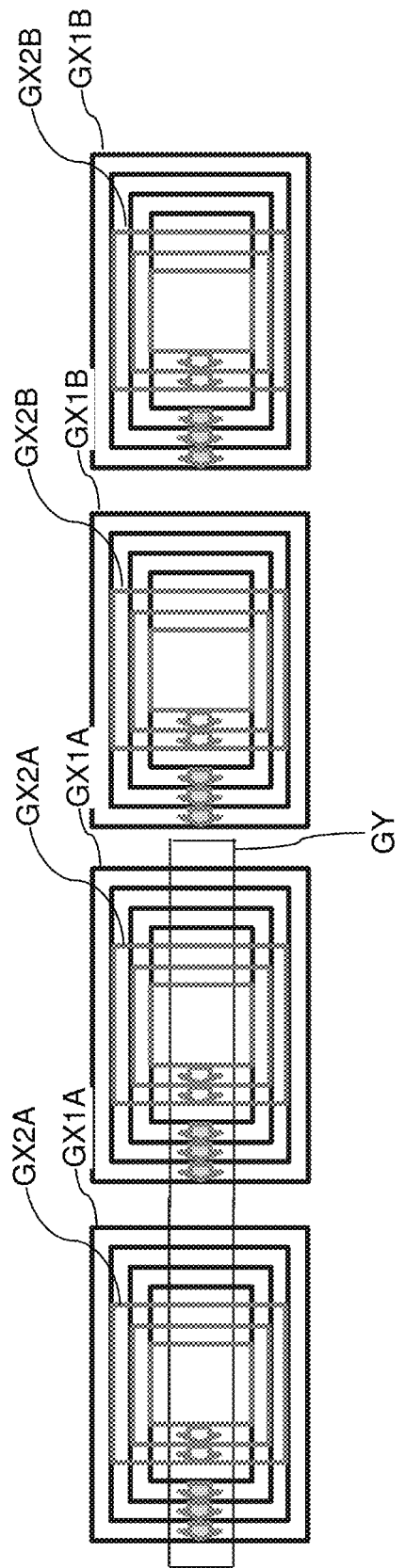
FIG. 5A illustrate exemplary patterns for a first subset of etch masks that may be employed for the first subset of processing steps related to FIGS. 4A-4F.

FIG. 5A illustrates exemplary patterns for a first subset of etch masks that may be employed for the first subset of processing steps related to FIGS. 4A-4F. Exemplary patterns for the etch mask layers (GY, GX1A, GX1B GX2A, GX2B) are illustrated. A subset of the etch mask layers, such as the GX1A etch mask layer, the GX1B etch mask layer, the GX2A etch mask layer, and the GX2B etch mask layer, may be formed as trimmable etch mask layers. In this case, each trimmable etch mask layer may be formed with a smallest opening pattern for the respective trimmable etch mask layer, and can be sequentially enlarged to provide larger openings after performing a respective anisotropic etch process, thereby providing a respective series of vertical steps in the vertically alternating sequence (32, 42).

Figure 5B:
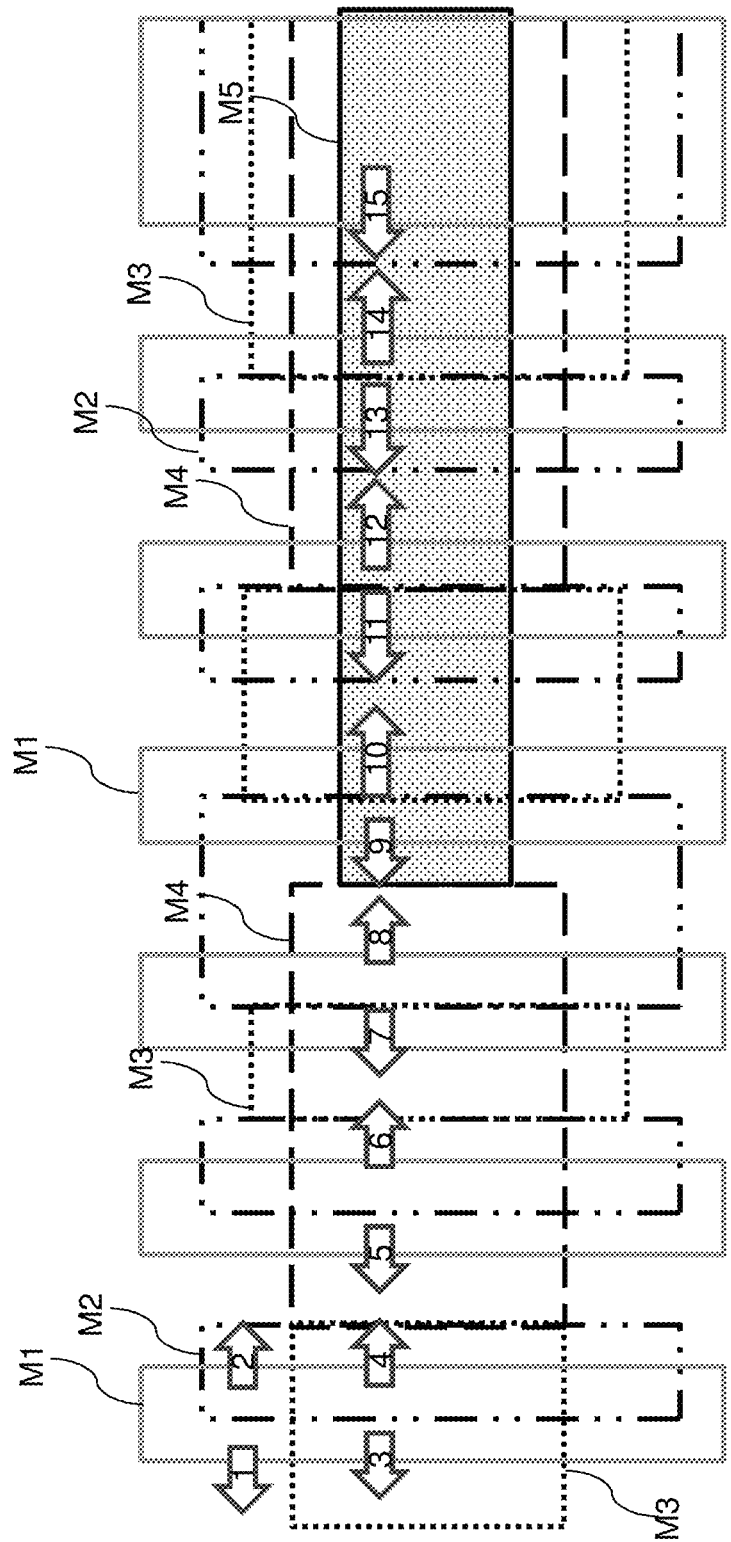
FIG. 5B illustrate exemplary patterns for a second subset of etch masks that may be employed for the second subset of processing steps related to FIGS. 4G-4J.

Referring to FIG. 5B, a set of patterns that may be employed for five etch mask layers (M1, M2, M3, M4, M5) is illustrated. The set of patterns illustrated in FIG. 5B is only illustrative, and any pattern of openings may be employed such that areas of the various openings overlap in different combinations. As discussed above, anisotropic etch processes performed after formation of a respective etch mask layer (M1, M2, M3, M4, M5) may etch through different numbers of pairs of an insulating layer 32 and a sacrificial material layer 42 so that each of the sacrificial material layers 42 (or alternatively, each of the insulating layers 32) may have a respective horizontally-extending surface segment (HESS1, HESS2) that is physically exposed to each stepped cavity 69. A subset of the various vertical steps is numbered with integers. The arrows represent the downward direction of a respective vertical step.

Figure 6A:
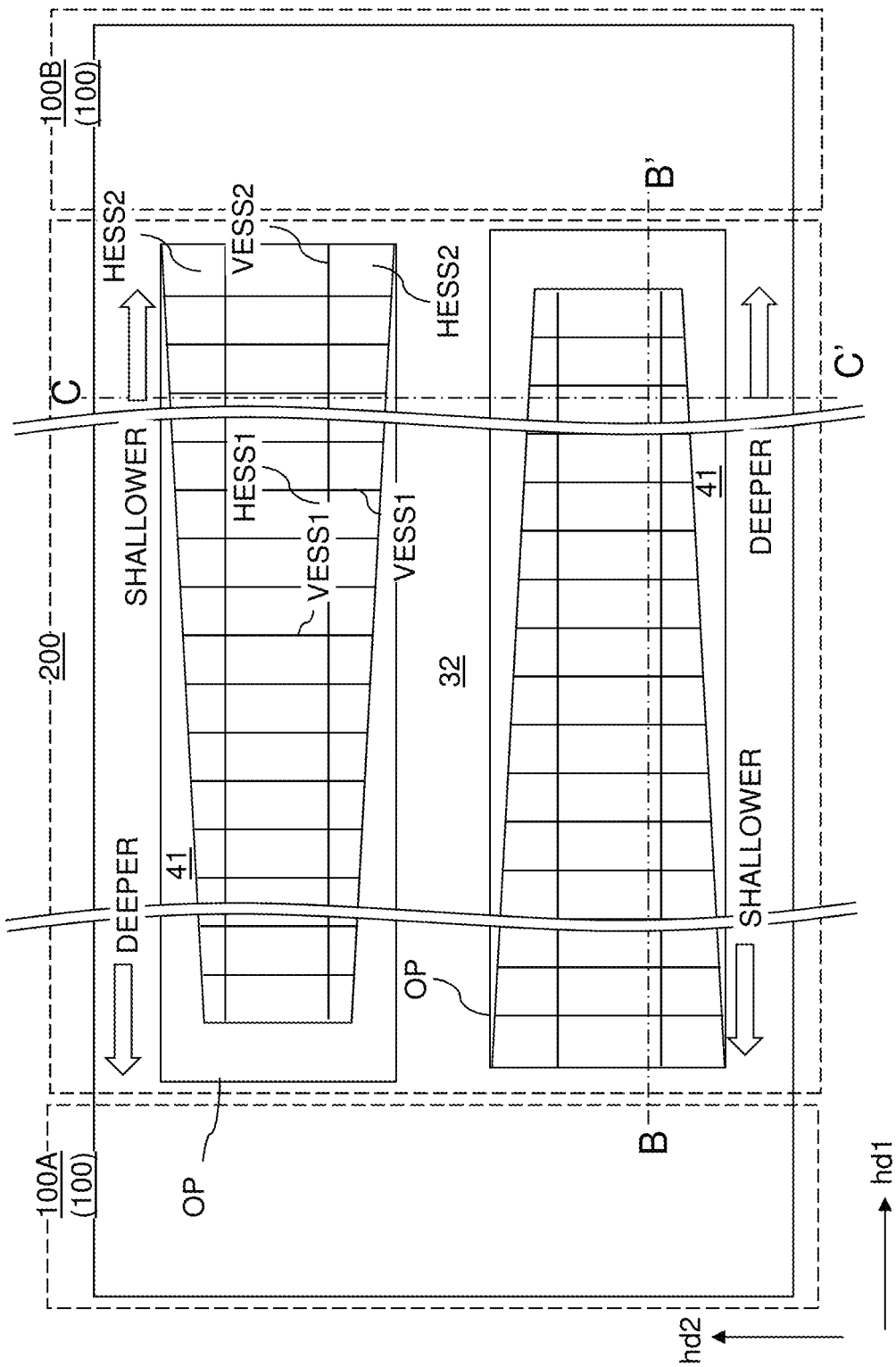
FIG. 6A is a top-down view of a second exemplary structure after formation of staircases according to a second embodiment of the present disclosure. The region illustrated in FIG. 6A corresponds to region M1 in FIG. 1.
Figure 6B:
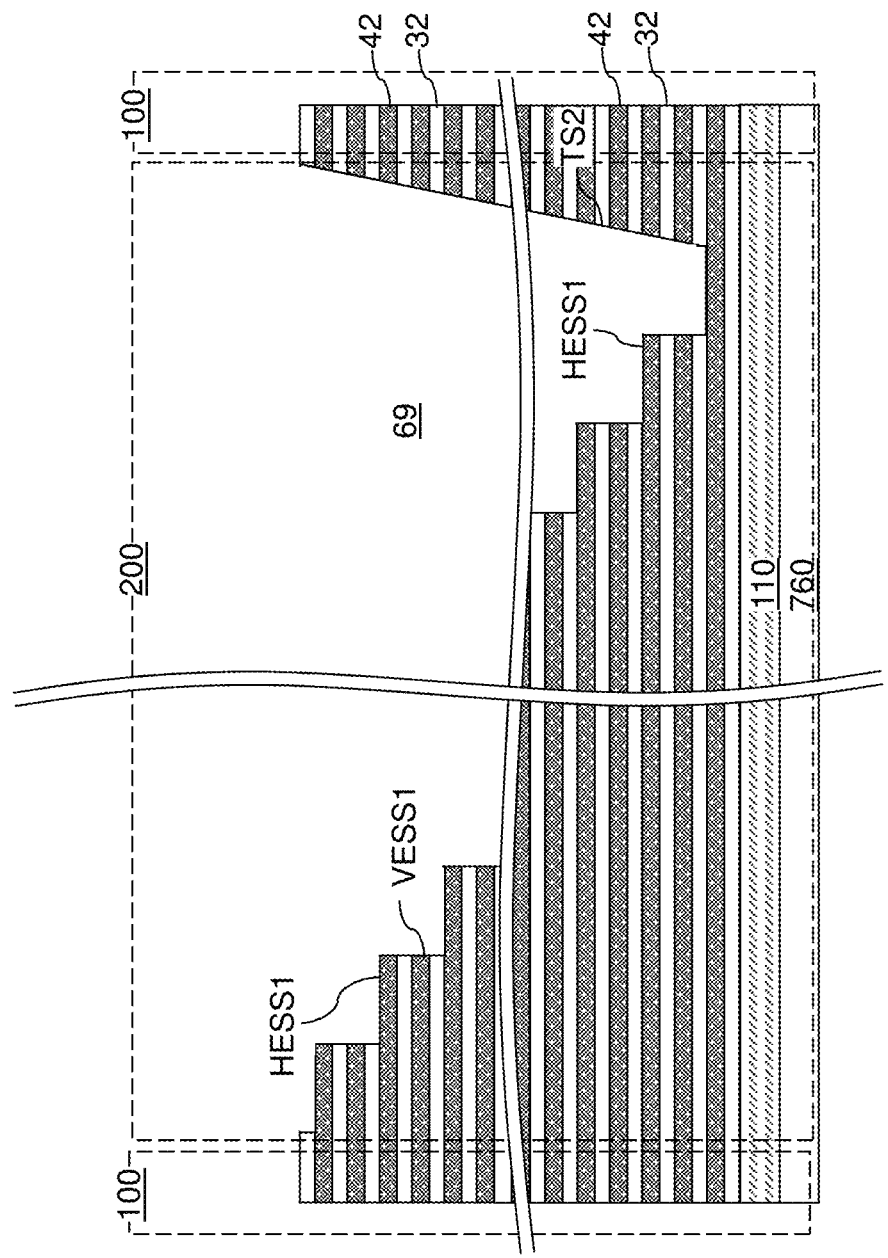
FIG. 6B is a vertical cross-sectional view of the second exemplary structure along the vertical plane B-B' of FIG. 6A.
Figure 6C:
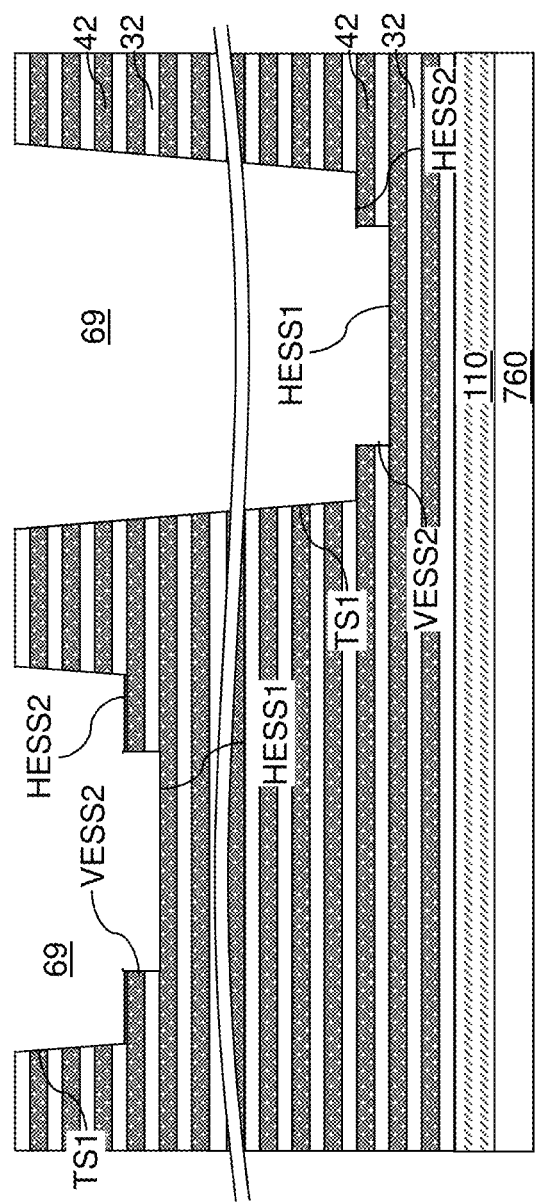
FIG. 6C is a vertical cross-sectional view of the second exemplary structure along the vertical plane C-C' of FIG. 6A.

Referring to FIGS. 6A-6C, a second exemplary structure according to a second embodiment of the present disclosure may be derived from the first exemplary structure by altering the pattern of the etch mask layers, and/or by adding or omitting one or more etch mask layers.

Specifically, the second exemplary structure can be derived from the first exemplary structure such that each set of second horizontally-extending surface segments HESS2 laterally extends along the first horizontal direction hd1 from one end of a respective staircase to another end of the respective staircase. In one embodiment, a total number of the second horizontally-extending surface segments HESS2 is the same as a total number of the first horizontally-extending surface segments HESS1. In this embodiment, each first horizontally-extending surface segment HESS1 that connects a respective pair of and is adjoined to each of second horizontally-extending surface segments HESS2 is aligned along the first horizontal direction hd1 to another first horizontally-extending surface segment HESS1 that connects and is adjoined to a respective pair of second horizontally-extending surface segments HESS2. In some embodiments, a second vertically-extending surface segment VESS2 may laterally extend from a bottom edge of the second tapered sidewall TS2 to a topmost surface of the vertically alternating sequence (32, 42). The stepped bottom surface of each staircase comprises a plurality of horizontally-extending surface segments (HESS1, HESS2) having a respective rectangular shape or a respective trapezoidal shape in a plan view (such as a top-down view).

FIGS. 7A-7D are sequential schematic vertical cross-sectional views of a portion the second exemplary structure during a first subset of processing steps for forming stepped surfaces. In this example, the GY etch mask layer can have a laterally-extending edge that extends along the first horizontal direction hd1 from one end of a respective staircase to another end of the staircase. In the illustrated example, a combination of a GX1 etch mask layer and a GX2 etch mask layer may be employed in lieu of a set of four etch mask layers (GX1A, GX1B, GX2A, GX2B) illustrated in FIGS. 4C-4F. Generally, the total number of trimmable mask layers may be selected to provide a suitable number of vertical steps at the levels of the topmost sacrificial material layers 42. A subset of such vertical steps laterally extend along the first horizontal direction hd1, and are laterally spaced among one another along the second horizontal direction hd2.

FIGS. 7E-7H are sequential schematic vertical cross-sectional views of a portion of the second exemplary structure during a second subset of processing steps for forming stepped surfaces and accompanying cross-sectional views along perpendicular vertical planes. The sequence of processing steps described with reference to FIGS. 4G-4J can be performed to form a stepped cavity 69 within each of the staircases.

Figure 8:
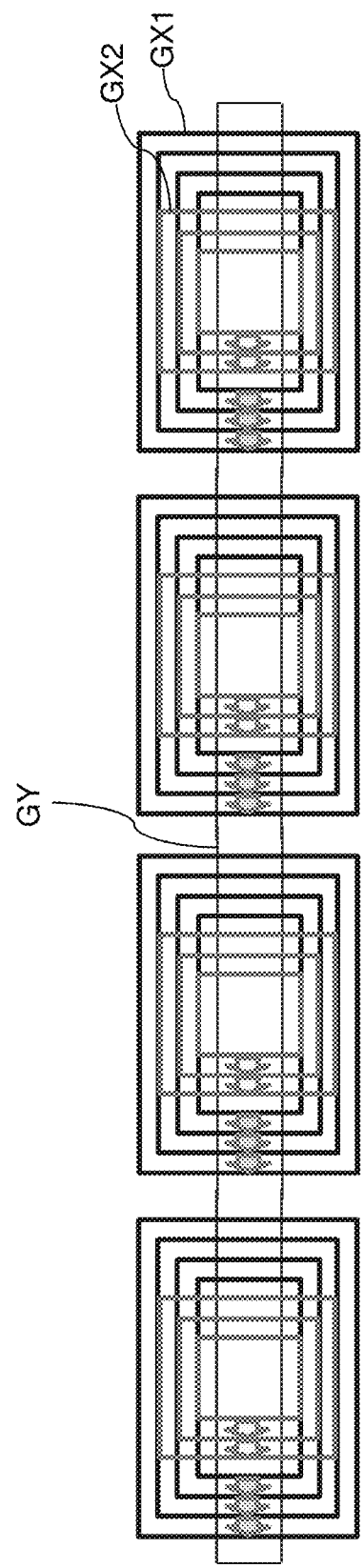
FIG. 8 illustrate exemplary patterns for a first subset of etch masks that may be employed for the first subset of processing steps related to FIGS. 7A-7D.

FIG. 8 illustrates exemplary patterns for a first subset of etch masks that may be employed for the first subset of processing steps related to FIGS. 7A-7D. The GY etch mask layer may laterally extend from one end of each staircase to another end of each staircase with two laterally-extending lengthwise edges that laterally extend along the first horizontal direction hd1. As discussed above, each trimmable etch mask layer may be formed with a smallest opening pattern for the respective trimmable etch mask layer, and can be sequentially enlarged to provide larger openings after performing a respective anisotropic etch process, thereby providing a respective series of vertical steps in the vertically alternating sequence (32, 42).

Figure 9A:
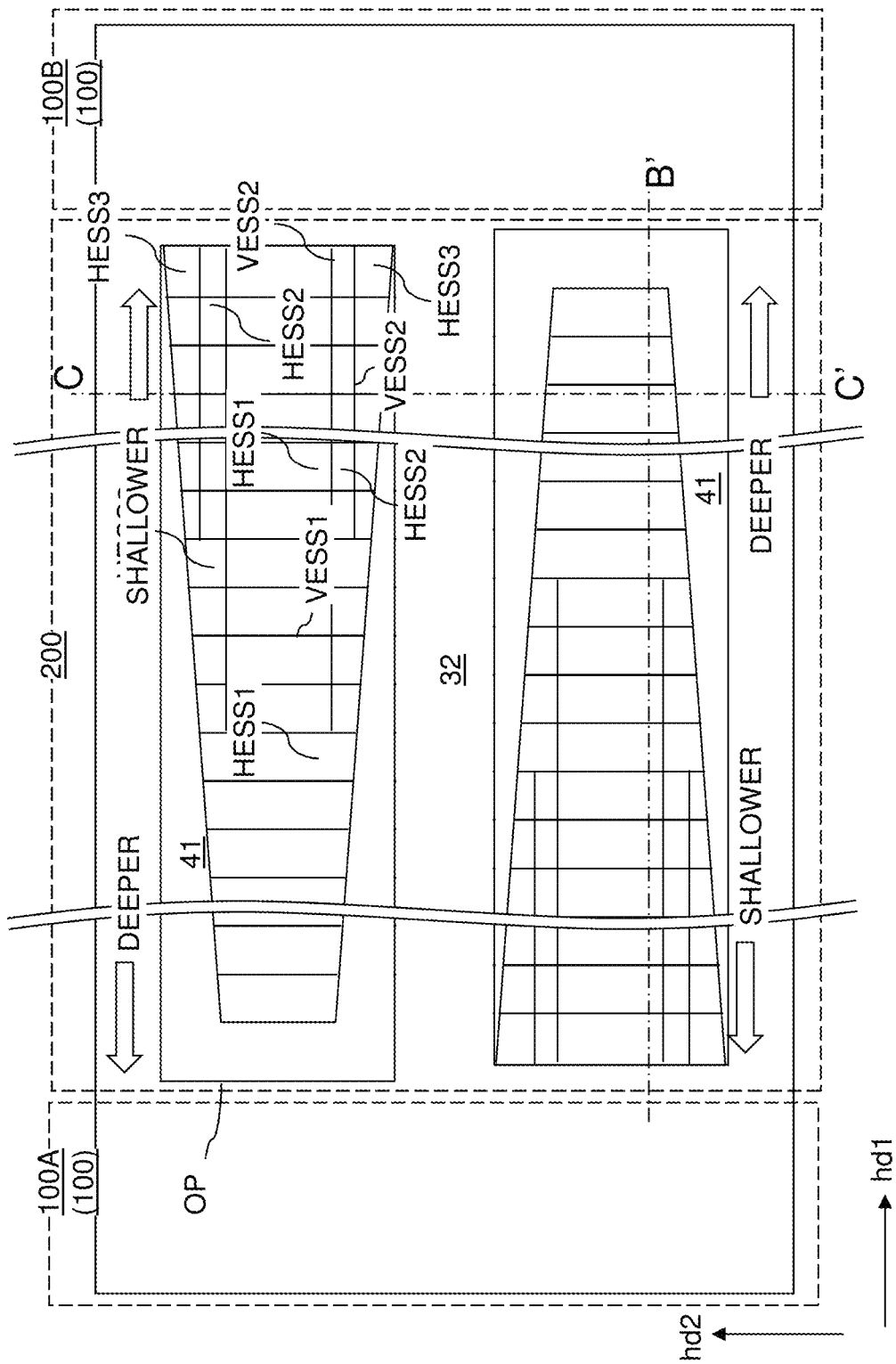
FIG. 9A is a top-down view of a third exemplary structure after formation of staircases according to a third embodiment of the present disclosure. The region illustrated in FIG. 9A corresponds to region M1 in FIG. 1.
Figure 9B:
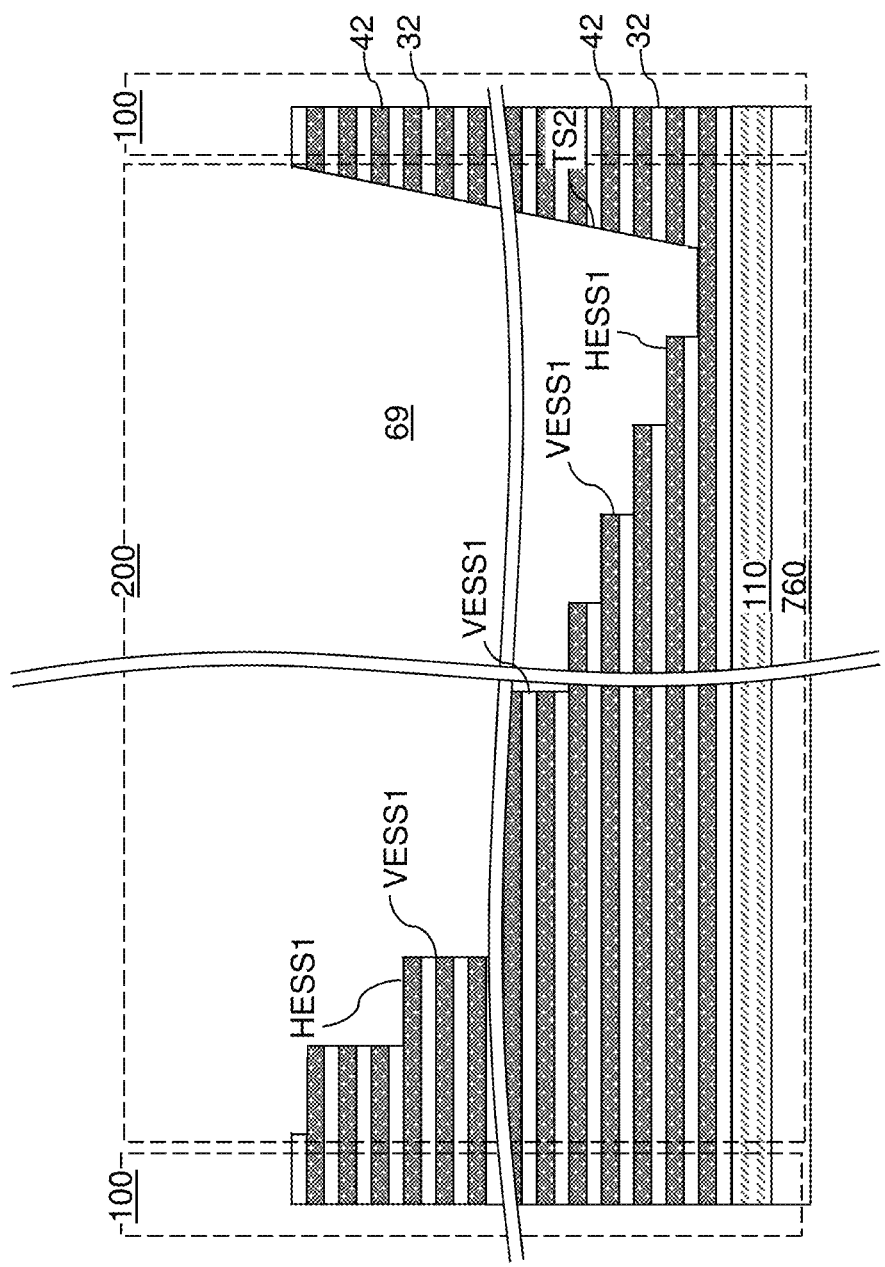
FIG. 9B is a vertical cross-sectional view of the third exemplary structure along the vertical plane B-B' of FIG. 9A.
Figure 9C:
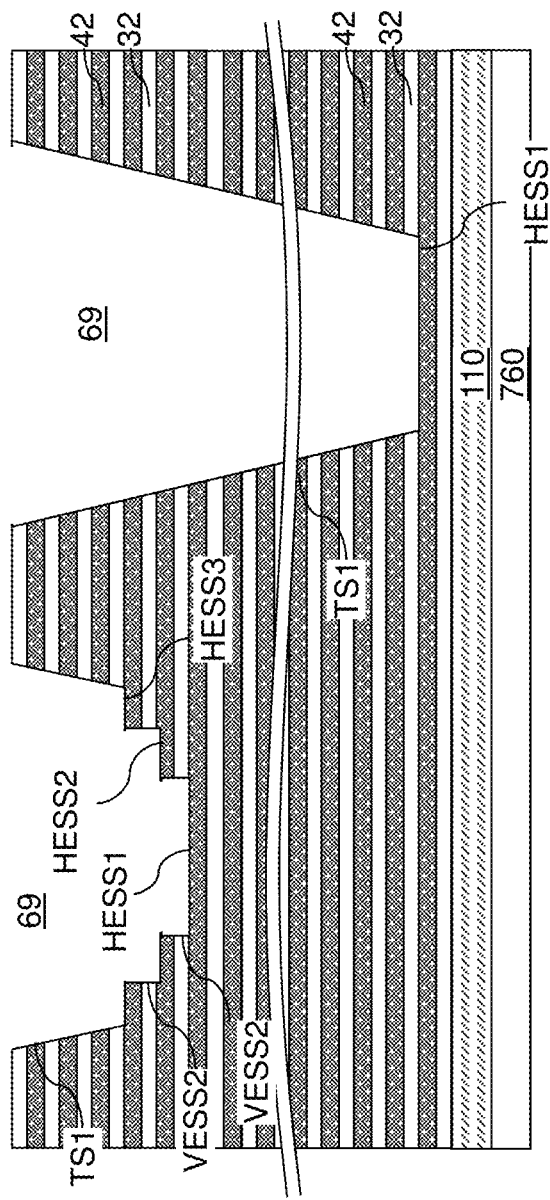
FIG. 9C is a vertical cross-sectional view of the third exemplary structure along the vertical plane C-C' of FIG. 9A.
Figure 10A:
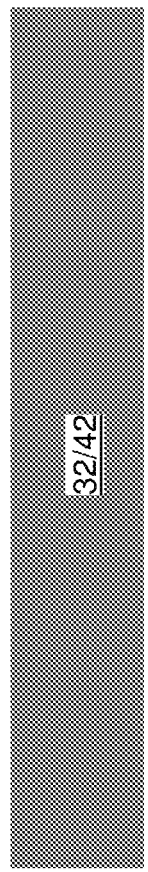
Figure 10B:
Figure 10C:
Figure 10D:
Figure 10E:
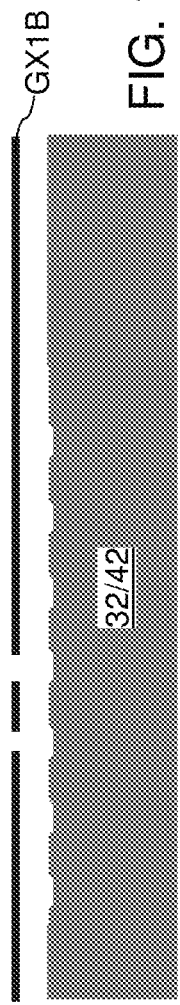

Referring to FIGS. 9A-9C, a third exemplary structure according to a third embodiment of the present disclosure may be derived from the first exemplary structure or from the second exemplary structure by altering the pattern of the etch mask layers, and/or by adding or omitting one or more etch mask layers.

Specifically, the second exemplary structure can be derived from the second exemplary structure by forming third horizontally-extending surface segments HESS3 laterally extends along the first horizontal direction hd1 and adjoined to a respective one of the second horizontally-extending surface segments HESS2 by a respective additional second vertically-extending surface segments VESS2. In one embodiment, each row of third horizontally-extending surface segments HESS3 may be laterally offset from a respective row of second horizontally-extending surface segments HESS2, and may be laterally offset from a respective row of first horizontally-extending surface segments HESS1 in the second horizontal direction. Thus, in this embodiment, there is one full row of central treads HESS1 and two partial rows of peripheral treads HESS2 and HESS3 on each side of the rows of peripheral treads, In one embodiment, the total number of third horizontally-extending surface segments HESS3 within a row of third horizontally-extending surface segments HESS3 may be the same as or may be less than the total number of second horizontally-extending surface segments HESS2 within a row of second horizontally-extending surface segments HESS2. In one embodiment, the total number of second horizontally-extending surface segments HESS2 within a row of second horizontally-extending surface segments HESS2 may be the same as or may be less than the total number of first horizontally-extending surface segments HESS1 within a row of first horizontally-extending surface segments HESS1.

In one embodiment, one of the second vertically-extending surface segments VESS2 laterally extends continuously along the first horizontal direction hd1, is adjoined to the second subset of the first vertically-extending surface segments VESS1 (that adjoins neighboring pairs of second horizontally-extending surface segments HESS2), and is adjoins to a third subset of the first vertically-extending surface segments VESS1 (that adjoin neighboring pairs of third horizontally-extending surface segments HESS3). In one embodiment, one or more of the second vertically-extending surface segments VESS2 may vertically extend over one insulating layers 32 and one sacrificial material layer 42.

In one embodiment, a first set of the first vertically-extending surface segments VESS1 located in the shallower end of the staircase that has five rows of treads (HESS1, HESS2 and HESS3) may vertically extend over three insulating layers 32 and three sacrificial material layers 42. A second set of the first vertically-extending surface segments VESS1 located between the shallower and the deeper ends of the staircase that has three rows of treads (HESS1 and HESS2) may vertically extend over two insulating layers 32 and two sacrificial material layers 42. A third set of the first vertically-extending surface segments VESS1 located in the deeper end of the staircase that has one row of treads (HESS1) may vertically extend over one insulating layer 32 and one sacrificial material layer 42.

FIGS. 10A-10I are sequential schematic vertical cross-sectional views of a portion the third exemplary structure during a first subset of processing steps for forming stepped surfaces. In this example, a GY1 etch mask layer and a GY2 etch mask layer can be employed to form laterally-extending edge that extends along the first horizontal direction hd1. The patterns of the GY1 etch mask layer the GY2 etch mask layer may be employed to form the second vertically-extending surface segments VESS2 that laterally extend along the first horizontal direction hd1. For example, the pattern of the GY1 etch mask layer may be employed form a pattern of a first subset of the second vertically-extending surface segments VESS2 that connect a respective row of first horizontally-extending surface segments HESS1 and a respective row of second horizontally-extending surface segments HESS2. the pattern of the GY2 etch mask layer may be employed form a pattern of a second subset of the second vertically-extending surface segments VESS2 that connect a respective row of second horizontally-extending surface segments HESS2 and a respective row of third horizontally-extending surface segments HESS3.

In the illustrated example, a set of etch mask layers (GX1A, GX1B, GX1C, GX2A, GX2B, GX2C) may be employed in lieu of a set of four etch mask layers (GX1A, GX1B, GX2A, GX2B) illustrated in FIGS. 4C-4F. Generally, the total number of trimmable mask layers may be selected to provide a suitable number of vertical steps at the levels of the topmost sacrificial material layers 42. A subset of such vertical steps laterally extend along the first horizontal direction hd1, and are laterally spaced among one another along the second horizontal direction hd2.

FIGS. 10J-10M are sequential schematic vertical cross-sectional views of a portion of the second exemplary structure during a second subset of processing steps for forming stepped surfaces and accompanying cross-sectional views along perpendicular vertical planes. The sequence of processing steps described with reference to FIGS. 4G-4J can be performed to form a stepped cavity 69 within each of the staircases.

Figure 11:
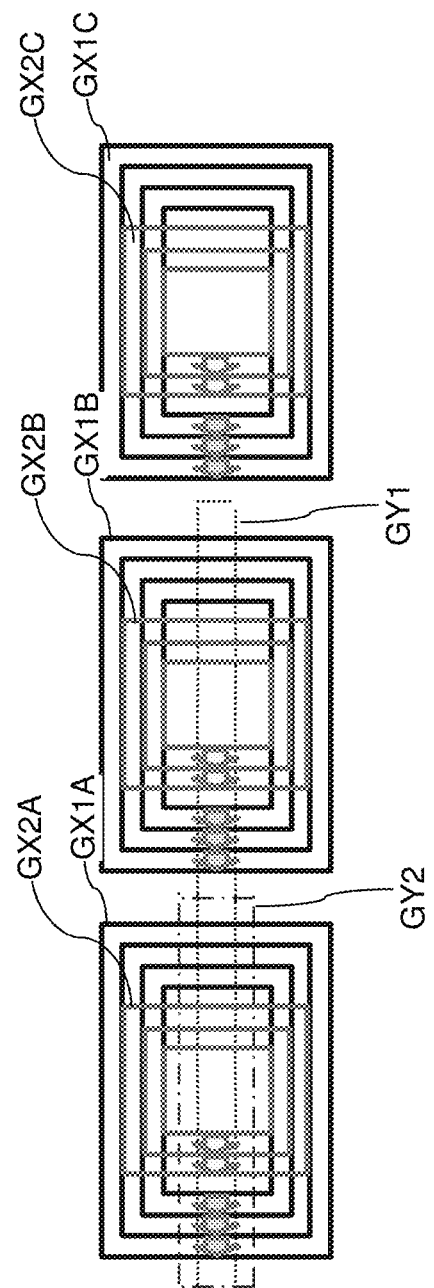
FIG. 11 illustrate exemplary patterns for a first subset of etch masks that may be employed for the first subset of processing steps related to FIGS. 10A-10I.

FIG. 11 illustrate exemplary patterns for a first subset of etch masks that may be employed for the first subset of processing steps related to FIGS. 10A-10I. The GY1 etch mask layer and the GY2 etch mask layer may, or may not, laterally extend from one end of each staircase to another end of each staircase with two laterally-extending lengthwise edges that laterally extend along the first horizontal direction hd1. In the illustrative example, each of the GY1 etch mask layer and the GY2 etch mask layer laterally extends through a respective portion of the staircase that is less than the length of the staircase along the first horizontal direction hd1. As discussed above, each trimmable etch mask layer may be formed with a smallest opening pattern for the respective trimmable etch mask layer, and can be sequentially enlarged to provide larger openings after performing a respective anisotropic etch process, thereby providing a respective series of vertical steps in the vertically alternating sequence (32, 42).

Figure 12A:
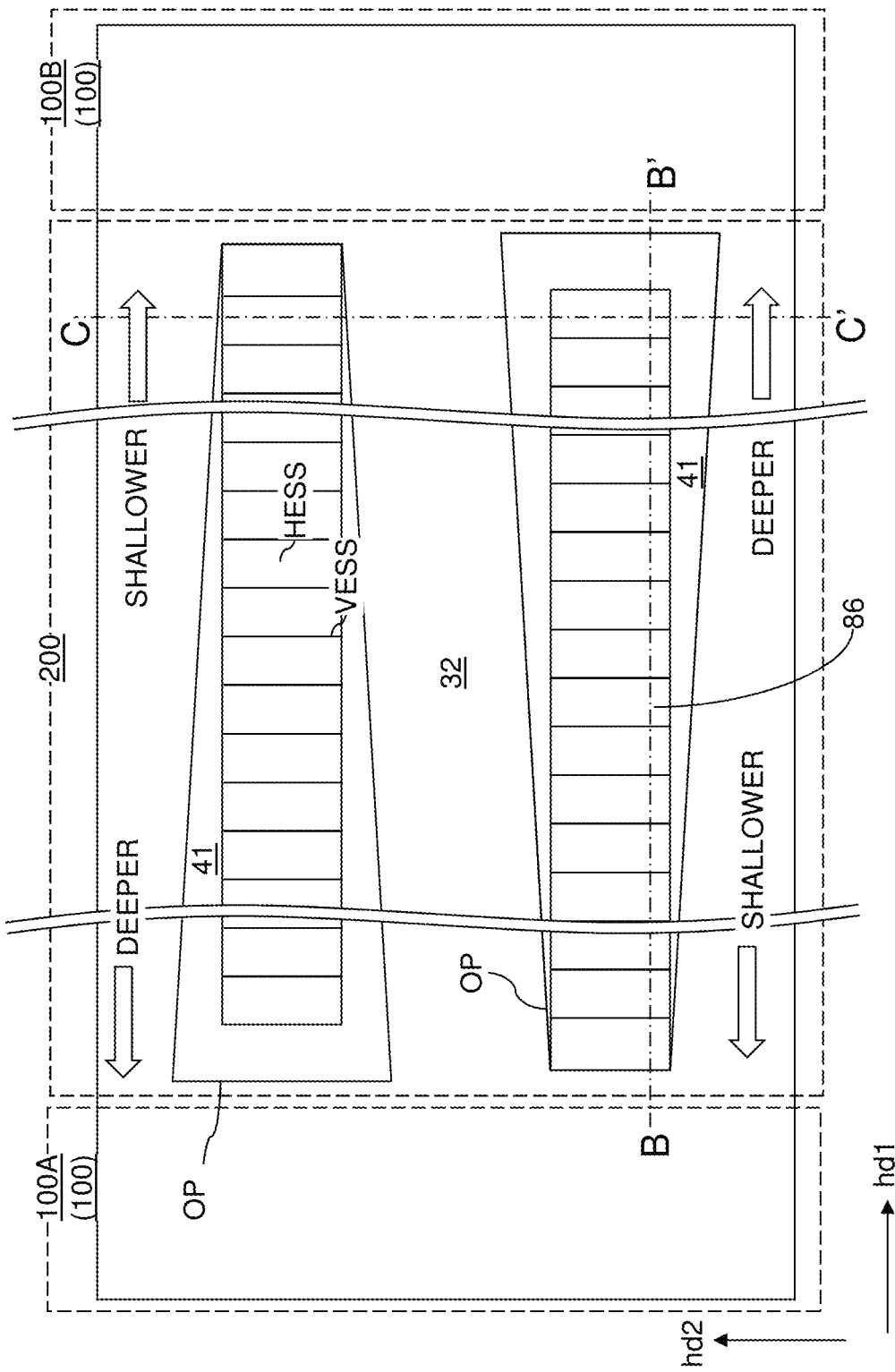
FIG. 12A is a top-down view of a fourth exemplary structure after formation of staircases according to a fourth embodiment of the present disclosure. The region illustrated in FIG. 12A corresponds to region M1 in FIG. 1.
Figure 12B:
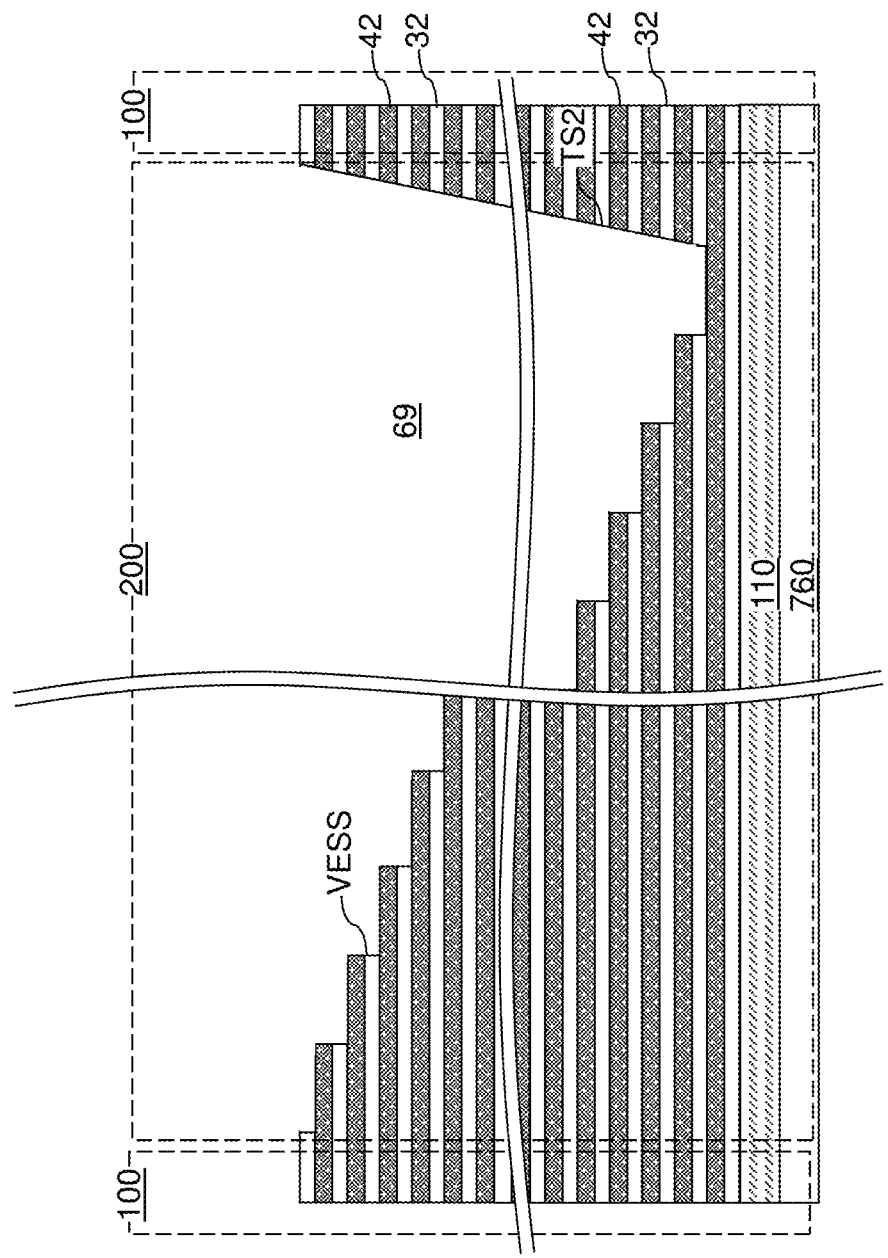
FIG. 12B is a vertical cross-sectional view of the fourth exemplary structure along the vertical plane B-B' of FIG. 12A.
Figure 12C:
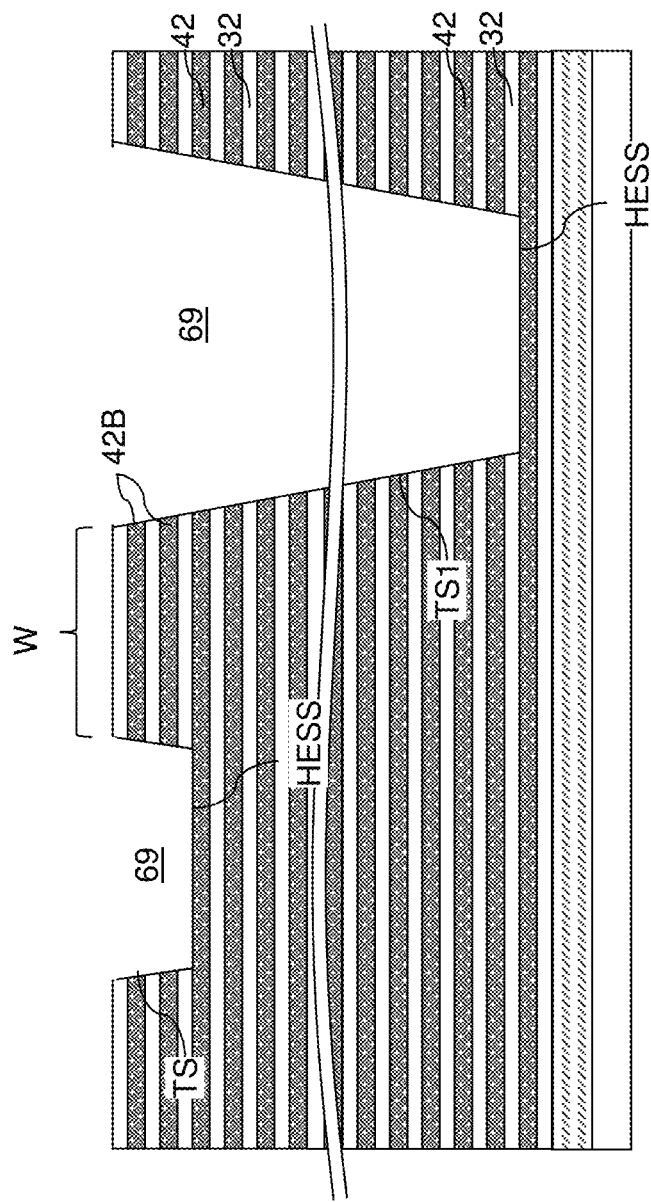
FIG. 12C is a vertical cross-sectional view of the fourth exemplary structure along the vertical plane C-C' of FIG. 12A.

Referring to FIGS. 12A-12C, a fourth exemplary structure according to a fourth embodiment of the present disclosure may be derived from the first, second, or third exemplary structure by forming the periphery of the opening OP for each staircase in the shape of a trapezoid in a plan view. Optionally, but not necessarily, formation of the second or third horizontally-extending surface segments (HESS2, HESS3) and/or the second vertically-extending surface segments VESS2 may be omitted in this embodiment.

In the fourth exemplary structure, a region of the vertically alternating sequence (32, 42) can be etched by performing multiple iterations of a combination of a respective lithographic patterning process and a respective anisotropic etch process. A stepped cavity 69 having a stepped bottom surface is formed in the inter-array region 200. According to an aspect of the present disclosure, a horizontal cross-sectional area of the stepped cavity 69 at a level of a topmost spacer material layer (such as the topmost sacrificial material layer 42) of the spacer material layers (e.g., sacrificial material layers 42) has a variable width that decreases with a lateral distance from the first memory array region 100A toward the second memory array region 100B along the first horizontal direction hd1. In one embodiment, the variable width may decrease strictly or stepwise with the lateral distance. In one embodiment, the stepped cavity is wider at the deeper end of the staircase than at the shallower end of the staircase. In the illustrative example shown in FIGS. 12A-12C, the horizontal cross-sectional area of the stepped cavity 69 at the level of the topmost sacrificial material layer 42 has a variable width that decreases strictly, and has a trapezoidal shape.

As used herein, a function of a parameter "increases strictly" if, for each second value of the parameter that is greater than any first value of the parameter, the value of the function for the second value of the parameter is greater than the value of the function for the first value of the parameter. A function of a parameter "decreases strictly" if, for each second value of the parameter that is greater than any first value of the parameter, the value of the function for the second value of the parameter is less than the value of the function for the first value of the parameter. On contrast, a function of a parameter "increases monotonically" if, for each second value of the parameter that is greater than any first value of the parameter, the value of the function for the second value of the parameter is not less than the value of the function for the first value of the parameter. A function of a parameter "decreases monotonically" if, for each second value of the parameter that is greater than any first value of the parameter, the value of the function for the second value of the parameter is not more than the value of the function for the first value of the parameter.

In one embodiment, the inter-array region 200 comprises a stepped surface region comprising vertically-extending surface segments VESS (i.e., risers) of the alternating stack (32, 42) that are perpendicular to the first horizontal direction hd1. In one embodiment, the stepped surface region comprises horizontally-extending surface segments HESS (i.e., treads) connecting a respective neighboring pair of vertically-extending surface segments VESS of the vertically-extending surface segments VESS. Thus, as shown in FIG. 12C the widths "W" of the bridge regions 42B of sacrificial material layers 42 in the second horizontal direction hd2 located between adjacent stepped cavities 69 in the inter-array region 200 is increased compared to those of the first, second and third exemplary structures of the prior embodiments. After the sacrificial material layers 42 are replaced with electrically conductive layers (e.g., word lines and select gate electrodes) in a subsequent step shown in FIGS. 21A-22C, the widths of the bridge regions electrically conductive layers in the second horizontal direction hd2 located in the inter-array region 200 is increased, which beneficially decreases their resistance. Thus, lower resistivity strip-shaped bridge regions in the inter-tier array 200 connect the word lines and select gate electrodes in adjacent memory array regions 100A and 100B.

In one embodiment, the taper of the trapezoidal shape in the horizontal cross-sectional area of a stepped cavity 69 at a level of the topmost sacrificial material layer 42 may be selected such that each of the horizontally-extending surface segments HESS has a same lateral extent along the second horizontal direction hd2. In one embodiment, each of the horizontally-extending surface segments HESS of the alternating stack (32, 42) has a respective rectangular shape and has a same lateral extent along the second horizontal direction hd2.

Figure 13:
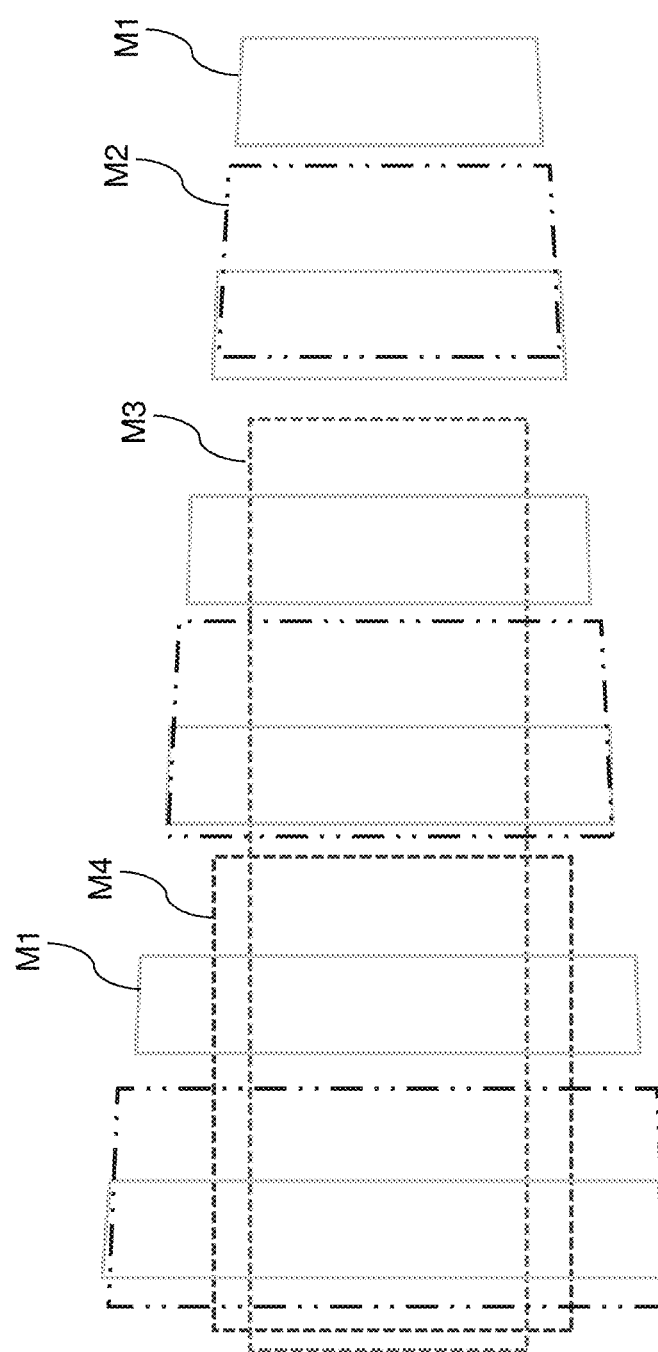
FIG. 13 illustrate exemplary patterns for a subset of etch masks that may be employed to pattern the staircase illustrated in FIGS. 12A-12C.

Referring to FIG. 13, a subset of etch mask layers (M1, M2, M3, M4) are shown, which may be employed to pattern the staircase illustrated in FIGS. 12A-12C. Generally, the processing steps for forming the first, second, or third exemplary structure as described above may be employed to form the fourth exemplary structure. According to an aspect of the present disclosure, at least a subset of the etch mask layers (M1, M2, M3, M4) employed to form the fourth exemplary structure may include trapezoidal openings that collectively define the shape of the periphery of an opening OP illustrated in FIG. 12A. Optionally, second vertically-extending surface segments VESS described with reference to the first, second, and third exemplary structures may be formed by employing at least one etch mask layer having laterally-extending edges that are parallel to the first horizontal direction hd1, such as a third etch mask layer M3 and a fourth etch mask layer M4 illustrated in FIG. 13.

Figure 14A:
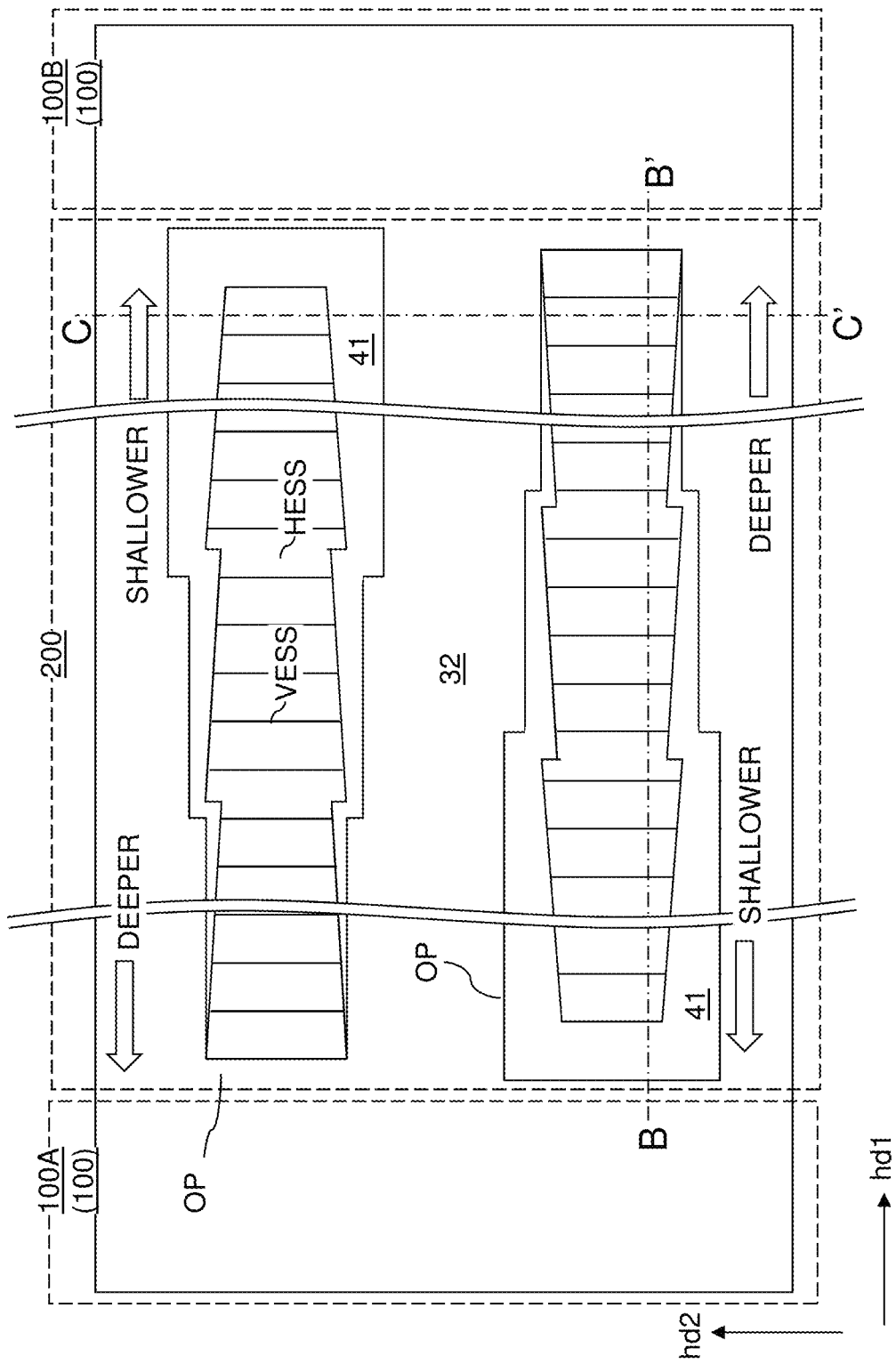
FIG. 14A is a top-down view of a fifth exemplary structure after formation of staircases according to a fifth embodiment of the present disclosure. The region illustrated in FIG. 14A corresponds to region M1 in FIG. 1.
Figure 14B:
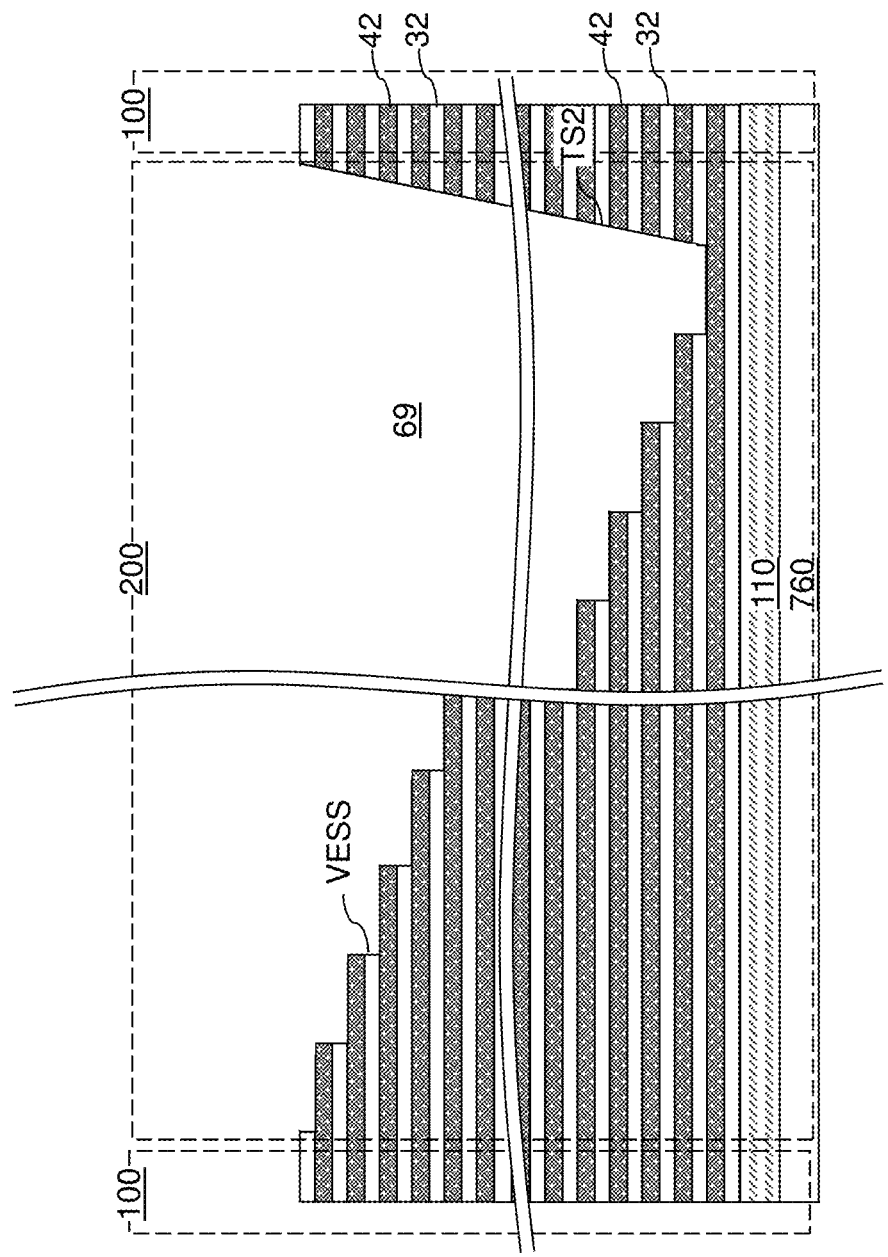
FIG. 14B is a vertical cross-sectional view of the fifth exemplary structure along the vertical plane B-B' of FIG. 14A.
Figure 14C:
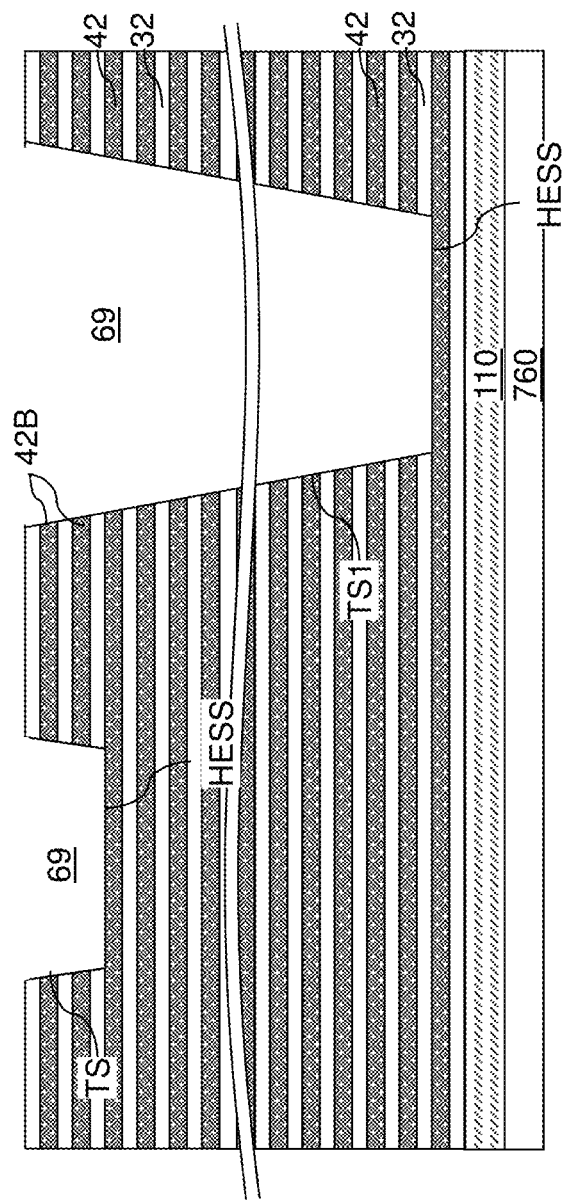
FIG. 14C is a vertical cross-sectional view of the fifth exemplary structure along the vertical plane C-C' of FIG. 14A.

Referring to FIGS. 14A-14C, a fifth exemplary structure according to a fifth embodiment of the present disclosure can be derived from the fourth exemplary structure illustrated in FIGS. 12A-12C by modifying the shape of a periphery of an opening OP in a hard mask layer (not shown). Specifically, a horizontal cross-sectional area of the stepped cavity 69 at a level of a topmost spacer material layer (such as the topmost sacrificial material layer 42) of the spacer material layers has a variable width that decreases stepwise with a lateral distance from the first memory array region 100A toward the second memory array region 100B along the first horizontal direction hd1. In the illustrative example shown in FIGS. 14A-14C, the horizontal cross-sectional area of the stepped cavity 69 at the level of the topmost sacrificial material layer 42 has a variable width that decreases stepwise.

In one embodiment, the stepped bottom surface comprises a plurality of horizontally-extending surface segments HESS having a respective rectangular shape or a respective trapezoidal shape. In one embodiment, the horizontally-extending surface segments HESS have a variable lateral extent along the second horizontal direction hd2 including at least one stepwise increase as a function of the lateral distance from the first memory array region 100A toward the second memory array region 100B. In one embodiment, the horizontally-extending surface segments HESS has a strictly decreasing lateral extent within a range of the lateral distance that does not include the at least one stepwise increase.

In one embodiment, a plurality of the horizontally-extending surface segments HESS of the alternating stack (32, 42) has a respective trapezoidal shape having parallel edges that laterally extend along the second horizontal direction hd2 and non-parallel edges that laterally extend along the first horizontal direction hd1. In an alternative embodiment, at least one of the horizontally-extending surface segments HESS of the alternating stack (32, 42) may have an eight-sided shape that is derived from a trapezoidal shape by removing two corner portions of the trapezoidal shape (i.e., a rounded trapezoid shape or a substantially trapezoid shape).

Figure 15:
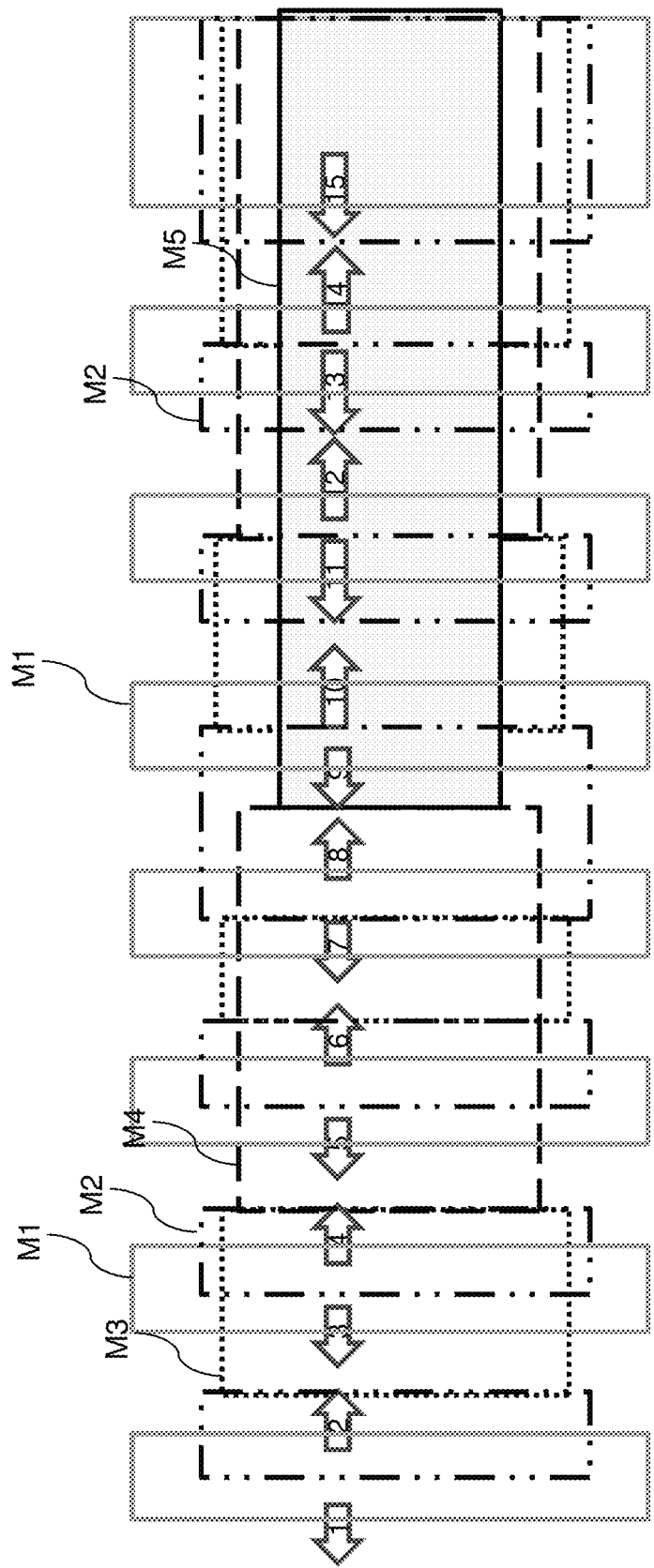
FIG. 15 illustrate exemplary patterns for a subset of etch masks that may be employed to pattern the staircase illustrated in FIGS. 14A-14C.

Referring to FIGS. 15, a subset of etch mask layers that may be employed to pattern the staircase illustrated in FIGS. 14A-14C is illustrated. A subset of the various vertical steps is numbered with integers. The arrows represent the downward direction of a respective vertical step.

Figure 16A:
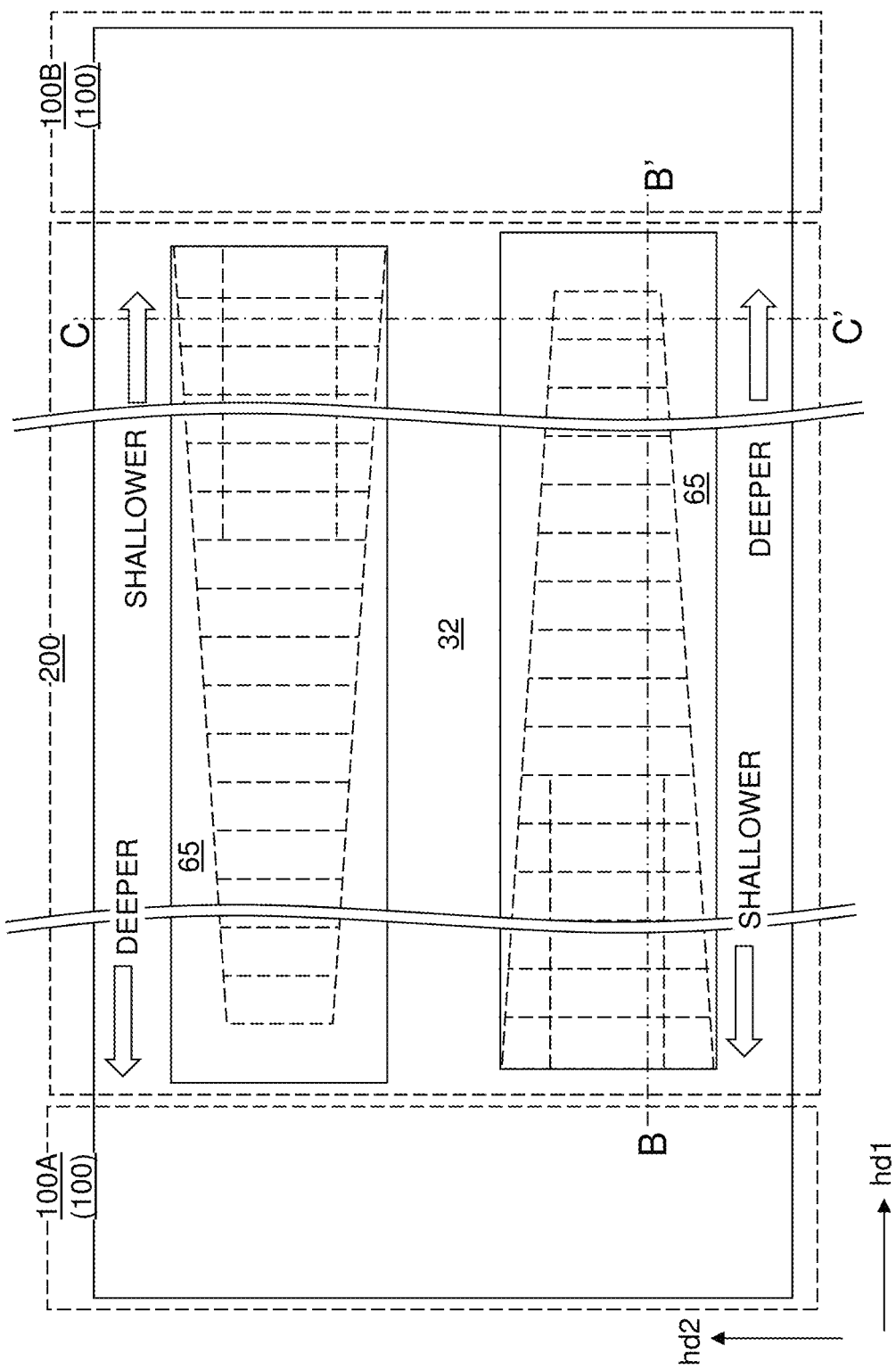
FIG. 16A is a top-down view of the first exemplary structure after formation of retro-stepped dielectric material portions according to the first embodiment of the present disclosure. The region illustrated in FIG. 16A corresponds to region M1 in FIG. 1.
Figure 16B:
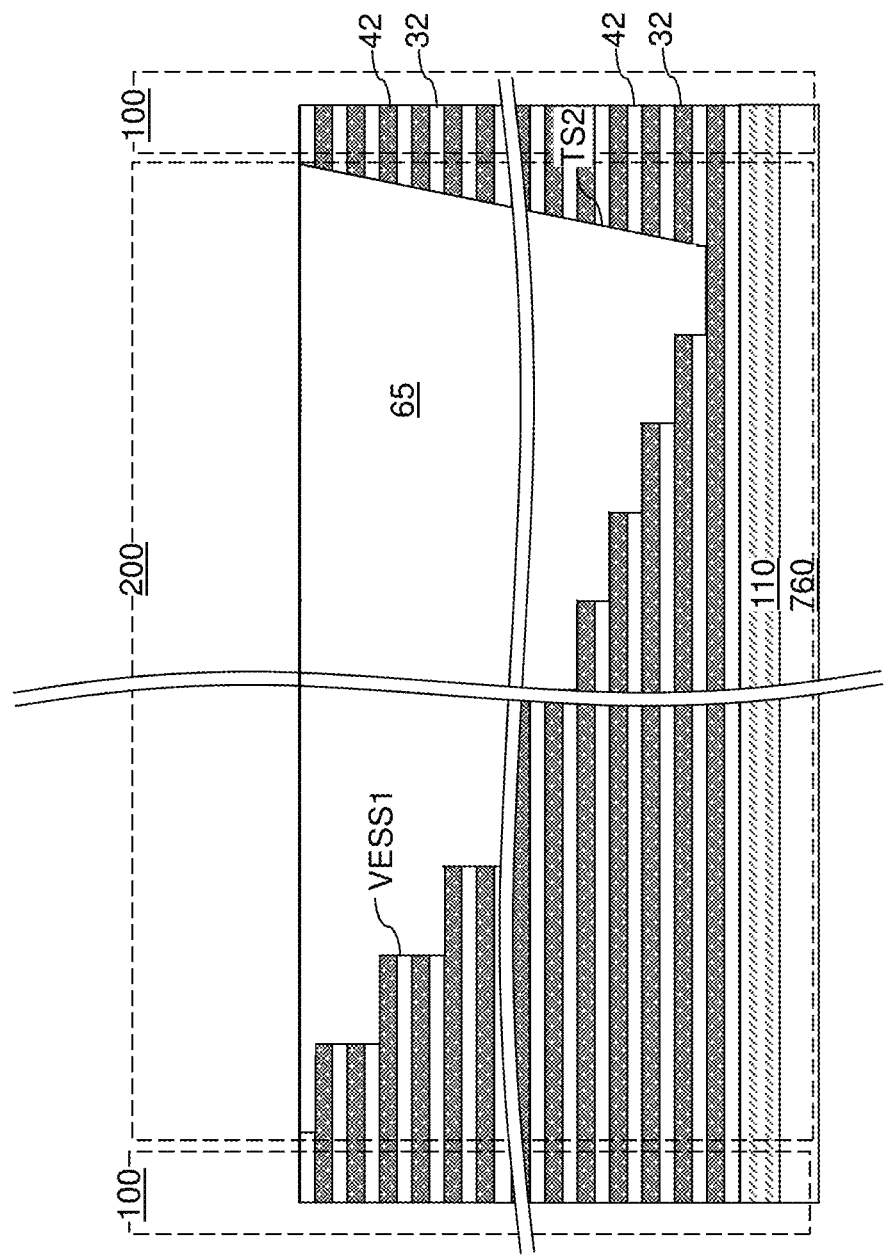
FIG. 16B is a vertical cross-sectional view of the first exemplary structure along the vertical plane B-B' of FIG. 16A.
Figure 16C:
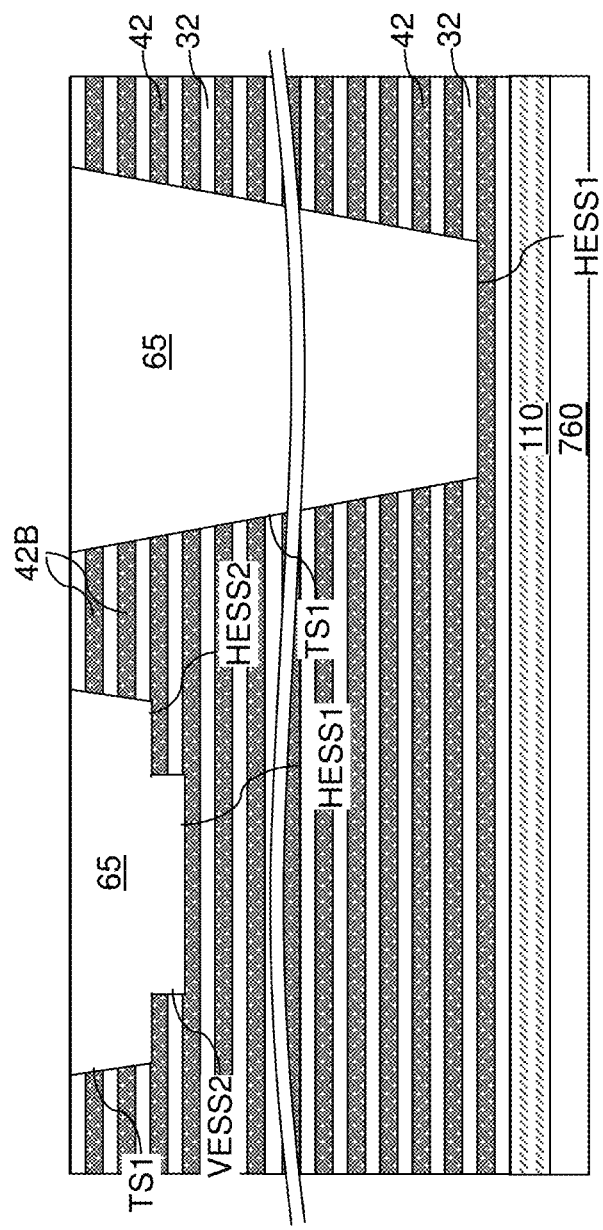
FIG. 16C is a vertical cross-sectional view of the first exemplary structure along the vertical plane C-C' of FIG. 16A.

Referring to FIGS. 16A-16C, a dielectric fill material such as silicon oxide can be deposited in the stepped cavities 69 in any of the exemplary structures described above. While FIGS. 16A-16C illustrate an example employing the first exemplary structure, embodiments are expressly contemplated herein in which any of the second, third, fourth, or fifth exemplary structures are employed in lieu of the first exemplary structure in any of the subsequent processing steps.

A planarization process such as a chemical mechanical polishing (CMP) process may be performed to remove portions of the dielectric fill material from above the horizontal plane including the topmost surface of the vertically alternating stack (32, 42). Each remaining portion of the dielectric fill material that fills a respective stepped cavity 69 constitutes a retro-stepped dielectric material portion 65.

Generally, a retro-stepped dielectric material portion 65 can be formed in each stepped cavity 69 over a respective stepped bottom surface of staircase. The retro-stepped dielectric material portion 65 overlies and contacts horizontally-extending surface segments {(HESS1, HESS2, HESS3), HESS} (i.e., treads) of the alternating stack (32, 42) staircase. In one embodiment, one, a plurality and/or each the retro-stepped dielectric material portions 65 comprises: a first tapered sidewall TS1 that extends along the first horizontal direction hd1 and has a first taper angle relative to a vertical direction along the second horizontal direction hd2 and contacting the strip-shaped bridge regions 42B of the sacrificial material layers 42 located in the inter-array region 200 and connecting the adjacent memory array regions 100A and 100B, and a second tapered sidewall TS2 that extends along the second horizontal direction hd2, adjoined to an edge of the first tapered sidewall TS1, and has a second taper angle relative to the vertical direction along the first horizontal direction hd1. Generally, the first taper angle, as measured from a vertical direction, may be in a range from 5 degrees to 30 degrees, such as from 8 degrees to 20 degrees, and the second taper angle, as measured from a vertical direction, may be in a range from 5 degrees to 30 degrees, such as from 8 degrees to 20 degrees, although lesser and greater taper angles may also be employed.

Figure 17A:
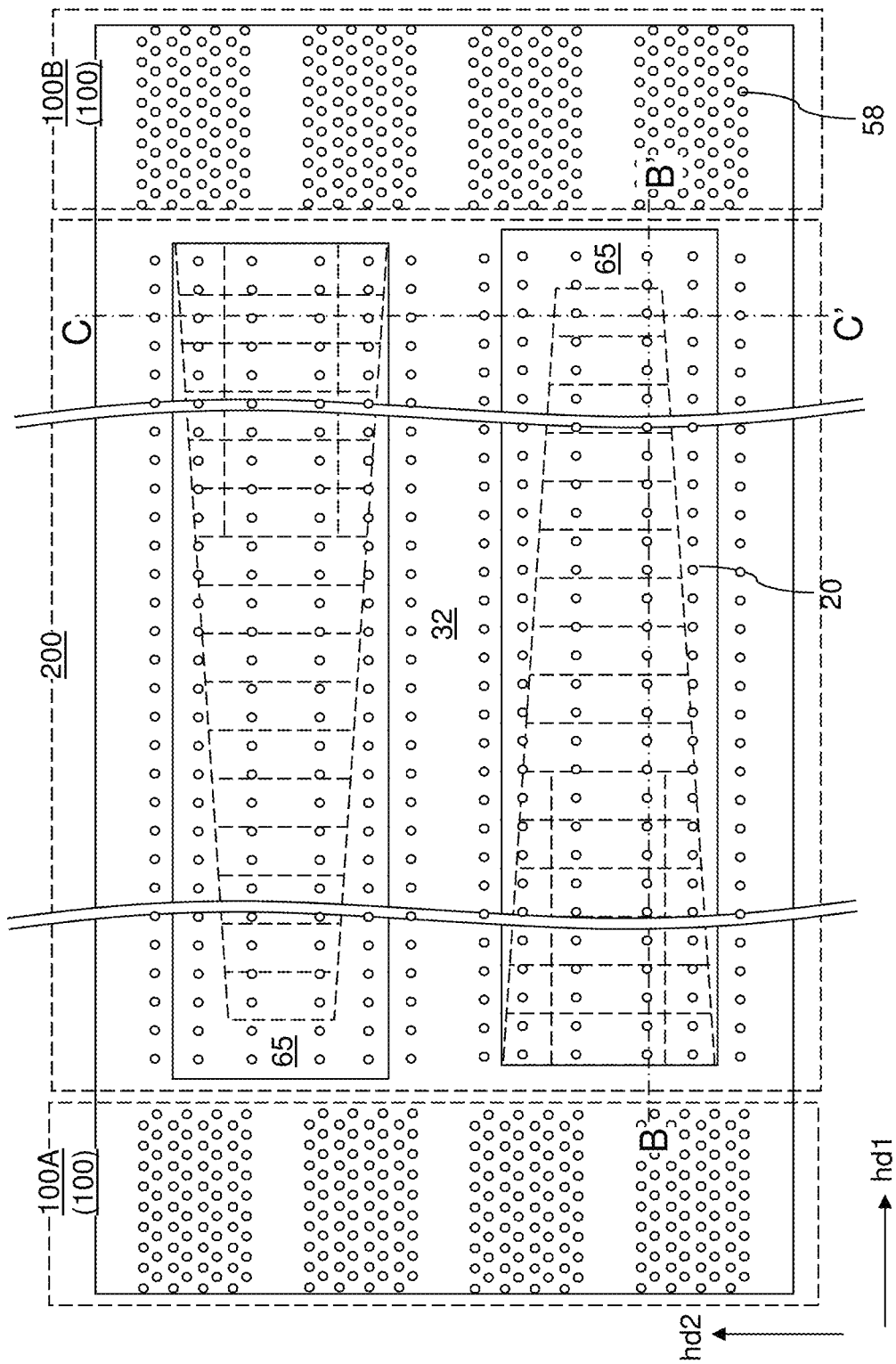
FIG. 17A is a top-down view of the first exemplary structure after formation of memory openings and support openings according to the first embodiment of the present disclosure. The region illustrated in FIG. 17A corresponds to region M1 in FIG. 1.
Figure 17B:
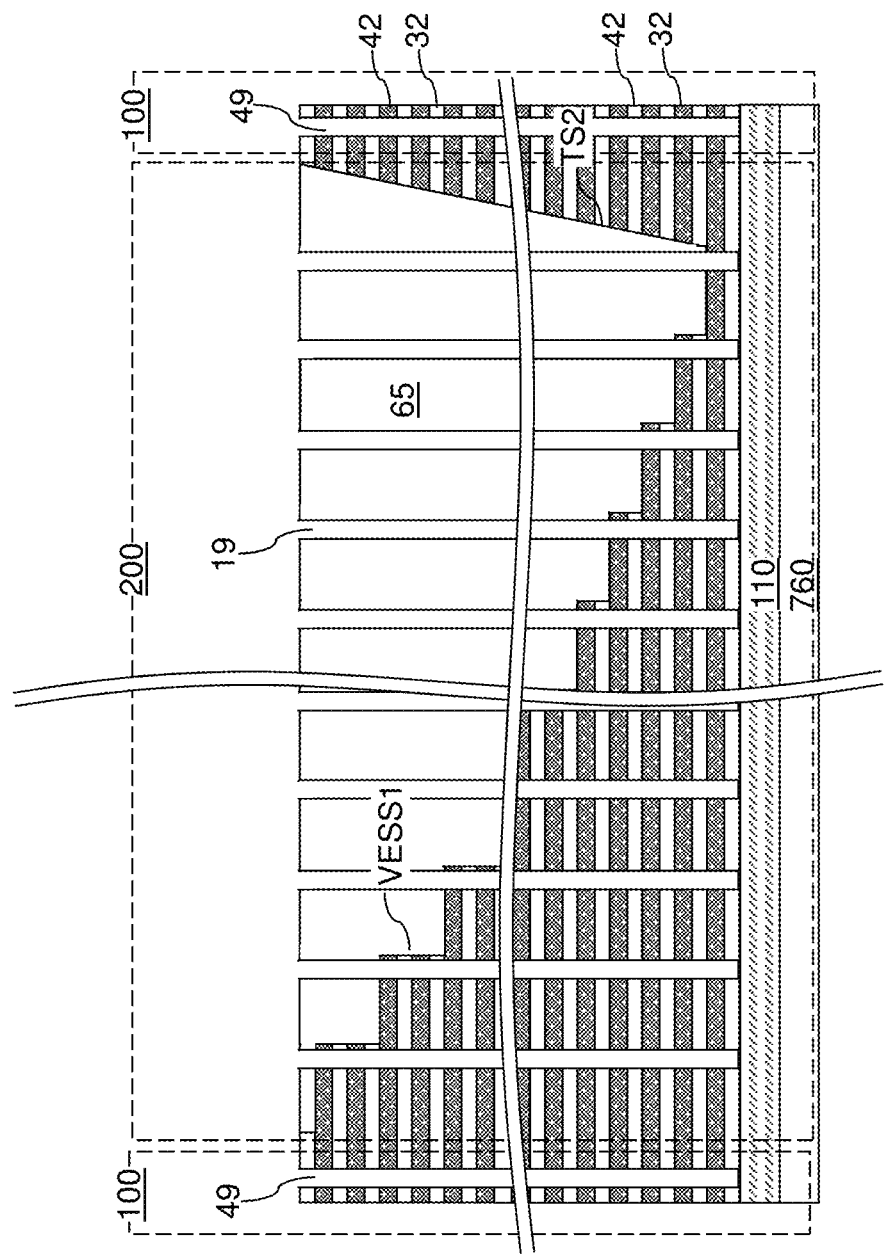
FIG. 17B is a vertical cross-sectional view of the first exemplary structure along the vertical plane B-B' of FIG. 17A.
Figure 17C:
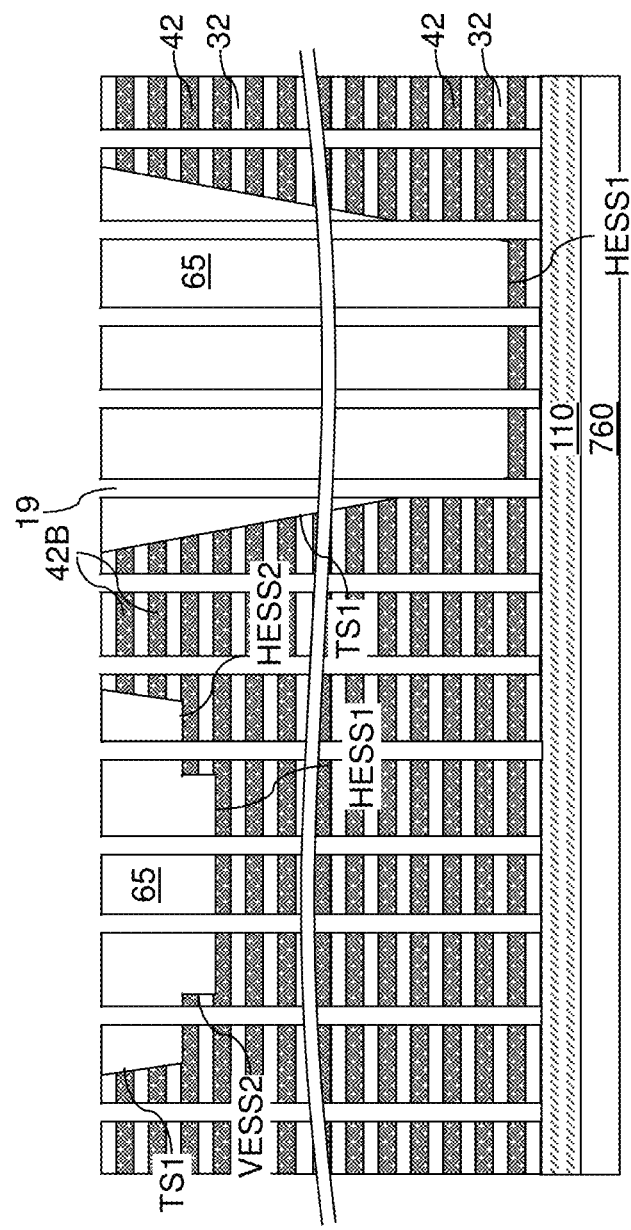
FIG. 17C is a vertical cross-sectional view of the first exemplary structure along the vertical plane C-C' of FIG. 17A.

Referring to FIGS. 17A-17C, a photoresist layer (not shown) can be applied over the vertically alternating sequence (32, 42) and the retro-stepped dielectric material portions 65, and can be lithographically patterned to form arrays of openings therein. The arrays of openings in the photoresist layer include arrays of openings formed in the memory array regions 100 and an additional array of openings formed in each inter-array region 200. An anisotropic etch process can be performed to transfer the pattern of the openings through the vertically alternating sequence (32, 42). An array of memory openings 49 is formed within each memory array region 100 (e.g., 100A and 100B). An array of support openings 19 is formed within each inter-array region 200. Each of the memory openings 49 may be formed through each layer within the vertically alternating sequence (32, 42). A subset of the support openings 19 may be formed through a respective retro-stepped dielectric material portion 65 and a respective subset of layers within the vertically alternating sequence (32, 42). Another subset of the support openings 19 may be formed through each layer within the vertically alternating sequence (32, 42).

Referring to FIG. 18A, a memory opening 49 or a support opening 19 at the processing steps of FIGS. 17A-17C is illustrated.

Referring to FIG. 18B, a stack of layers including a blocking dielectric layer 52, a memory material layer 54, and a dielectric material liner 56 may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 is an optional material layer that may, or may not, be employed. In case the memory material layer 54 comprises a charge storage layer, the dielectric material liner 56 may comprise a tunneling dielectric layer including a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 may include a stack of a silicon oxide layer, a silicon oxynitride layer, and a second silicon oxide layer, which is commonly known as an ONO stack. In one embodiment, the dielectric material liner 56 may include a silicon oxide layer that is substantially free of carbon or a silicon oxynitride layer that is substantially free of carbon. The thickness of the dielectric material liner 56 may be in a range from 2 nm to 20 nm, although lesser and greater thicknesses may also be used.

Referring to FIG. 18C, an anisotropic etch process can be performed to remove horizontally-extending portions of the dielectric material liner 56, the memory material layer 54, and the blocking dielectric layer 52 from above the vertically alternating sequence (32, 42) and from the bottom portion of each of the memory openings 49 and the support openings 19. Optionally, a sacrificial material layer (not shown) may be deposited over the memory film 50 prior to the anisotropic etch process, and may be removed after the anisotropic etch process to protect vertically-extending portions of the memory film 50. A top surface of the at least one semiconductor material layer 110 may be physically exposed at the bottom of each memory opening 49 and at the bottom of each support opening 19. Each contiguous combination of a remaining portion of the blocking dielectric layer 52, a remaining portion of the memory material layer 54, and a remaining portion of the dielectric material liner 56 located in a memory opening 49 or in a support opening 19 constitutes a memory film 50.

Referring to FIG. 18D, a semiconductor channel material layer 60L can be conformally deposited in the memory openings 49 and in the support openings 19. The semiconductor channel material layer 60L may include an undoped semiconductor material, or a doped semiconductor material. The semiconductor channel material layer 60L comprises at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L include dopants of a first conductivity type at an atomic concentration in a range from $1.0 \times 10^{12}/\text{cm}^3$ to $1.0 \times 10^{18}/\text{cm}^3$, such as from $1.0 \times 10^{14}/\text{cm}^3$ to $1.0 \times 10^{17}/\text{cm}^3$. The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 18E, in case the memory openings 49 and/or the support openings 19 are not completely filled by the semiconductor channel material layer 60L, a dielectric core layer may be deposited in unfilled volumes of the memory openings 49 and/or the support openings 19. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the topmost surface of the vertically-alternating sequence (32, 42) may be removed, for example, by a recess etch. The recess etch continues until top surfaces of the remaining portions of the dielectric core layer are recessed to a height between the top and bottom surfaces of the topmost insulating layer 32. Each remaining portion of the dielectric core layer constitutes a dielectric core 62.

Referring to FIG. 18F, a doped semiconductor material having a doping of a second conductivity type may be deposited in cavities overlying the dielectric cores 62. The second conductivity type is the opposite of the conductivity type. For example, if the conductivity type is p-type, the second conductivity type is n-type, and vice versa. Portions of the deposited doped semiconductor material, the semiconductor channel material layer 60L, the dielectric material liner 56, the memory material layer 54, and the blocking dielectric layer 52 that overlie the horizontal plane including the top surface of the top insulating layer 32 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/\text{cm}^3$ to $2.0 \times 10^{21}/\text{cm}^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A dielectric material liner 56 is surrounded by a memory material layer 54, and laterally surrounds a vertical semiconductor channel 60. Each adjoining set of a blocking dielectric layer 52, a memory material layer 54, and a dielectric material liner 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a dielectric material liner 56, a plurality of memory elements comprising portions of the memory material layer 54, and an optional blocking dielectric layer 52. The memory stack structures 55 can be formed through memory array regions 100 of the and second vertically alternating sequences in which all layers of the and second vertically alternating sequences are present. Each combination of a memory stack structure 55, a dielectric core 62, and a drain region 63 within the memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Figure 19A:
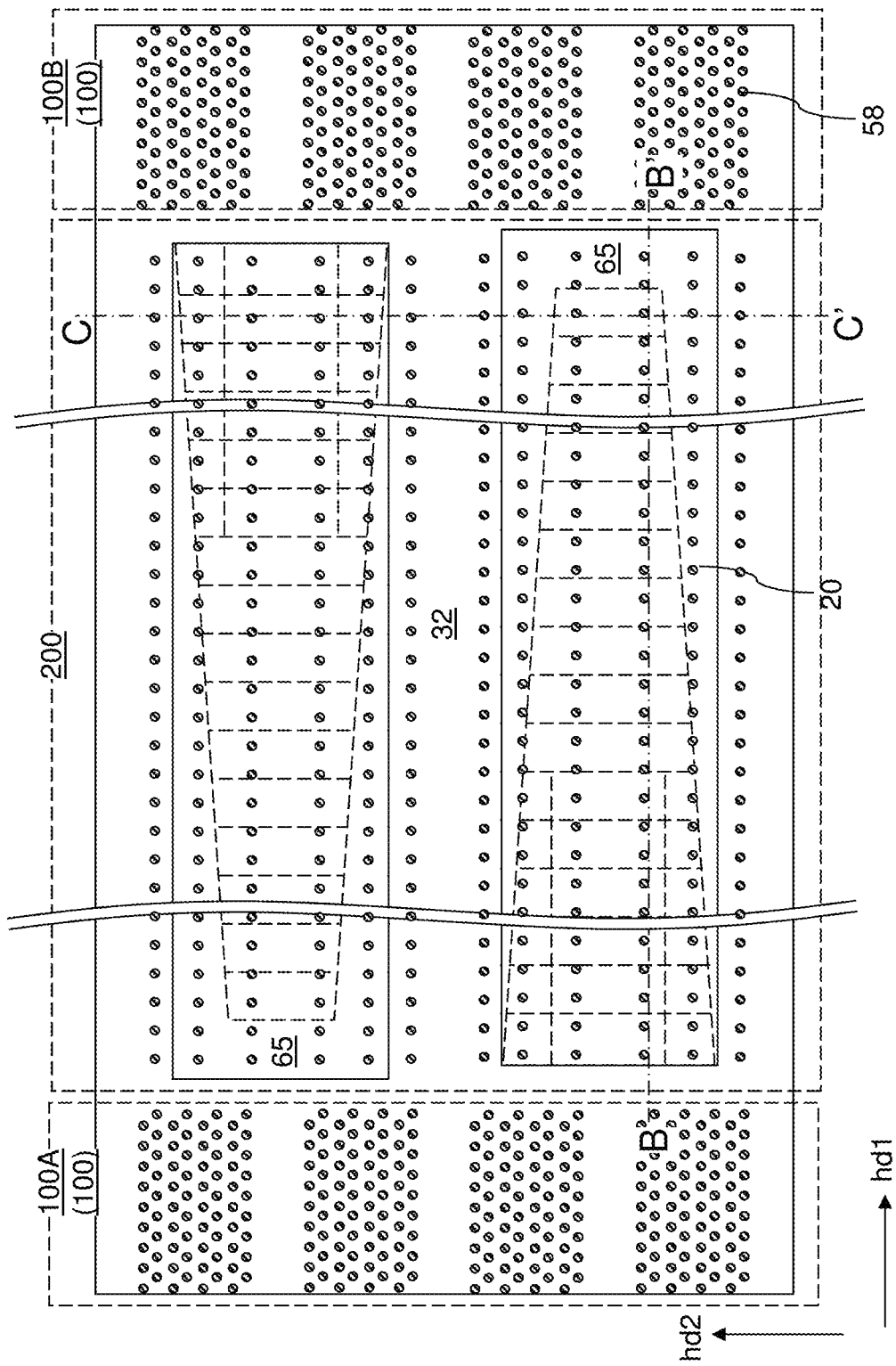
FIG. 19A is a top-down view of the first exemplary structure after formation of memory openings and support openings according to the first embodiment of the present disclosure. The region illustrated in FIG. 19A corresponds to region M1 in FIG. 1.
Figure 19C:
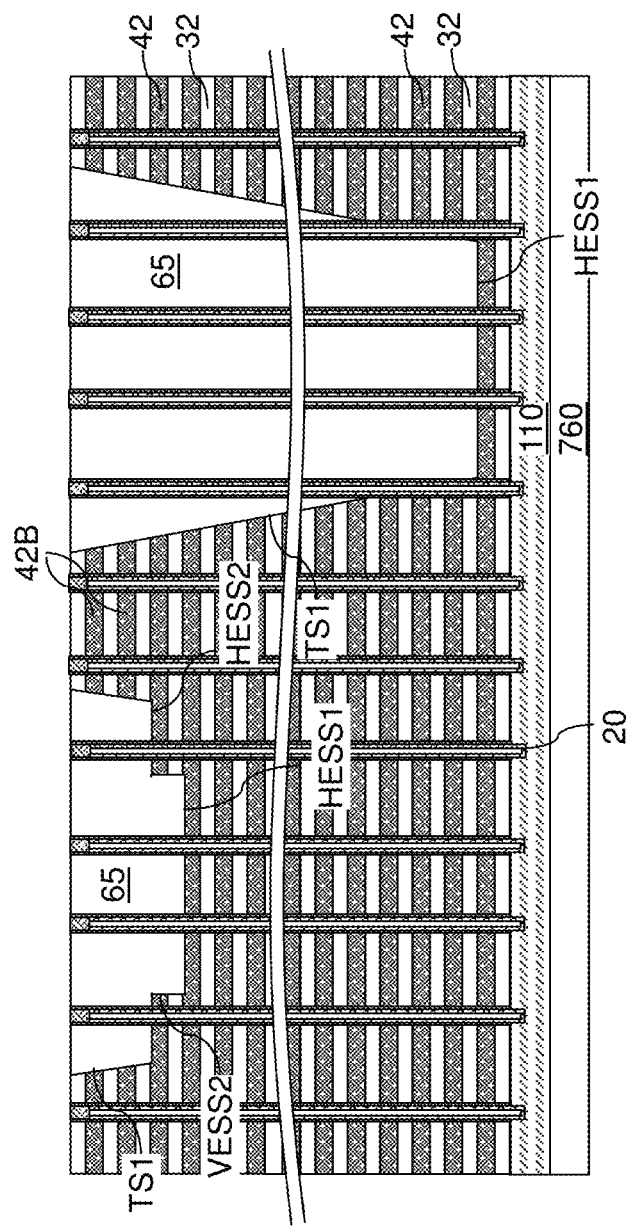
FIG. 19C is a vertical cross-sectional view of the first exemplary structure along the vertical plane C-C' of FIG. 19A.

Referring to FIGS. 19A-19C, the first exemplary structure is illustrated after formation of memory opening fill structure 58 and support pillar structures 20. Each support opening 19 can be filled with a respective set of material portions having the same material composition as a corresponding component in a memory opening fill structure 58. Alternatively, the support openings 19 may be filled entirely with an insulating material instead. Each set of material portions filling a support opening 19 is herein referred to as a support pillar structure 20. Generally, the support pillar structures 20 are formed in the inter-array region 200. Each of the memory opening fill structures 58 comprises a respective vertical semiconductor channel 60 and a respective vertical stack of memory elements, which may comprise portions of a respective memory material layer 54 that are located at levels of the sacrificial material layers 42.

Figure 20A:
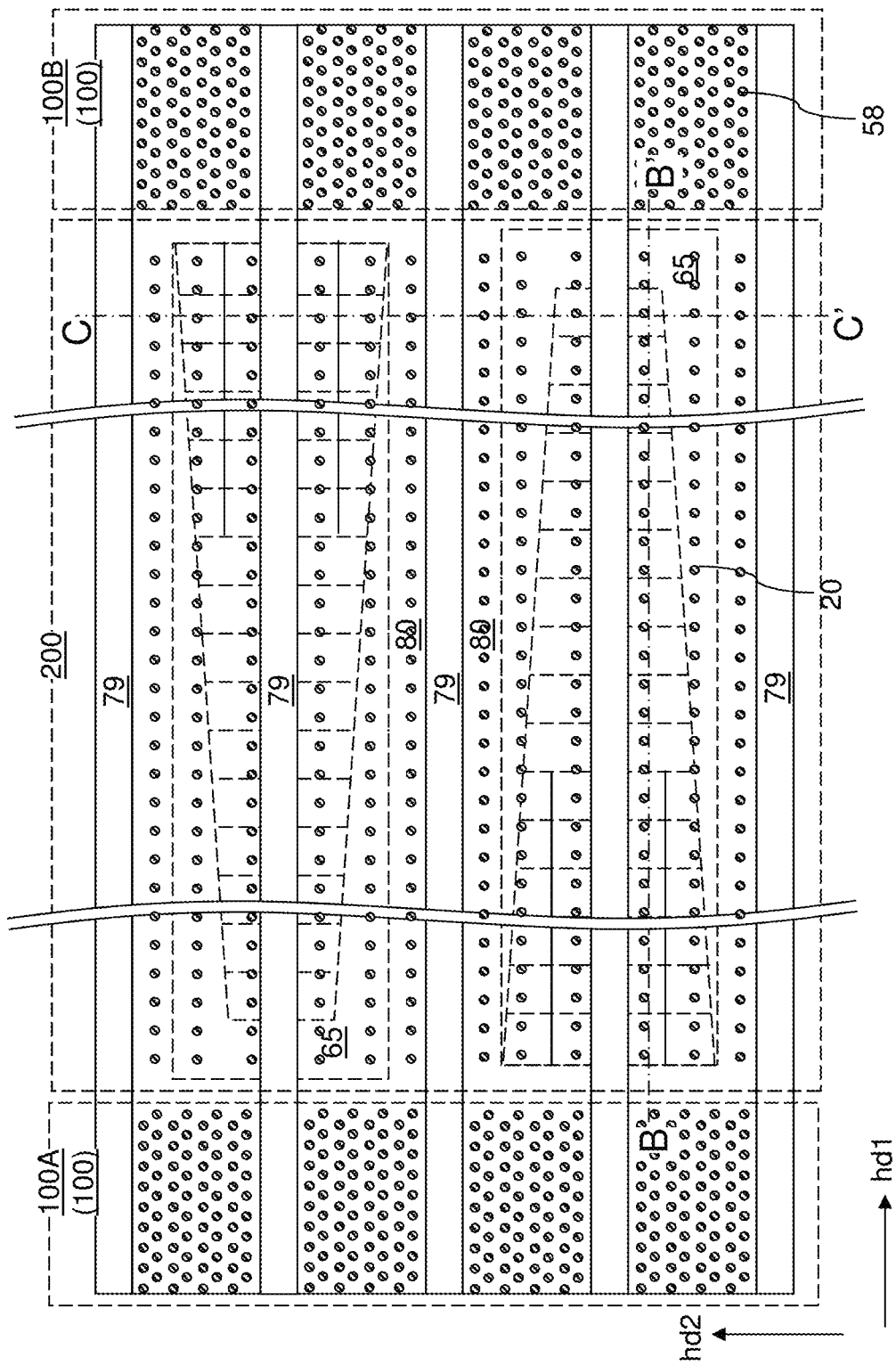
FIG. 20A is a top-down view of the first exemplary structure after formation of a contact-level dielectric layer and backside trenches according to the first embodiment of the present disclosure. The region illustrated in FIG. 20A corresponds to region M1 in FIG. 1.
Figure 20B:
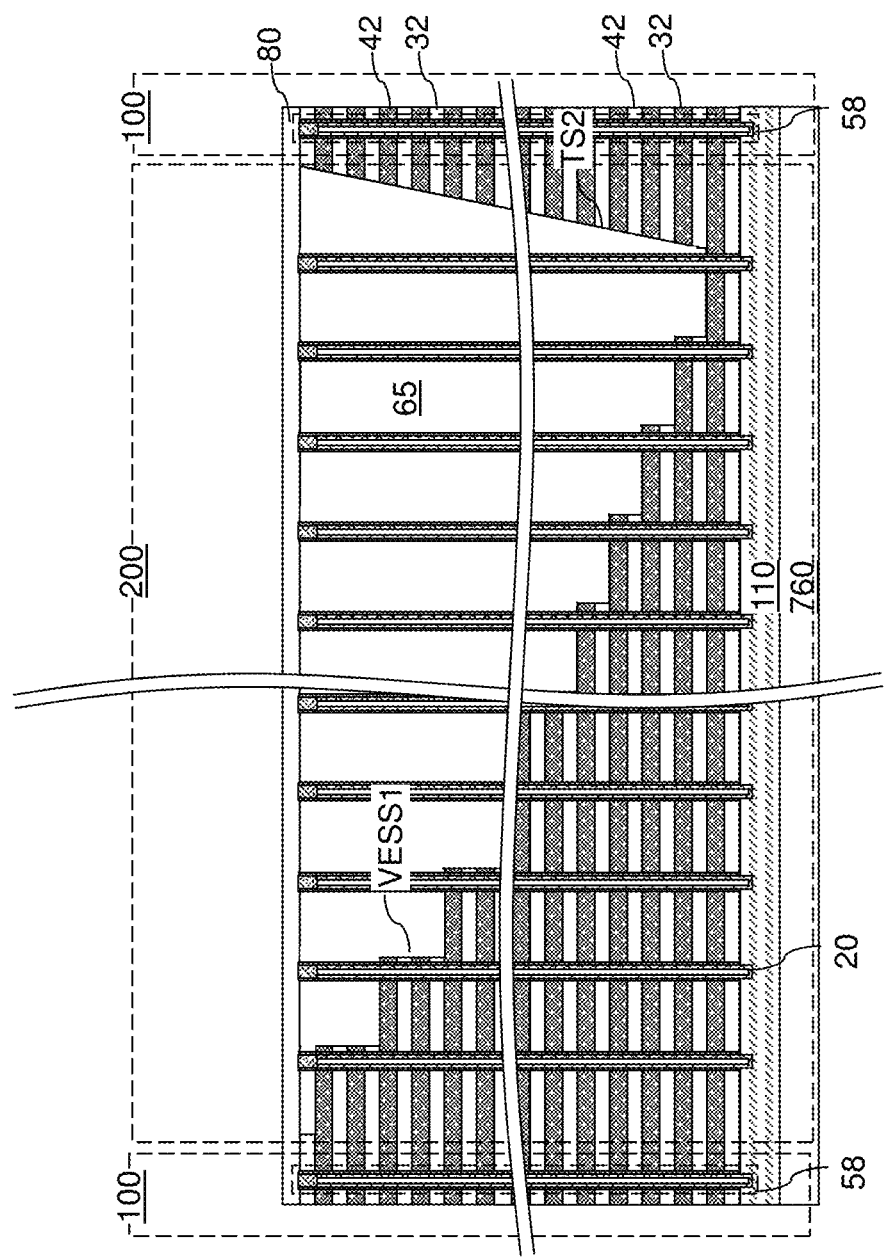
FIG. 20B is a vertical cross-sectional view of the first exemplary structure along the vertical plane B-B' of FIG. 20A.
Figure 20C:
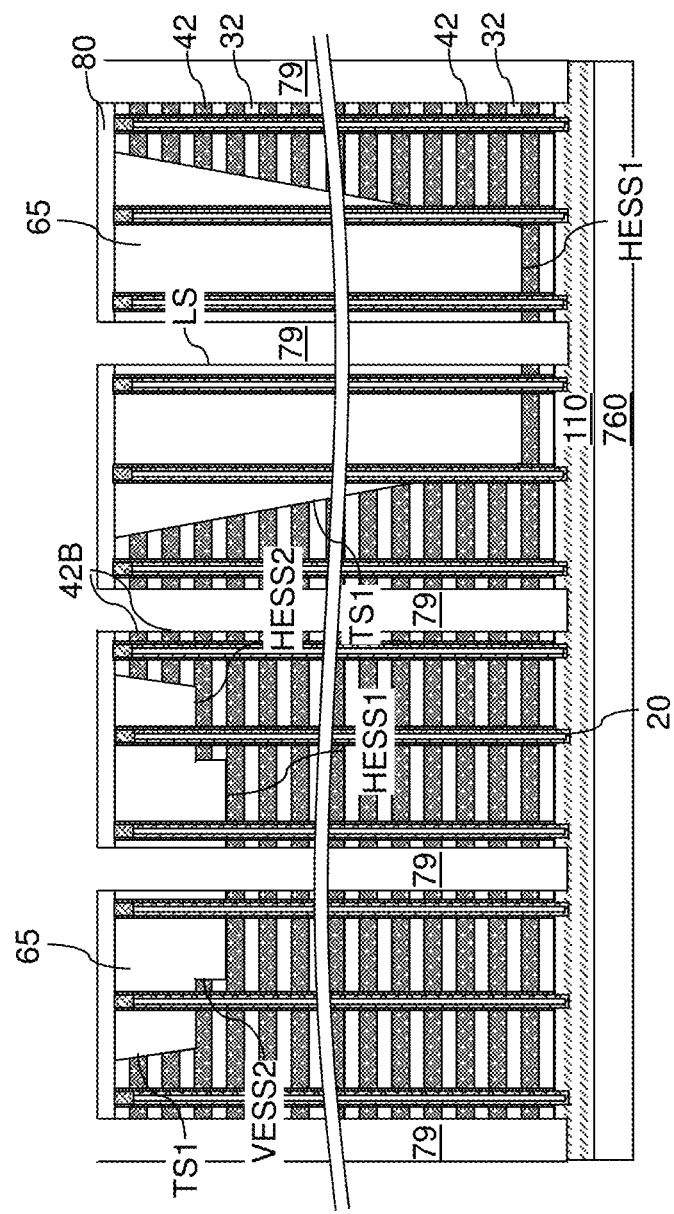
FIG. 20C is a vertical cross-sectional view of the first exemplary structure along the vertical plane C-C' of FIG. 20A.

Referring to FIGS. 20A-20C, a contact-level dielectric layer 80 may be formed over the vertically alternating sequence (32, 42). The contact-level dielectric layer 80 includes a dielectric material such as silicon oxide, and may be formed by a conformal or non-conformal deposition process. For example, the contact-level dielectric layer 80 may include undoped silicate glass and may have a thickness in a range from 100 nm to 600 nm, although lesser and greater thicknesses may also be used.

A photoresist layer (not shown) may be applied over the contact-level dielectric layer 80, and may be lithographically patterned to form linear openings laterally extending along the horizontal direction hd1 and laterally spaced apart along the second horizontal direction hd2. The linear openings in the photoresist layer can be formed within areas in which neither the memory opening fill structures 58 nor the support pillar structures 20 are present. In one embodiment, the pattern of the linear openings in the photoresist layer may be selected such that each of the retro-stepped dielectric material portions 65 underlies a respective linear opening in the photoresist layer.

Backside trenches 79 be formed by transferring the pattern in the photoresist layer (not shown) through the contact-level dielectric layer 80, the vertically alternating sequence (32, 42), and the retro-stepped dielectric material portions 65, and into the at least one semiconductor material layer 110. Portions of the contact-level dielectric layer 80, the vertically alternating sequence (32, 42), the retro-stepped dielectric material portions 65, and the semiconductor material layer 110 that underlie the linear openings in the photoresist layer may be removed by an anisotropic etch process to form the backside trenches 79. In one embodiment, the backside trenches 79 may be formed between arrays of memory opening fill structures 58 that are laterally spaced apart along the second horizontal direction hd2.

Each vertically alternating sequence (32, 42) of insulating layers 32 and spacer material layers (such as sacrificial material layers 42) is divided into a plurality of alternating stacks of insulating layers 32 (as divided and having a lesser lateral extent along the second horizontal direction hd2) and spacer material layers (such as the sacrificial material layers 42, as divided and having a lesser lateral extent along the second horizontal direction hd2) by the backside trenches 79. Each backside trench 79 can laterally extend along the first horizontal direction hd1 through am inter-array region 200 and a pair of memory array regions 100 that are adjoined to inter-array region 200. Each retro-stepped dielectric material portion 65 may be divided into two disjoined retro-stepped dielectric material portions 65 by a respective backside trench 79.

Generally, the backside trenches 79 laterally extending along the first horizontal direction hd1 can be formed through the vertically alternating sequence. The vertically alternating sequence (32, 42) is divided into multiple alternating stacks (32, 42) of respective patterned portions of the insulating layers 32 and respective patterned portions of the spacer material layers (such as respective patterned portions of the sacrificial material layers 42). Each retro-stepped dielectric material portion 65 may be divided into two retro-stepped dielectric material portions 65 by a respective one of the trenches.

In embodiments in which second vertically-extending surface segments VESS2 are formed, a first plurality of second vertically-extending surface segments VESS2 within a first subset of the second vertically-extending surface segments VESS2 is laterally offset from one of the backside trenches 79 by a same lateral spacing.

In one embodiment, a second vertically-extending surface segment VESS2 laterally extends continuously along the first horizontal direction hd1, is adjoined to a first subset of the first vertically-extending surface segments VESS1 that are more proximal to a backside trench 79 than the second vertically-extending surface segment VESS2, and is adjoined to a second subset of the first vertically-extending surface segments VESS1 that are more distal from the backside trench 79 than the second vertically-extending surface segment VESS2.

In one embodiment, each first vertically-extending surface segment VESS1 within a first subset of the first vertically-extending surface segments VESS1 may be adjoined to a sidewall of a respective backside trench 79. In one embodiment shown in FIG. 20C, each retro-stepped dielectric material portion 65, after formation of the backside trenches 79, may comprise a lengthwise sidewall LS that is physically exposed to a respective backside trench 79 and adjoined to an edge of a respective second tapered sidewall TS2.

Figure 21A:
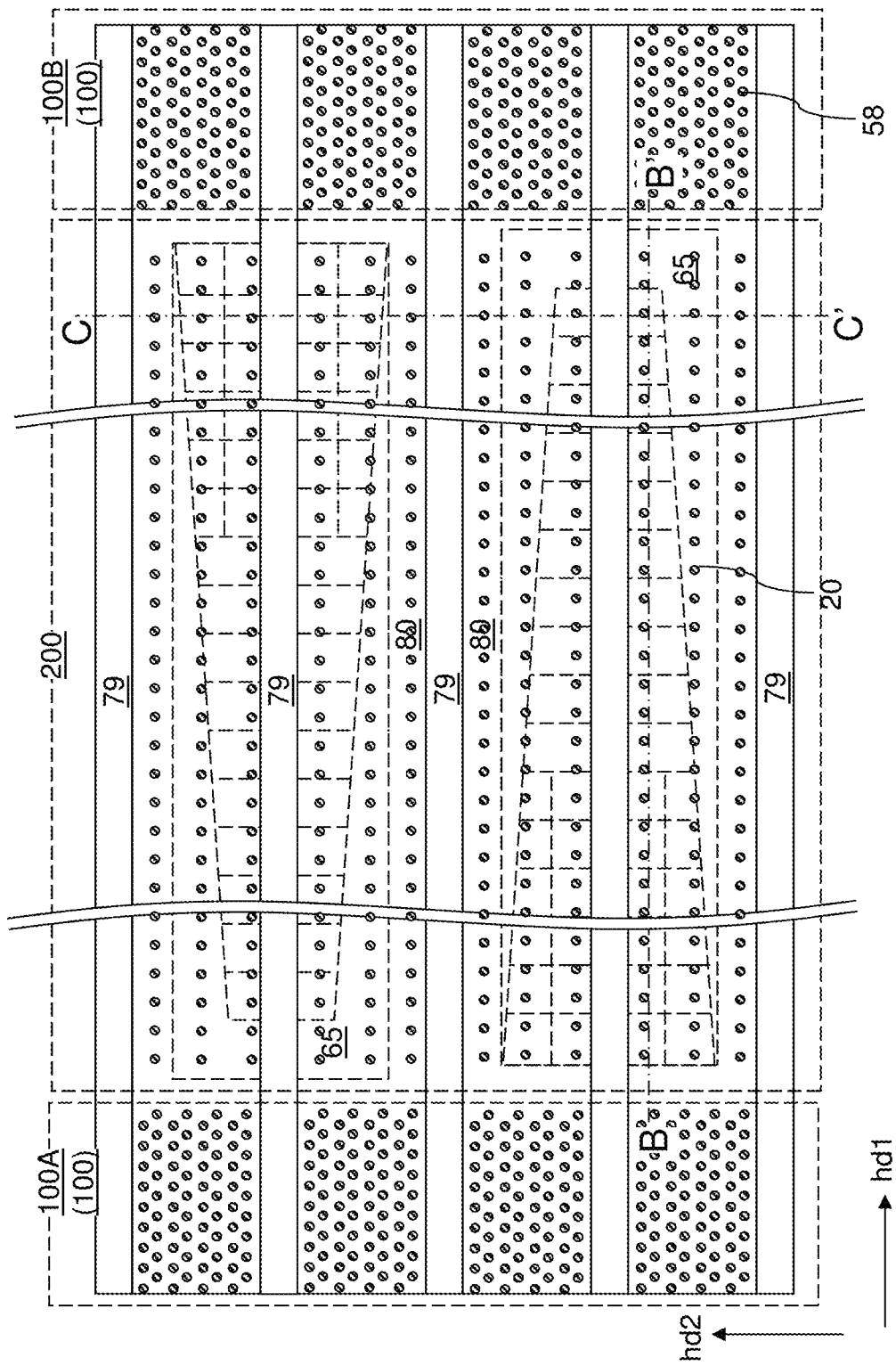
FIG. 21A is a top-down view of the first exemplary structure after formation of backside recesses according to the first embodiment of the present disclosure. The region illustrated in FIG. 21A corresponds to region M1 in FIG. 1.
Figure 21B:
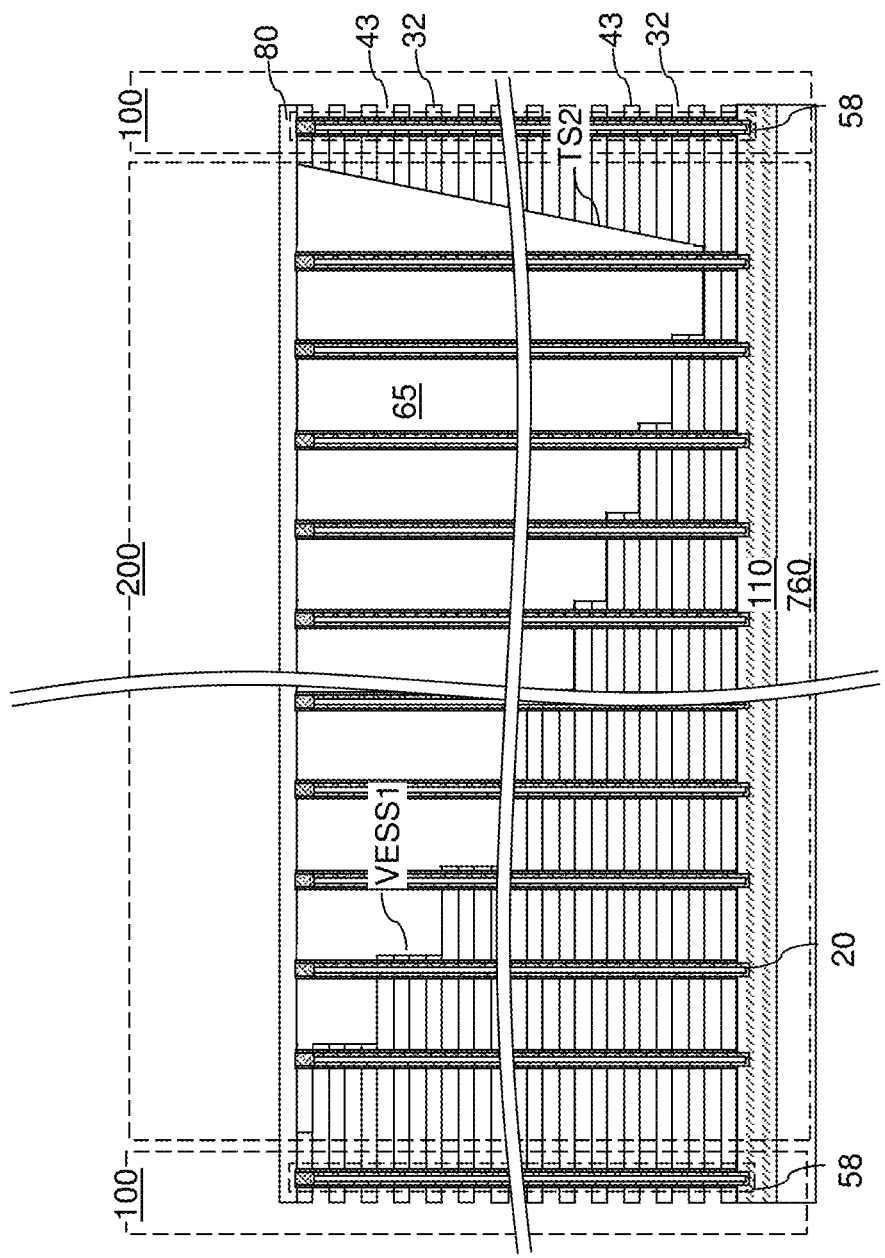
FIG. 21B is a vertical cross-sectional view of the first exemplary structure along the vertical plane B-B' of FIG. 21A.
Figure 21C:
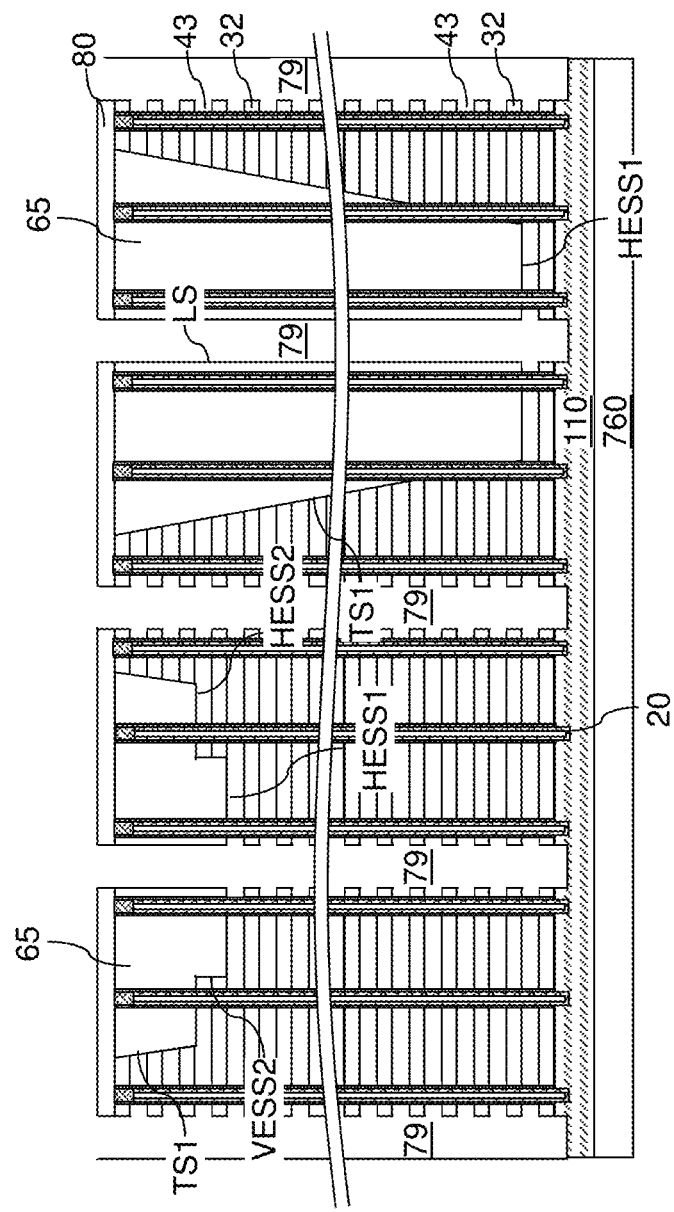
FIG. 21C is a vertical cross-sectional view of the first exemplary structure along the vertical plane C-C' of FIG. 21A.

Referring to FIGS. 21A-21C, if the spacer material layers comprise sacrificial material layers 42, then the sacrificial material layers 42 can be removed selective to the insulating layers 32, the contact-level dielectric layer 80, and the at least one semiconductor material layer 110. For example, an etchant that selectively etches the materials of the sacrificial material layers 42 with respect to the materials of the insulating layers 32, the retro-stepped dielectric material portions 65, and the material of the outermost layer of the memory films 50 may be introduced into the backside trenches 79, for example, using an isotropic etch process.

The isotropic etch process may be a wet etch process using a wet etch solution, or may be a gas phase (dry) etch process in which the etchant is introduced in a vapor phase into the backside trench 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses 43 are formed in volumes from which the sacrificial material layers 42 are removed. The backside recesses 43 are formed in volumes from which the sacrificial material layers 42 are removed. Each of the backside recesses 43 may be a laterally extending cavity having a lateral dimension that is greater than the vertical extent of the cavity. In other words, the lateral dimension of each of the backside recesses 43 may be greater than the height of the respective backside recess 43. A plurality of backside recesses 43 may be formed in the volumes from which the material of the sacrificial material layers 42 is removed. Each of the backside recesses 43 may extend substantially parallel to the top surface of the at least one semiconductor material layer 110. A backside recess 43 may be vertically bounded by a top surface of an underlying insulating layer 32 and a bottom surface of an overlying insulating layer 32. In one embodiment, each of the backside recesses 43 may have a uniform height throughout.

Figure 22A:
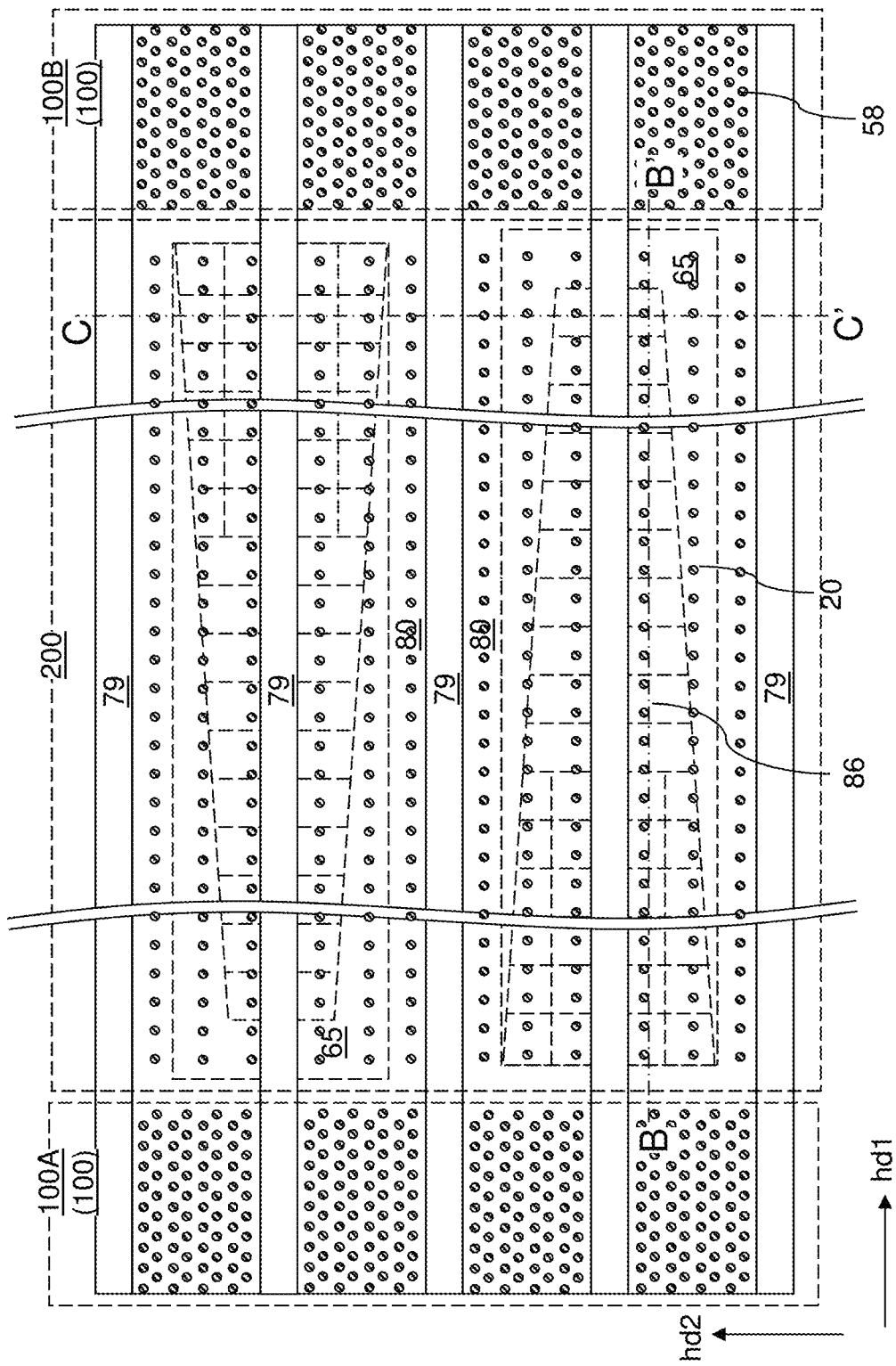
FIG. 22A is a top-down view of the first exemplary structure after formation of electrically conductive layers according to the first embodiment of the present disclosure. The region illustrated in FIG. 22A corresponds to region M1 in FIG. 1.
Figure 22B:
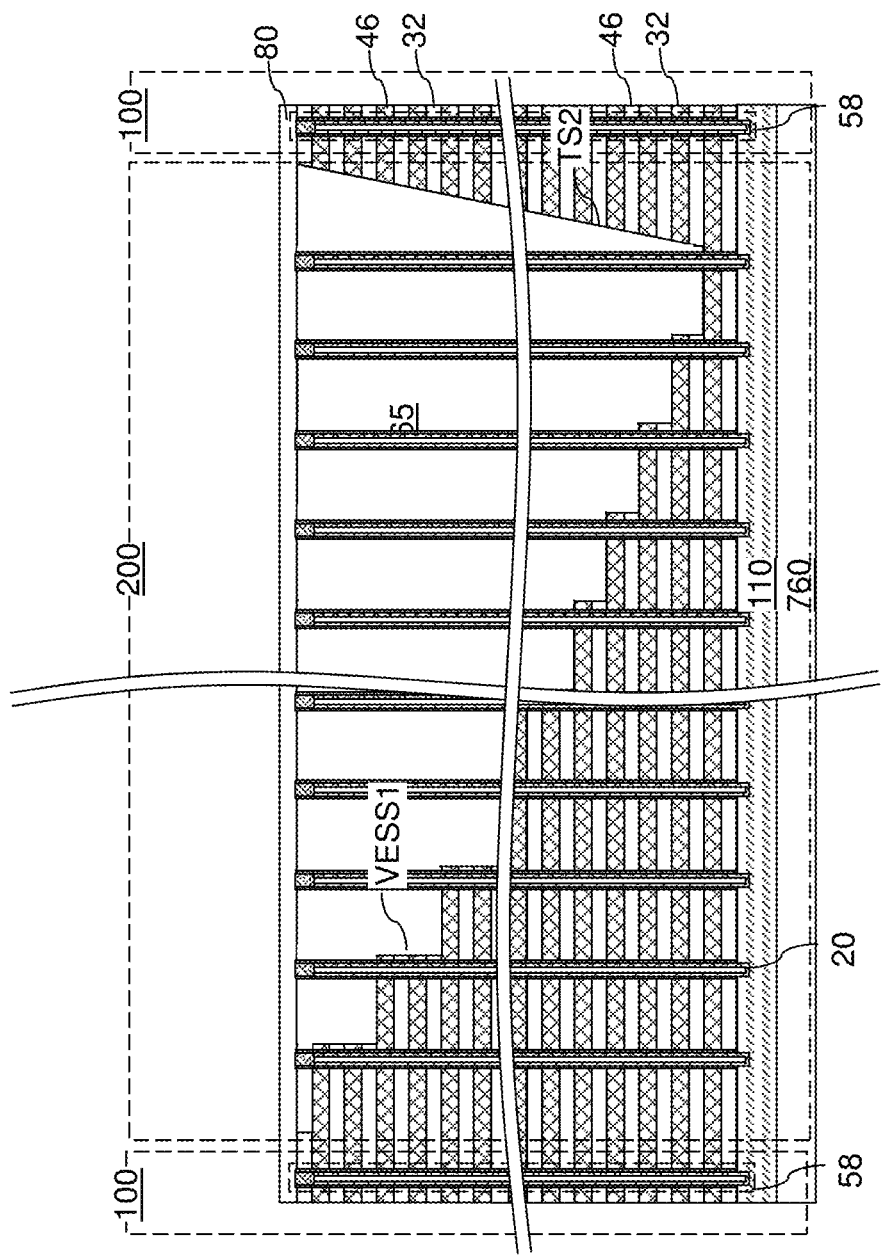
FIG. 22B is a vertical cross-sectional view of the first exemplary structure along the vertical plane B-B' of FIG. 22A.
Figure 22C:
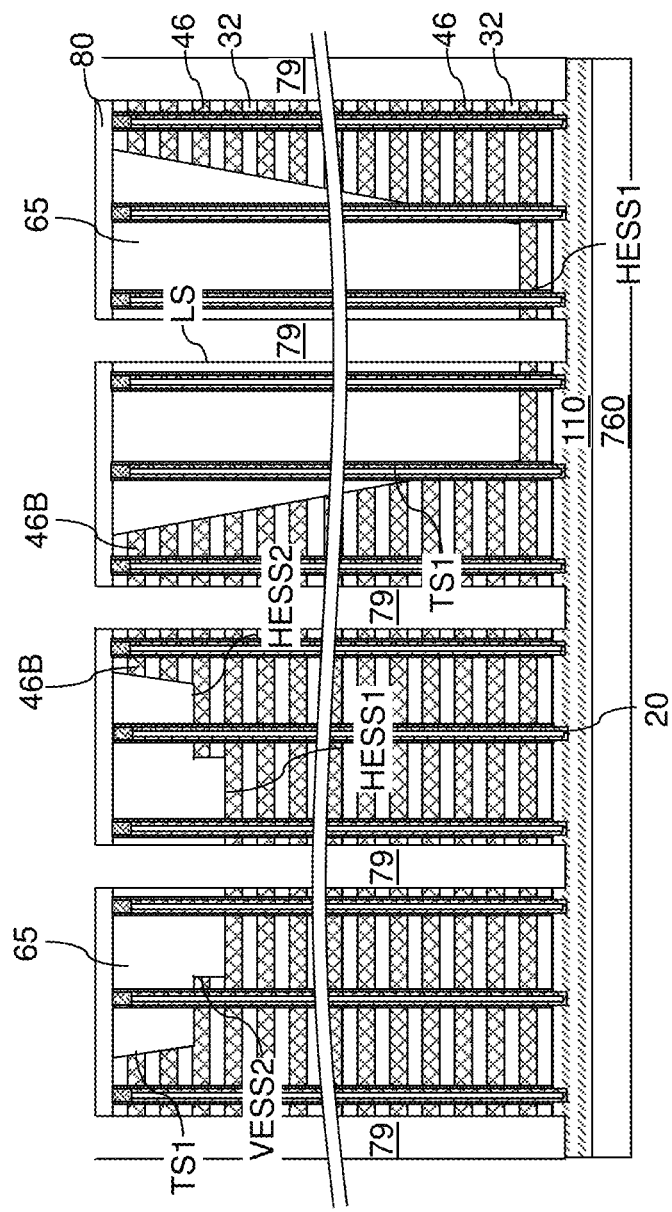
FIG. 22C is a vertical cross-sectional view of the first exemplary structure along the vertical plane C-C' of FIG. 22A.

Referring to FIGS. 22A-22C, an optional backside blocking dielectric layer (not shown) may be optionally deposited in the backside recesses and the backside trenches 79 and over the contact-level dielectric layer 80. The backside blocking dielectric layer includes a dielectric material such as a dielectric metal oxide (e.g., aluminum oxide), silicon oxide, or a combination thereof.

At least one conductive material may be deposited in the plurality of backside recesses, on the sidewalls of the backside trenches 79, and over the contact-level dielectric layer 80. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy, such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses include tungsten, tungsten nitride, titanium, titanium nitride, tantalum, tantalum nitride, cobalt, and/or ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers 46 may be formed in the backside recesses 43 by deposition of the at least one conductive material. A plurality of electrically conductive layers 46 may be formed in the plurality of backside recesses 43, and a continuous metallic material layer (not shown) may be formed on the sidewalls of each backside trench 79 and over the contact-level dielectric layer 80. Each of the electrically conductive layers may include a respective conductive metallic nitride liner and a respective conductive fill material. Thus, the and second sacrificial material layers 42 may be replaced with the electrically conductive layers 46. Specifically, each sacrificial material layer 42 may be replaced with an optional portion of the backside blocking dielectric layer and an electrically conductive layer 46. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 80, for example, by an anisotropic or isotropic etch. Each remaining portion of the deposited metallic material in the backside recesses constitutes an electrically conductive layer 46. Sidewalls of the electrically conductive material layers 46 may be physically exposed to a respective backside trench 79.

Each electrically conductive layer 46 may be a conductive sheet including openings therein. A subset of the openings through each electrically conductive layer 46 may be filled with memory opening fill structures 58. A second subset of the openings through each electrically conductive layer 46 may be filled with the support pillar structures 20. A subset of the electrically conductive layers 46 may comprise word lines for the memory elements. The underlying semiconductor devices 720 may comprise word line switch devices configured to control a bias voltage to respective word lines, and/or bit line driver devices, such as sense amplifiers.

Figure 23A:
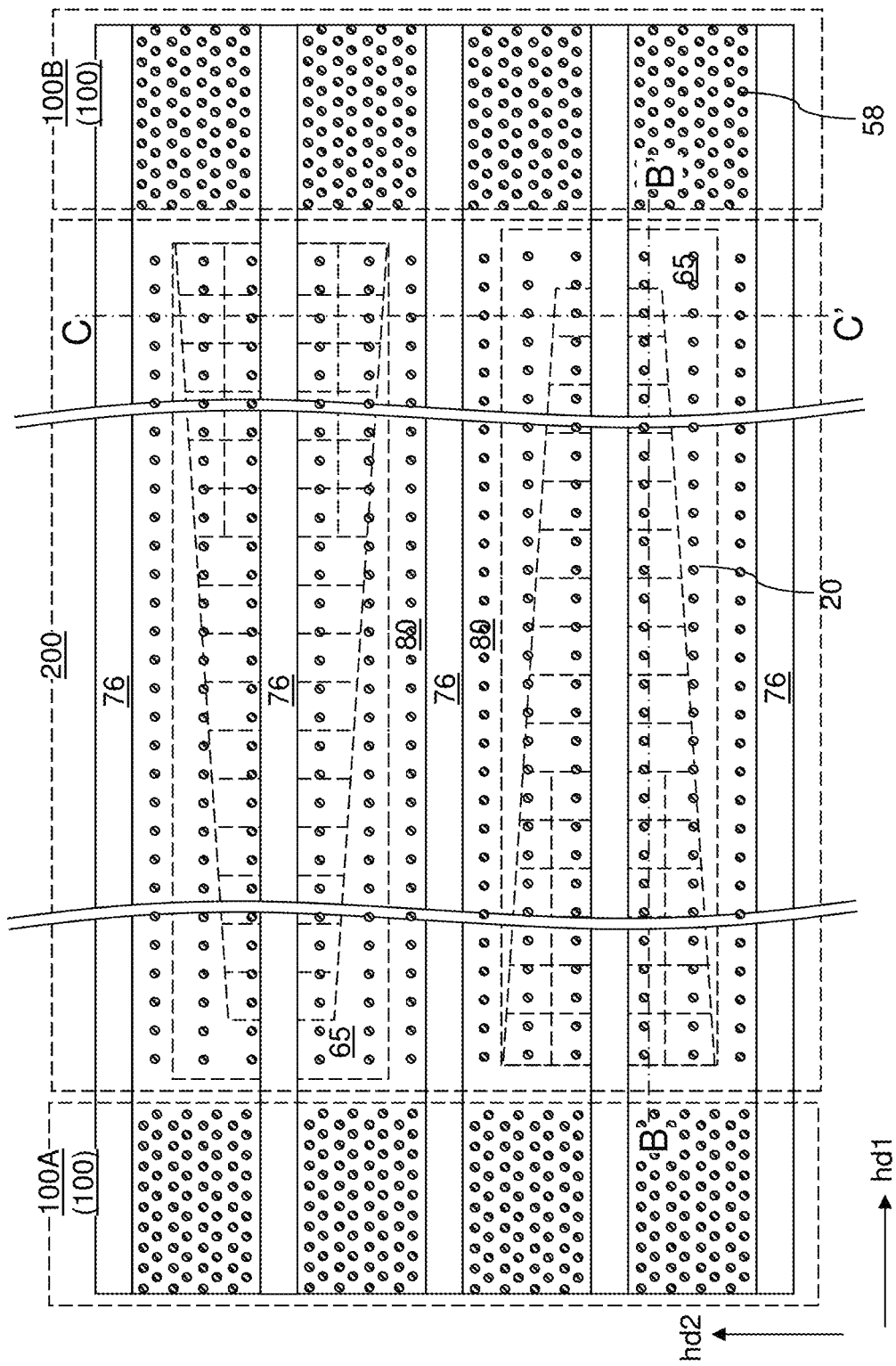
FIG. 23A is a top-down view of the first exemplary structure after formation of backside trench fill structures according to the first embodiment of the present disclosure. The region illustrated in FIG. 23A corresponds to region M1 in FIG. 1.
Figure 23B:
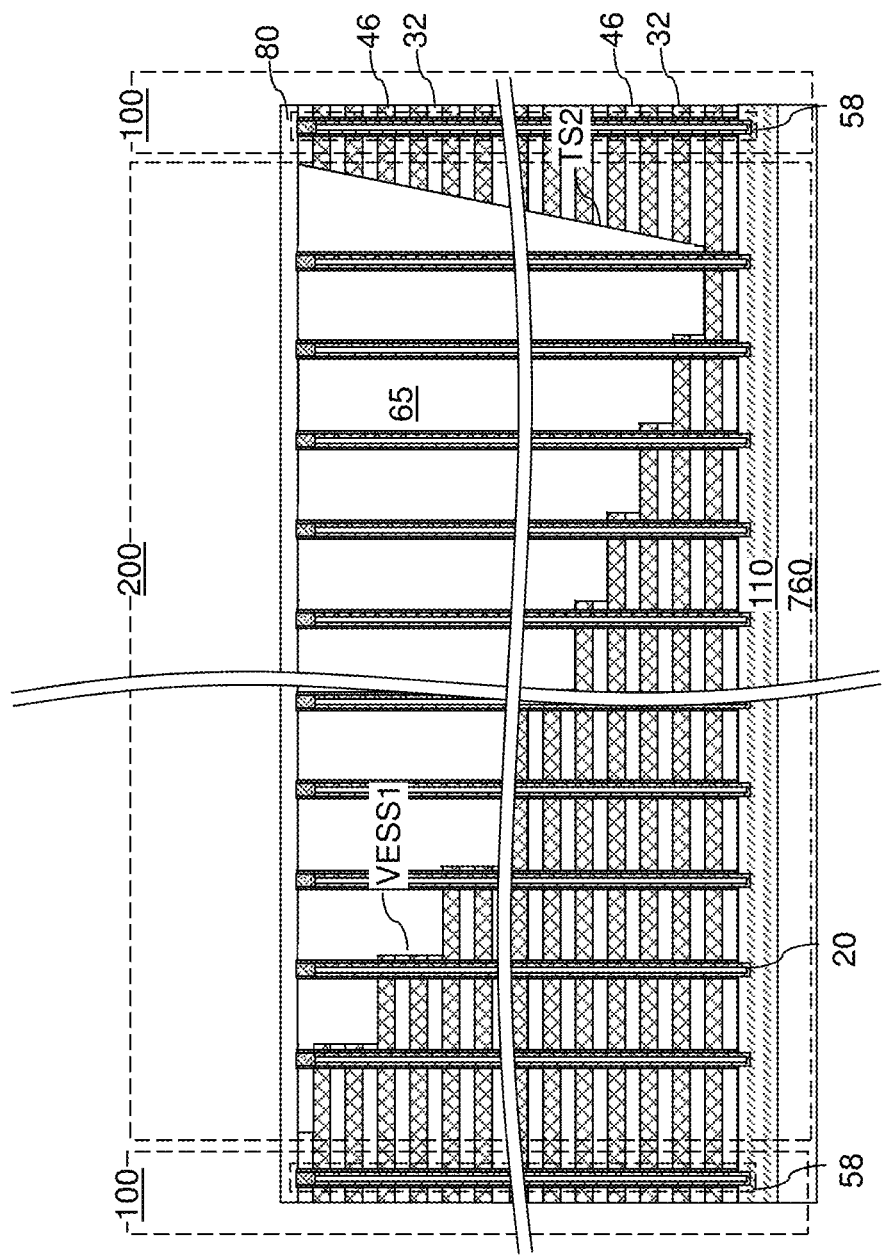
FIG. 23B is a vertical cross-sectional view of the first exemplary structure along the vertical plane B-B' of FIG. 23A.
Figure 23C:
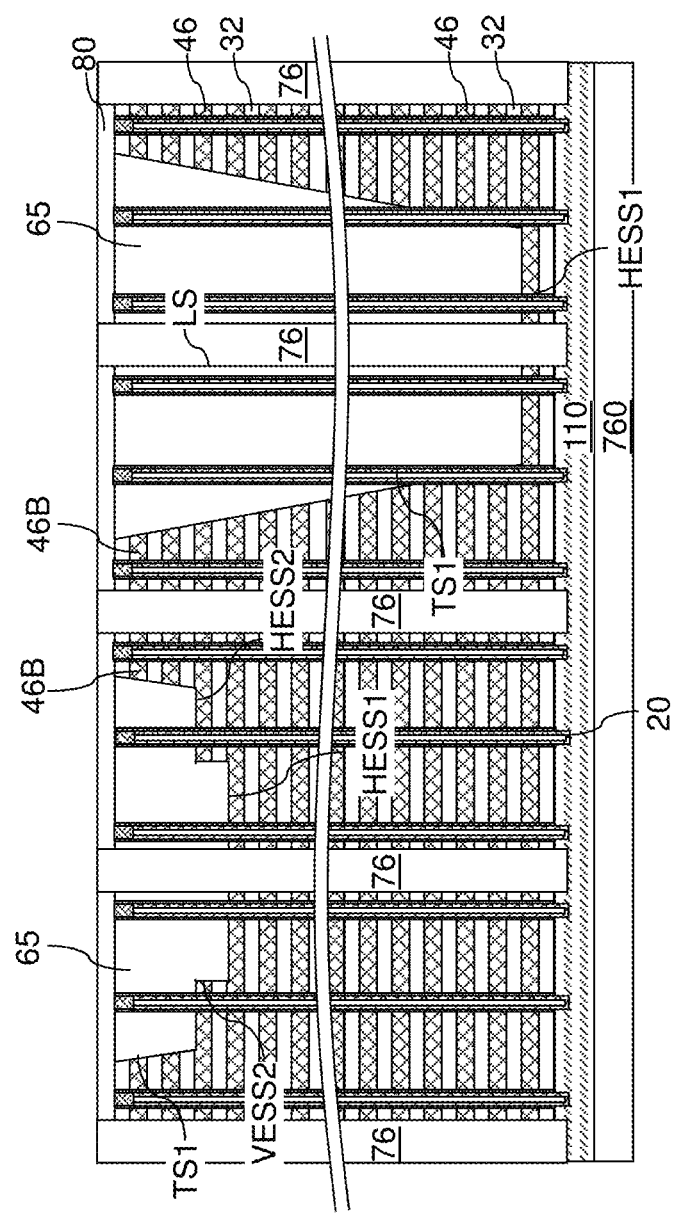
FIG. 23C is a vertical cross-sectional view of the first exemplary structure along the vertical plane C-C' of FIG. 23A.

Referring to FIGS. 23A-23C, a backside trench fill structure 76 can be formed in each backside trench 79. In one embodiment, the backside trench fill structures 76 may be formed by depositing a dielectric fill material and removing excess portions of the dielectric fill material from above the horizontal plane including the top surface of the contact-level dielectric layer 80. Each remaining portion of the dielectric fill material constitutes a backside trench fill structure 76.

Alternatively, source regions (not shown) can be formed underneath the backside trenches 79 by implanting dopants of the second conductivity type. A dielectric spacer (not expressly shown) can be formed at a periphery of each backside trench 79 by conformally depositing a dielectric material layer and anisotropically etching the dielectric material layer. At least one conductive material can be deposited in remaining unfilled volumes of the backside trenches 79, and excess portions of the at least one conductive fill material may be removed from above the horizontal plane including the top surface of the contact-level dielectric layer 80. Each remaining portion of the at least one conductive material constitutes a backside contact via structure. In this case, each contiguous combination of a backside contact via structure and a dielectric spacer constitutes a backside trench fill structure.

Figure 24A:
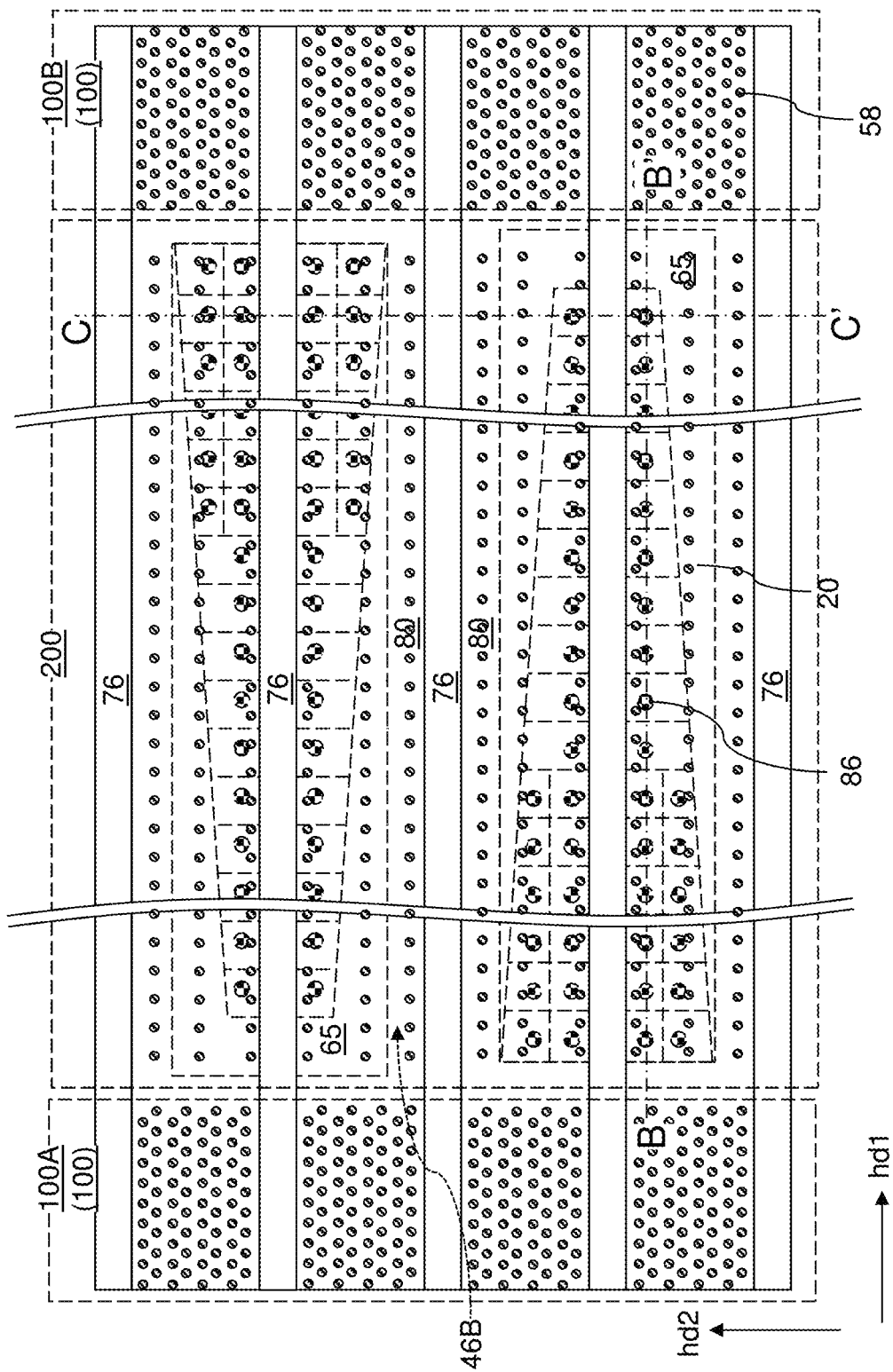
FIG. 24A is a top-down view of the first exemplary structure after formation of layer contact via structures according to the first embodiment of the present disclosure. The region illustrated in FIG. 24A corresponds to region M1 in FIG. 1.
Figure 24B:
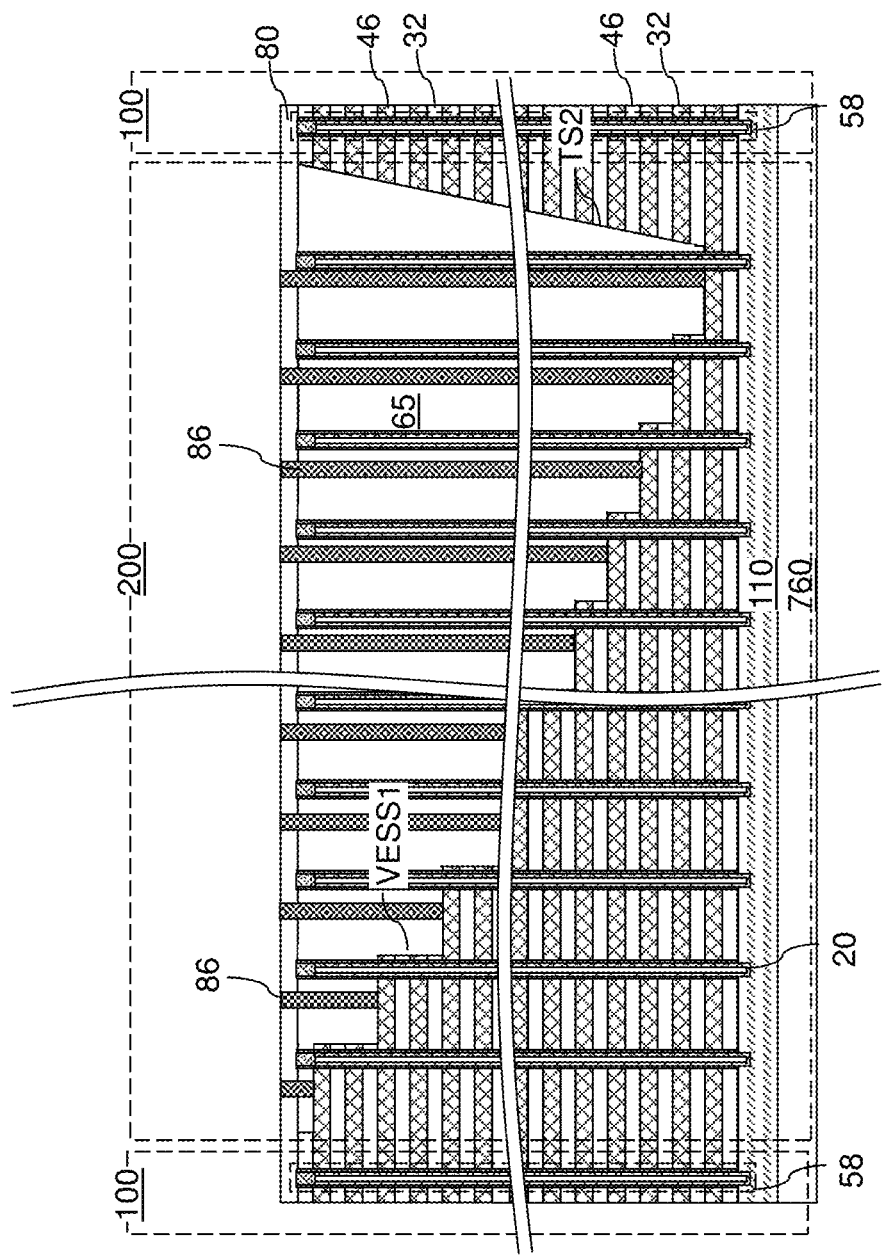
FIG. 24B is a vertical cross-sectional view of the first exemplary structure along the vertical plane B-B' of FIG. 24A.
Figure 24C:
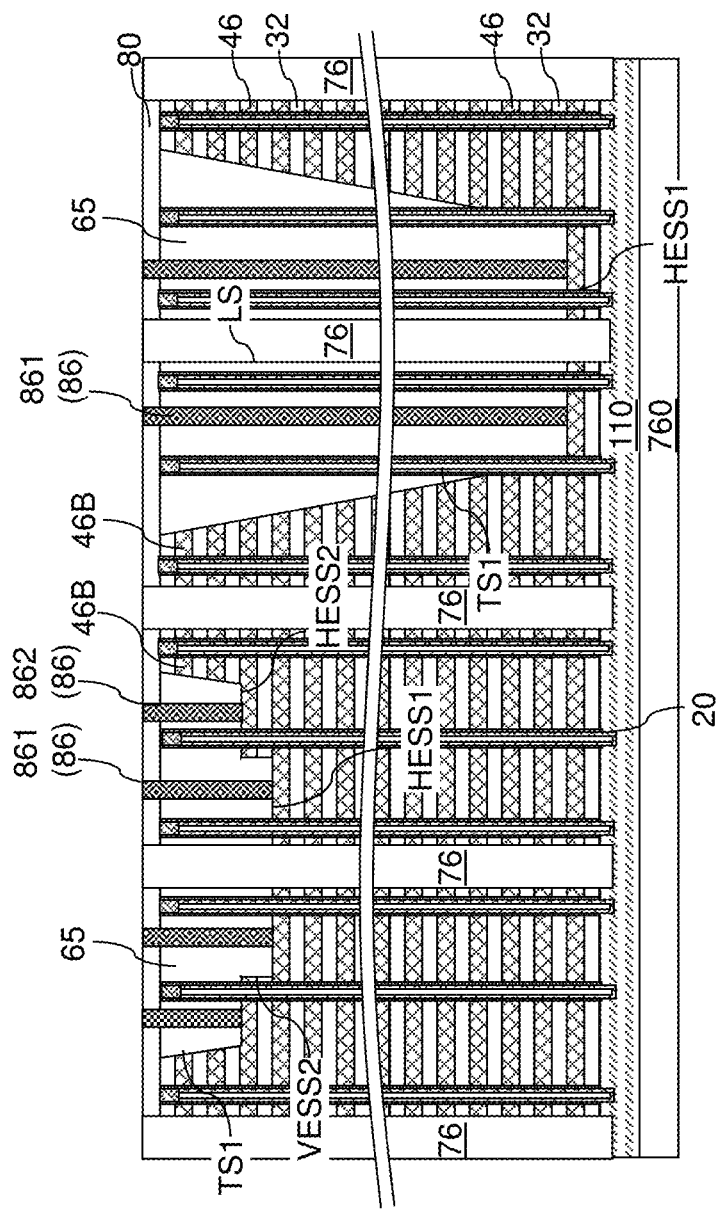
FIG. 24C is a vertical cross-sectional view of the first exemplary structure along the vertical plane C-C' of FIG. 24A.

Referring to FIGS. 24A-24C, contact via cavities can be formed through the contact-level dielectric layer 280 and the retro-stepped dielectric material portions 65 to a top surface of a respective electrically conductive layer 46. At least one conductive material such as at least one metallic material can be deposited in the contact via cavities to form contact via structures 86, which are also referred to as layer contact via structures. Each of the contact via structures 86 vertically extends to, or through, a respective horizontally-extending surface segment (HESS1, HESS2, HESS3, HESS) (i.e., tread), and contacts a top surface of a respective one of the electrically conductive layers 46.

In one embodiment, the horizontally-extending surface segments (HESS1, HESS2) may comprise first horizontally-extending surface segments HESS1 and second horizontally-extending surfaces segments HESS2. The contact via structures 86 may comprise first contact via structures 861 vertically extending through the retro-stepped dielectric material portion 65 and contacting a respective one of the first horizontally-extending surface segments HESS1 which comprises an exposed portion of a respective first one of the electrically conductive layers 46 (i.e., structure 861 contacts a tread of a first electrically conductive layer). The contact via structures 86 may also comprise second contact via structures 862 vertically extending through the retro-stepped dielectric material portion 65 and contacting respective one of the second horizontally-extending surface segments HESS2 which comprises an exposed portion of a respective second one of the electrically conductive layers 46 which overlies the first electrically conductive layer 46 (i.e., structure 862 contacts a tread of a second electrically conductive layer which overlies the first electrically conductive layer).

Figure 25A:
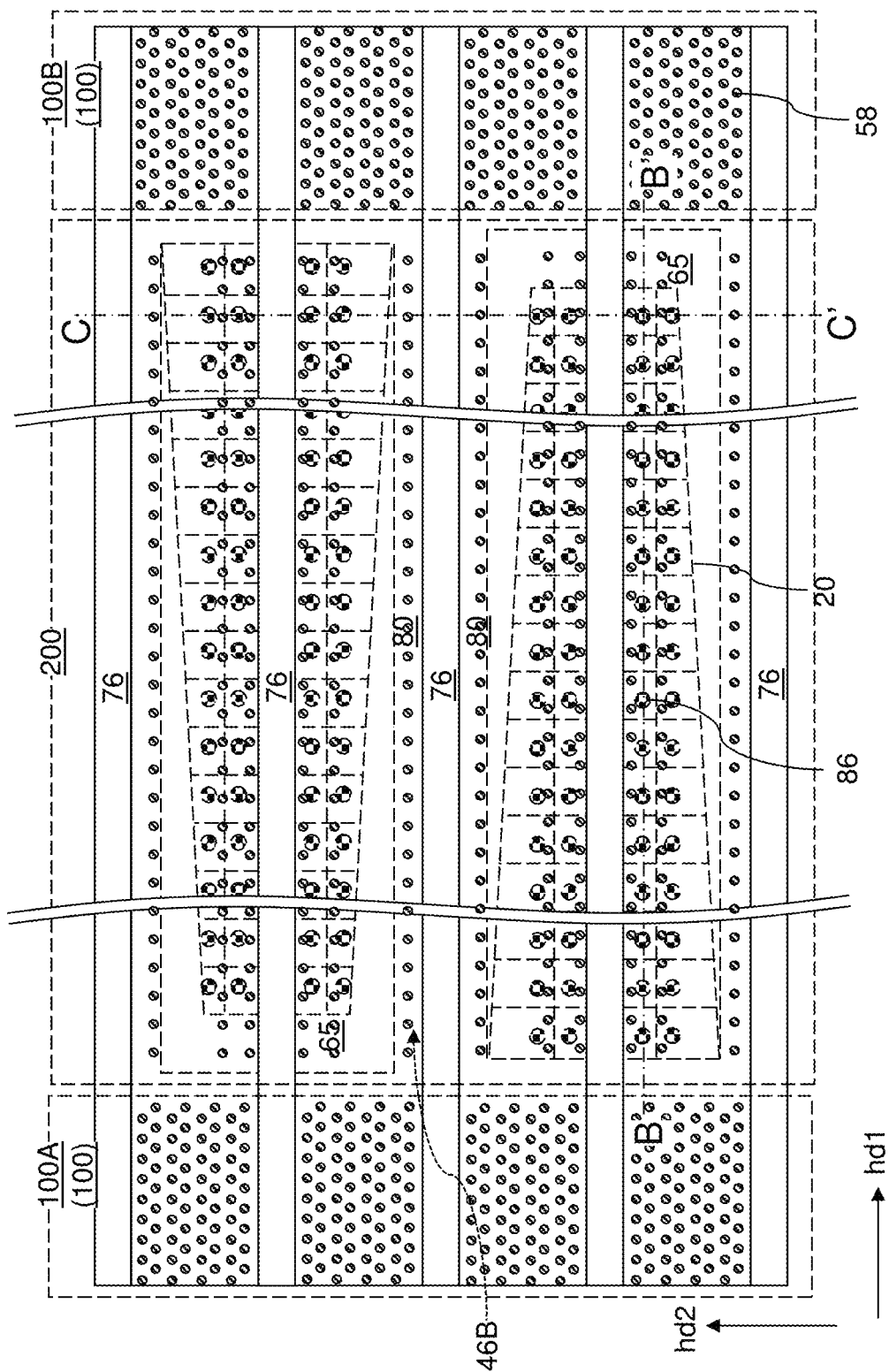
FIG. 25A is a top-down view of the second exemplary structure after formation of layer contact via structures according to the second embodiment of the present disclosure. The region illustrated in FIG. 25A corresponds to region M1 in FIG. 1.
Figure 25B:
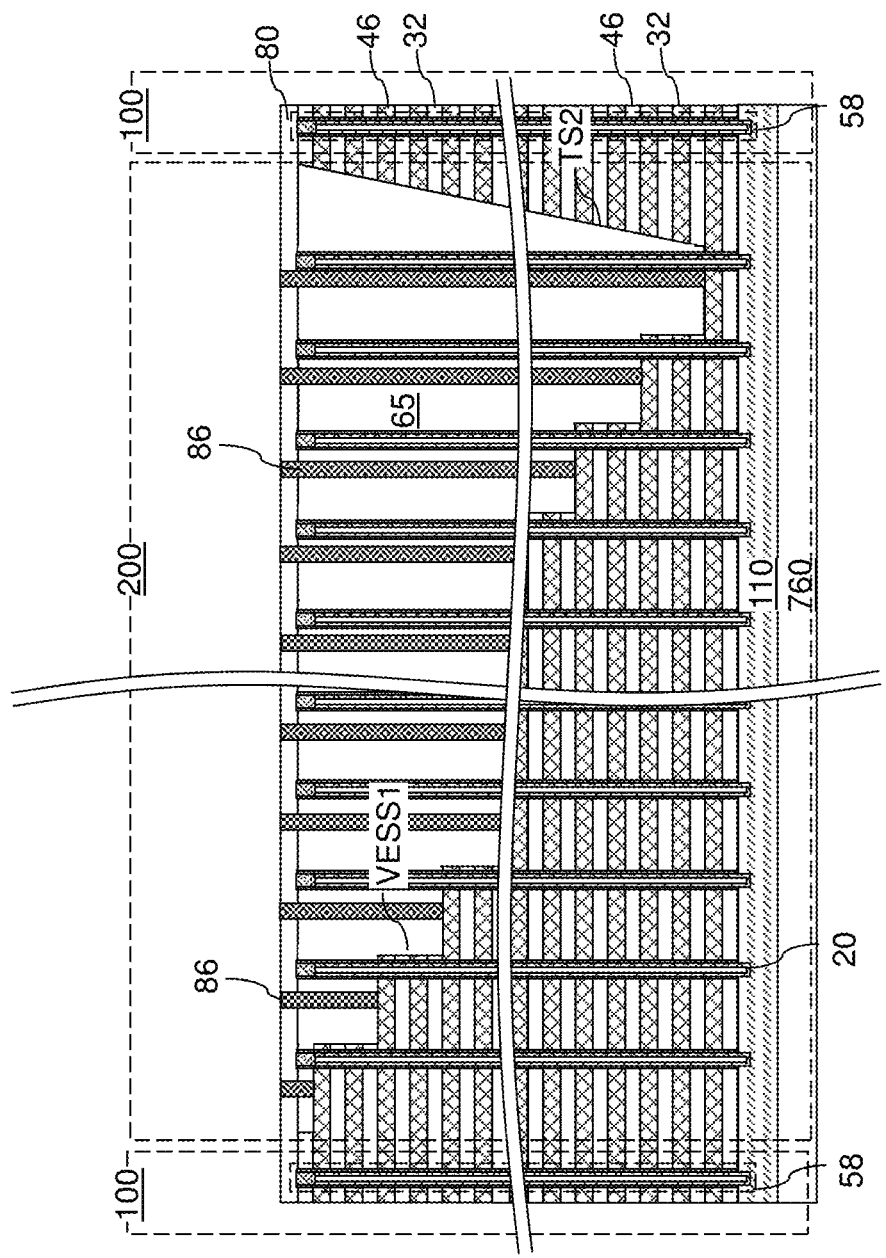
FIG. 25B is a vertical cross-sectional view of the second exemplary structure along the vertical plane B-B' of FIG. 25A.
Figure 25C:
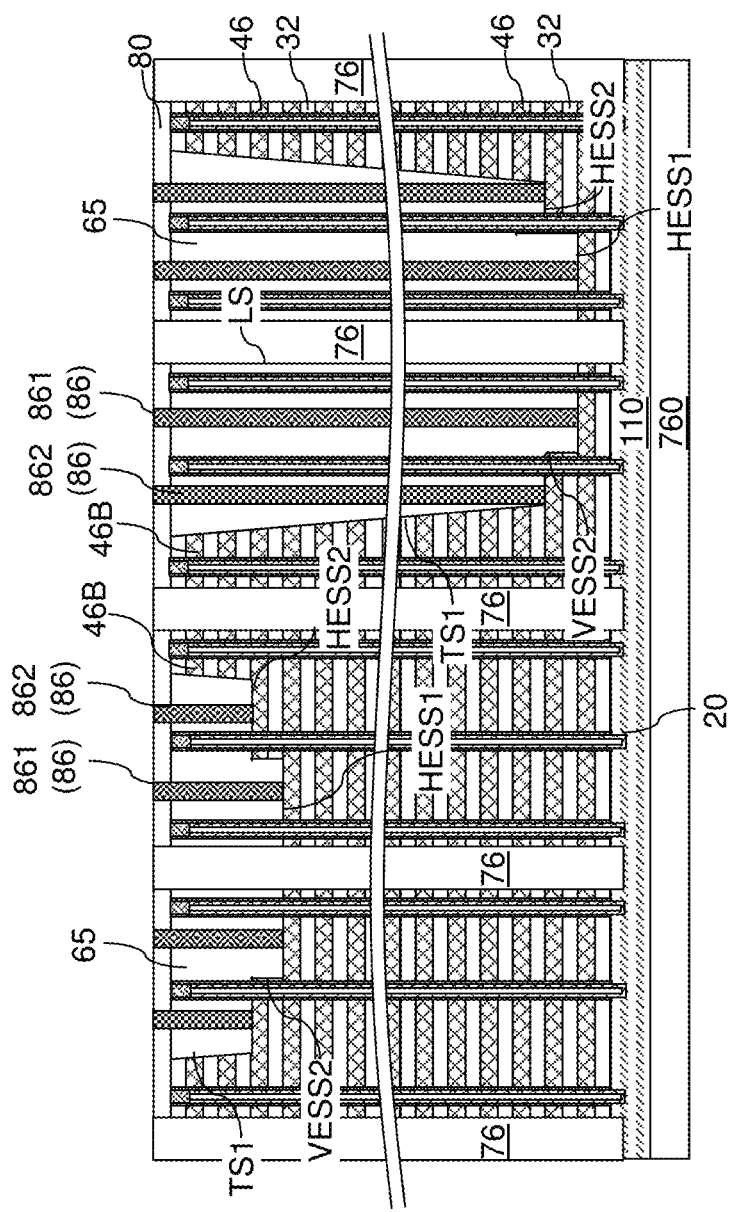
FIG. 25C is a vertical cross-sectional view of the second exemplary structure along the vertical plane C-C' of FIG. 25A.

Referring to FIGS. 25A-25C, the second exemplary structure is illustrated at a processing step that corresponds to the processing step of FIGS. 24A-24C.

Figure 26A:
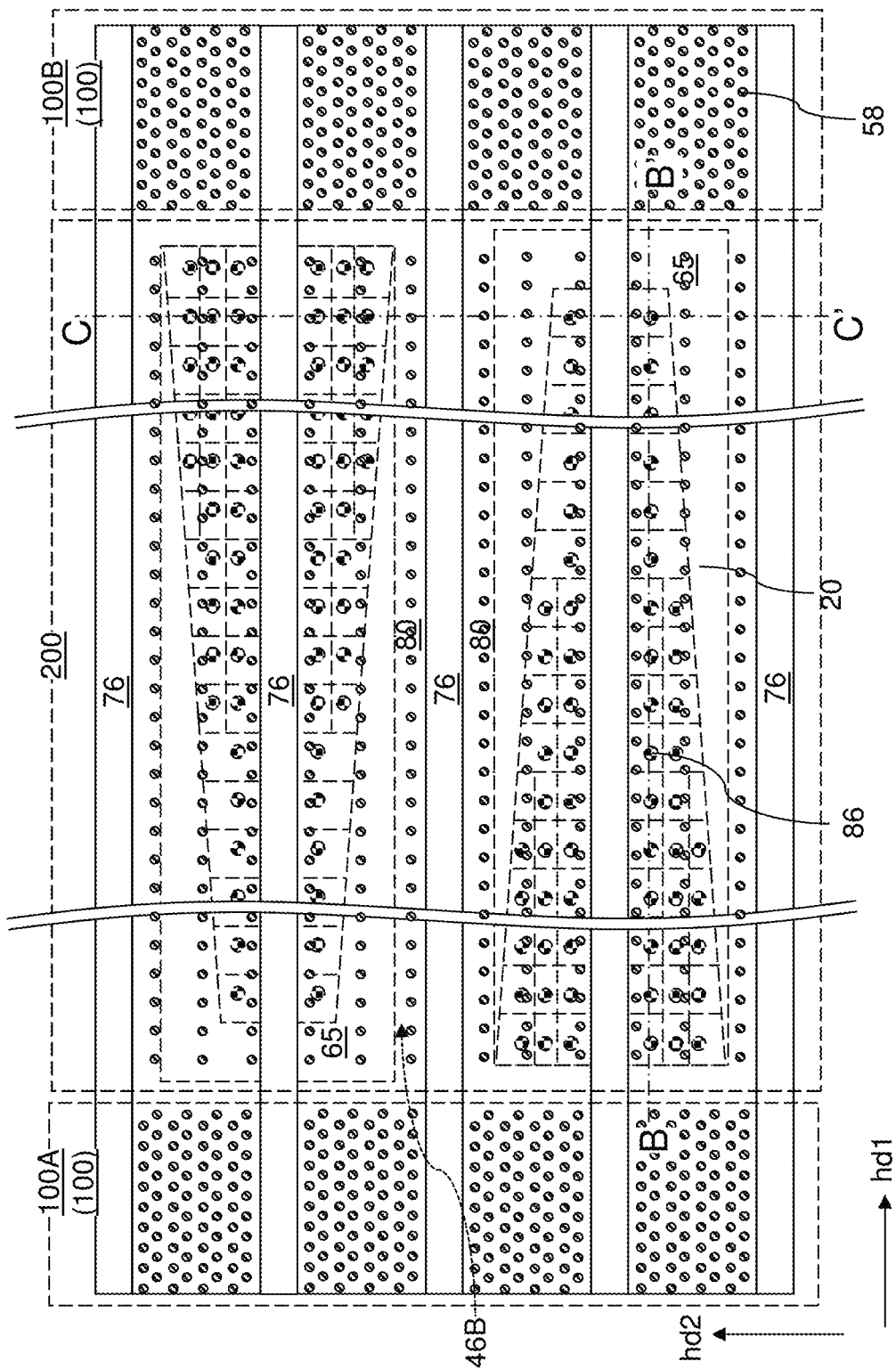
FIG. 26A is a top-down view of the third exemplary structure after formation of layer contact via structures according to the third embodiment of the present disclosure. The region illustrated in FIG. 26A corresponds to region M1 in FIG. 1.
Figure 26B:
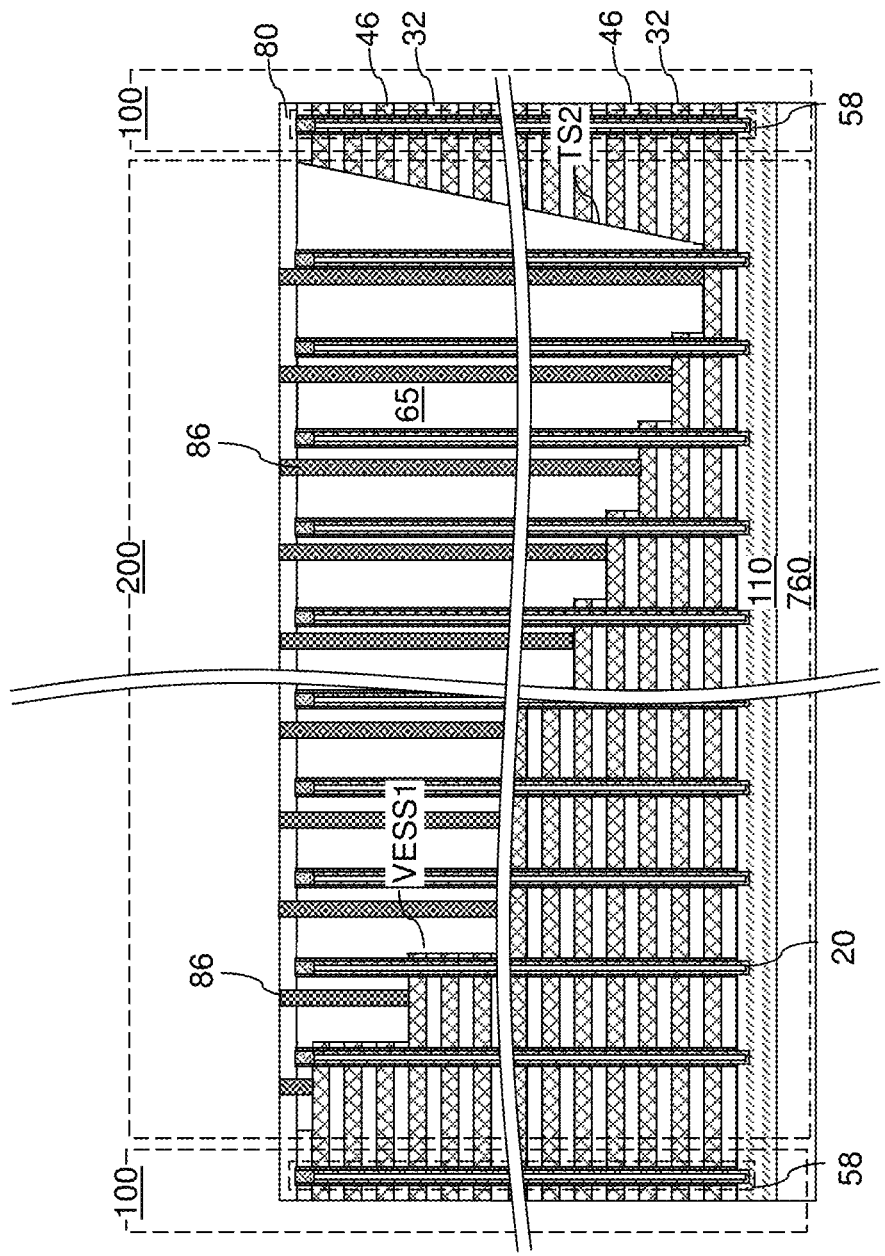
FIG. 26B is a vertical cross-sectional view of the third exemplary structure along the vertical plane B-B' of FIG. 26A.
Figure 26C:
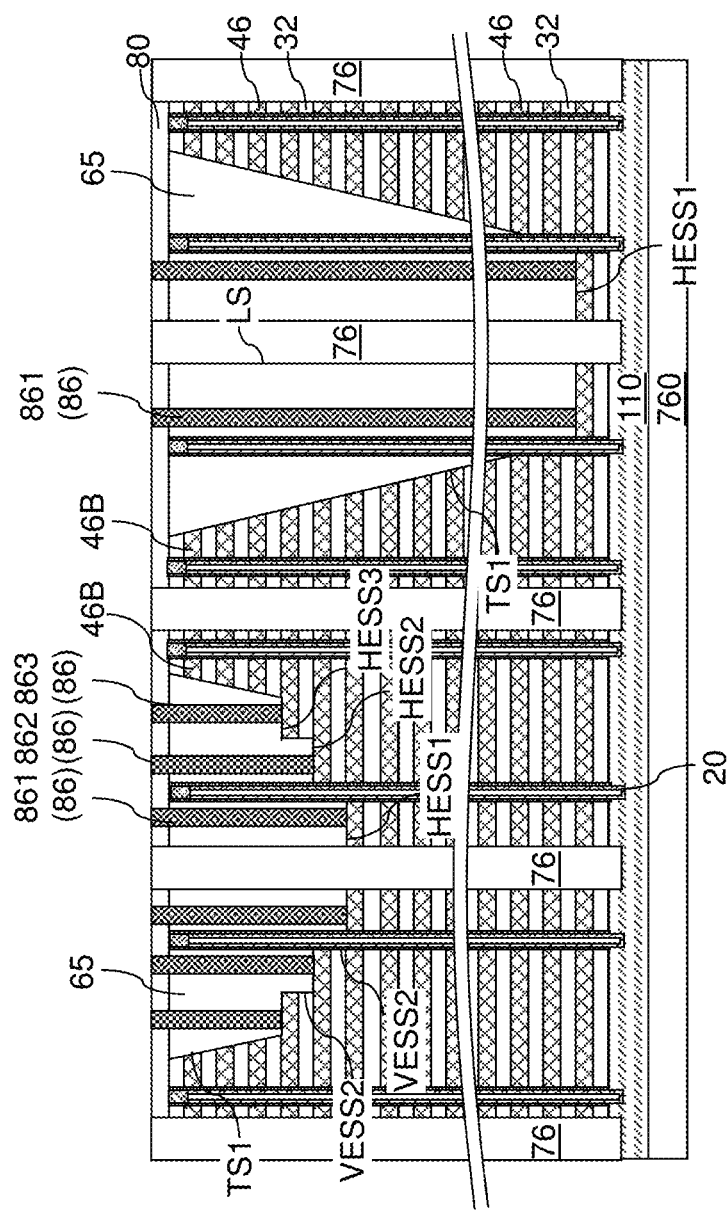
FIG. 26C is a vertical cross-sectional view of the third exemplary structure along the vertical plane C-C' of FIG. 26A.

Referring to FIGS. 26A-26C, the third exemplary structure is illustrated at a processing step that corresponds to the processing step of FIGS. 24A-24C.

In one embodiment, the horizontally-extending surface segments (HESS1, HESS2, HESS3) may comprise first horizontally-extending surface segments HESS1, second horizontally-extending surfaces segments HESS2, and third horizontally-extending surface segments HESS3. The contact via structures 86 may comprise first contact via structures 861 vertically extending through the retro-stepped dielectric material portion 65 and contacting a respective one of the first horizontally-extending surface segments HESS1 of the first one of the electrically conductive layers 46; second contact via structures 862 vertically extending through the retro-stepped dielectric material portion 65 and contacting a respective one of the second horizontally-extending surface segments HESS2 of the second one of the electrically conductive layers 46; and third contact via structures 863 vertically extending through the retro-stepped dielectric material portion 65 and contacting a respective one of the third horizontally-extending surface segments HESS3 of the third one of the electrically conductive layers 46.

Figure 27A:
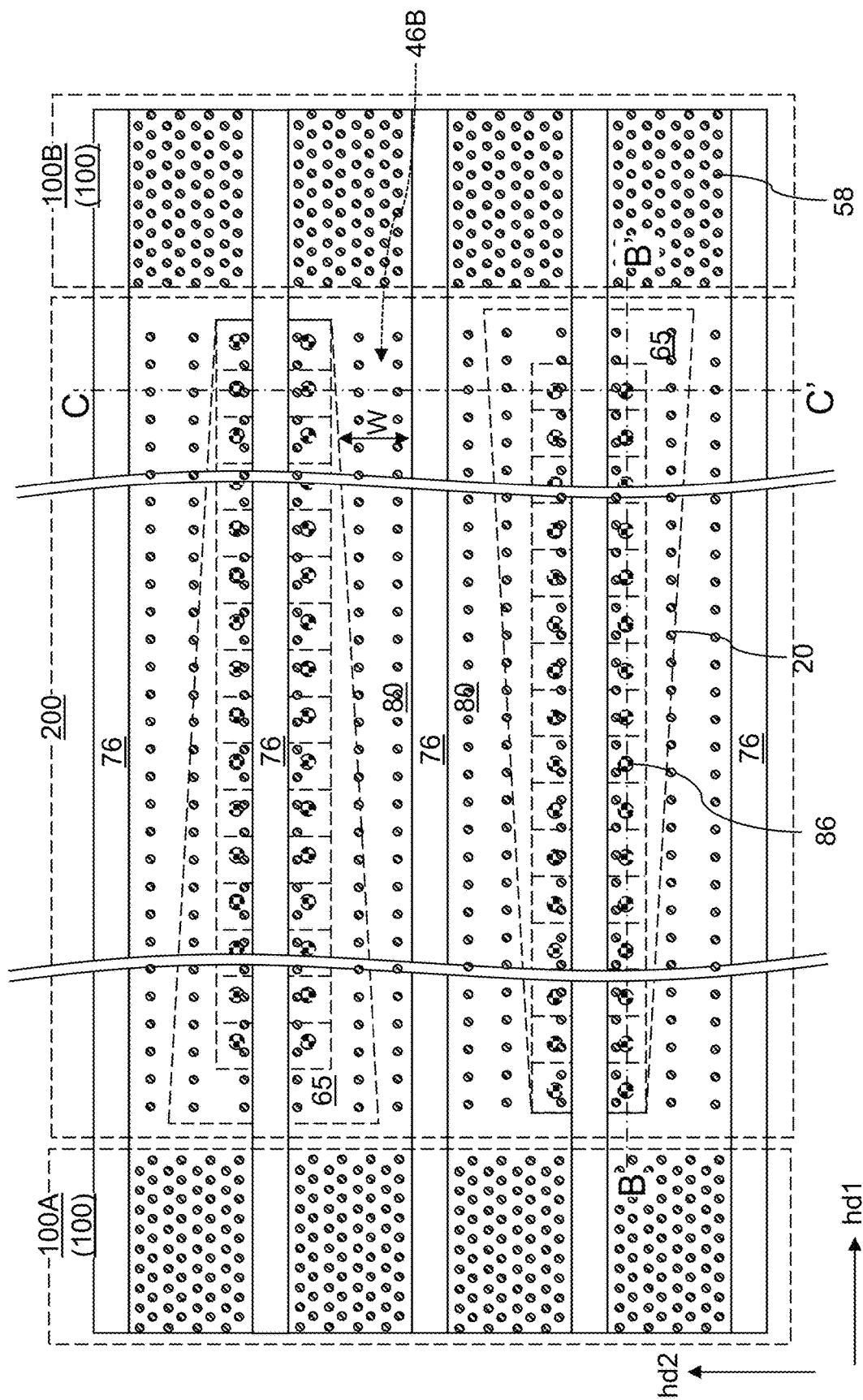
FIG. 27A is a top-down view of the fourth exemplary structure after formation of layer contact via structures according to the fourth embodiment of the present disclosure. The region illustrated in FIG. 27A corresponds to region M1 in FIG. 1.
Figure 27B:
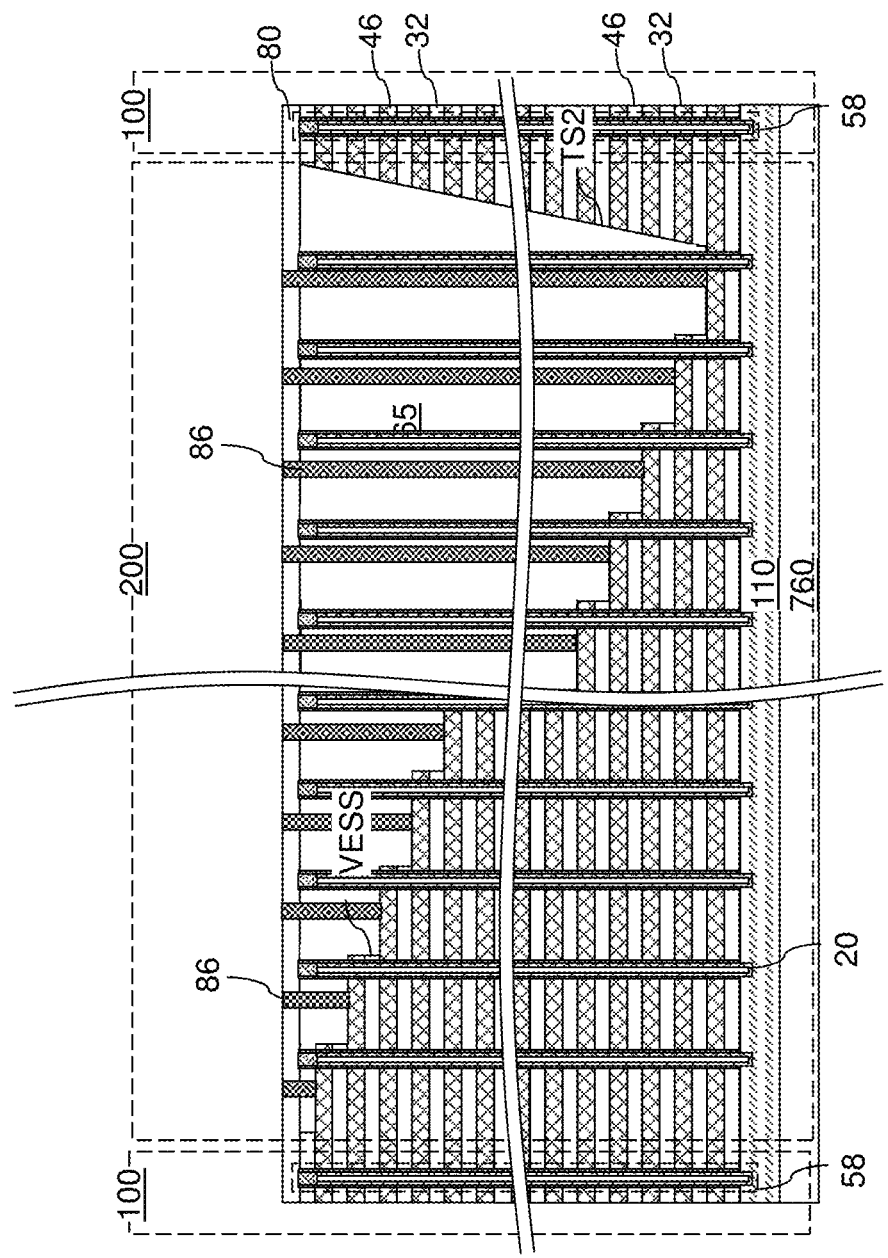
FIG. 27B is a vertical cross-sectional view of the fourth exemplary structure along the vertical plane B-B' of FIG. 27A.
Figure 27C:
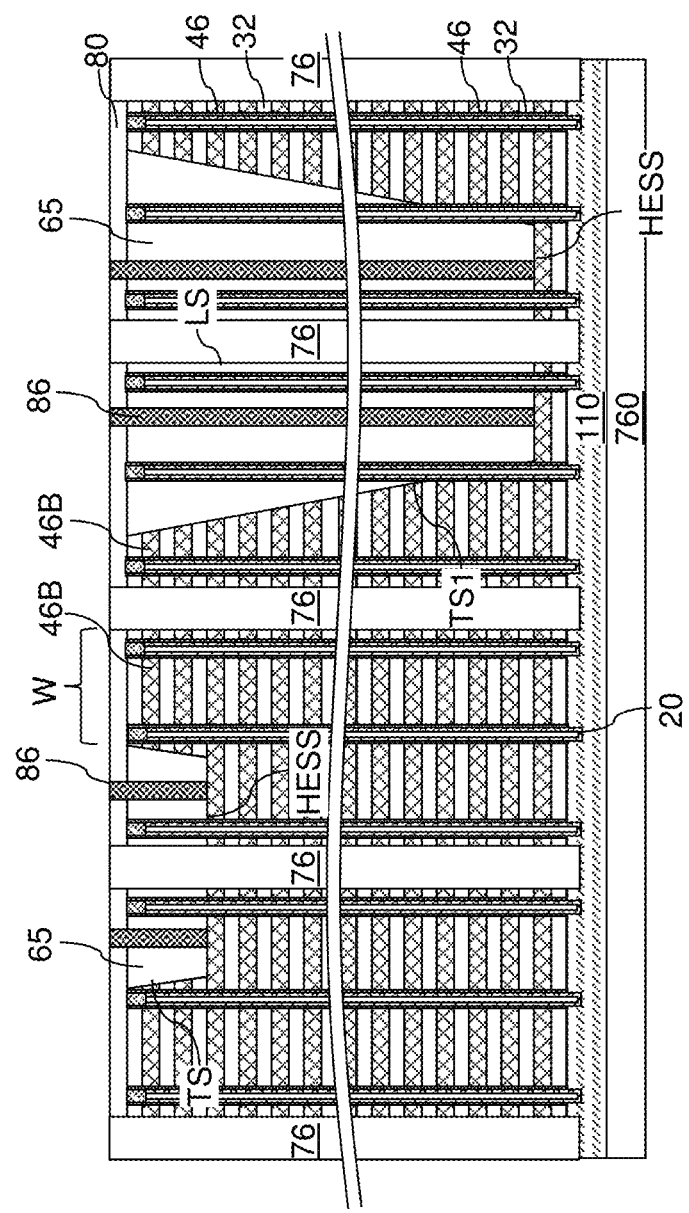
FIG. 27C is a vertical cross-sectional view of the fourth exemplary structure along the vertical plane C-C' of FIG. 27A.

Referring to FIGS. 27A-27C, the fourth exemplary structure is illustrated at a processing step that corresponds to the processing step of FIGS. 24A-24C.

Referring to FIGS. 28A-28C and 29, the fifth exemplary structure is illustrated at a processing step that corresponds to the processing step of FIGS. 24A-24C.

Figure 28A:
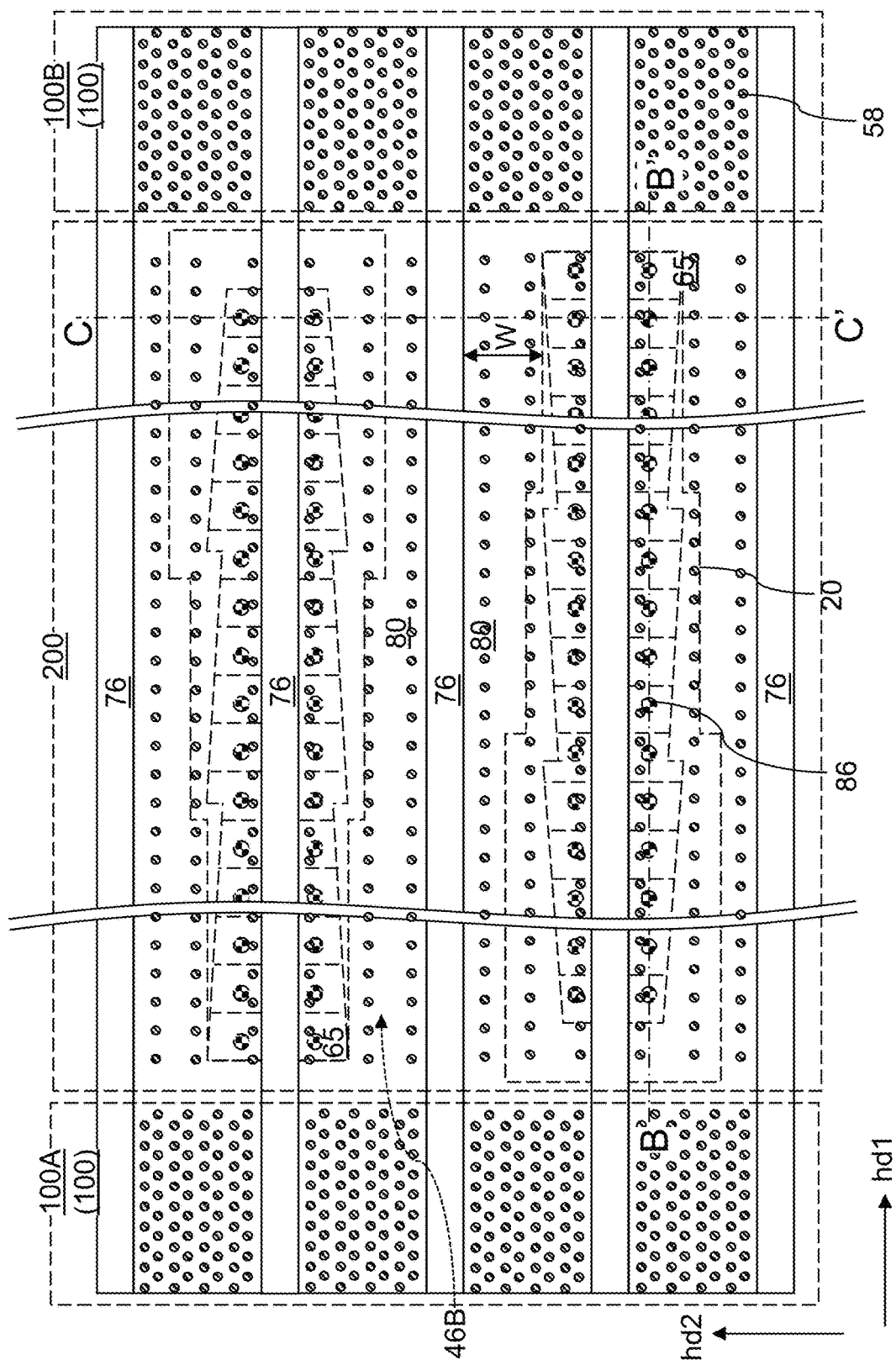
FIG. 28A is a top-down view of the fifth exemplary structure after formation of layer contact via structures according to the fifth embodiment of the present disclosure. The region illustrated in FIG. 28A corresponds to region M1 in FIG. 1.
Figure 28B:
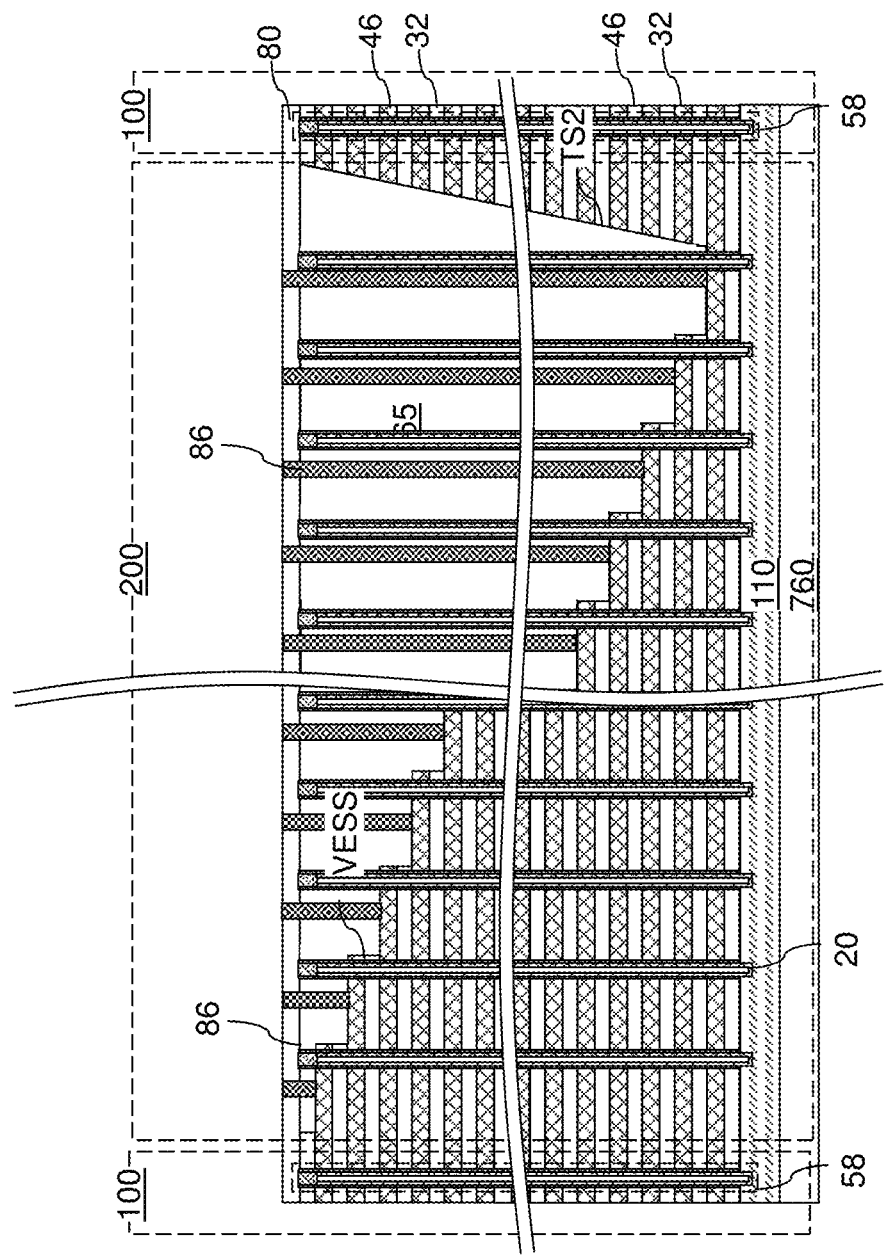
FIG. 28B is a vertical cross-sectional view of the fifth exemplary structure along the vertical plane B-B' of FIG. 28A.
Figure 28C:
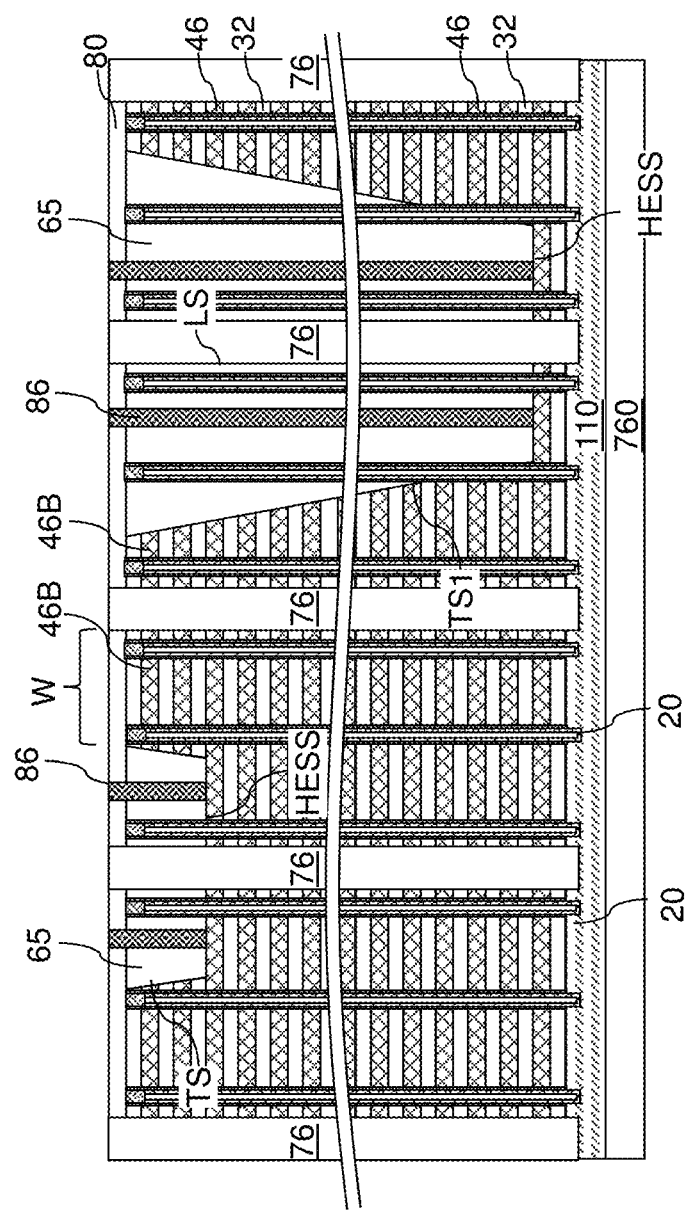
FIG. 28C is a vertical cross-sectional view of the fifth exemplary structure along the vertical plane C-C' of FIG. 28A.

In FIG. 28A, the width of the bridge region 46B increases stepwise from one memory array region (e.g., 100A) to the other memory array region (100B) and the width of the stepped cavity filled with the retro-stepped dielectric material portion 65 decreases stepwise in the same direction. In contrast, in the alternative configuration illustrated in FIG. 29, the width of the bridge region 46B increases and then decreases stepwise from one memory array region (e.g., 100A) to the other memory array region (100B) and the width of the stepped cavity filled with the retro-stepped dielectric material portion 65 decreases and then increases stepwise in the same direction. For example, the middle part of the bridge region 46B may be wider than the end parts of the bridge region 46, as shown in FIG. 29.

Figure 29:
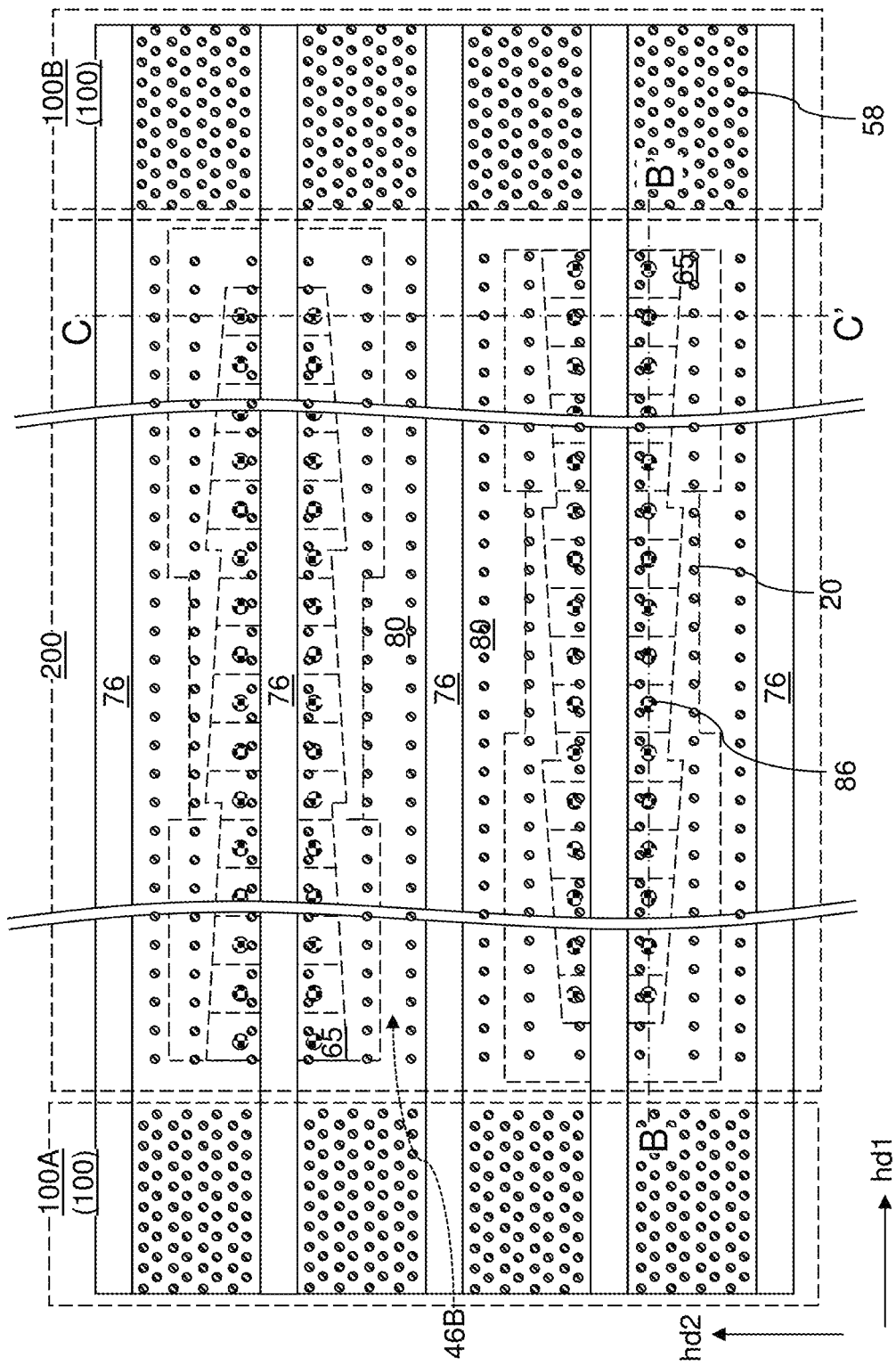
FIG. 29 is a top-down view of an alternative configuration of the fifth exemplary structure after formation of layer contact via structures according to the fifth embodiment of the present disclosure. The region illustrated in FIG. 29 corresponds to region M1 in FIG. 1.

While single rows of contact via structures 86 are shown in FIGS. 27A, 28A and 29, it should be noted that plural rows of contact via structures 86 may be used in the fourth and fifth exemplary structures, as shown in FIG. 24A, 25A or 26A.

As shown in FIGS. 27A, 27C, 28A, 28C and 29 the widths "W" of the bridge regions 46B of the electrically conductive layers 46 in the second horizontal direction hd2 located between adjacent stepped cavities 69 in the inter-array region 200 is increased compared to those of the first, second and third exemplary structures of the first, second and third embodiments. Thus, lower resistivity strip-shaped bridge regions 46B of the electrically conductive layer 46 in the inter-tier array 200 electrically connect the electrically conductive layer 46 portions (e.g., word lines and select gate electrodes) in adjacent memory array regions 100A and 100B.

According to various embodiments of the present disclosure, such as the first through third embodiments, a three-dimensional memory device is provided, which comprises: an alternating stack (32, 46) of insulating layers 32 and electrically conductive layers 46 located over a substrate 8; a first three-dimensional memory array located in a first memory array region 100A; and a second three-dimensional memory array located in a second memory array region 100B that is laterally spaced from the first memory array region 100A along a first horizontal direction hd1 by an inter-array region 200, wherein the electrically conductive layers 46 comprise common word lines for the first three-dimensional memory array and for the second three-dimensional memory array. The alternating stack (32, 46) is laterally bounded by two trench fill structures 76 that are laterally spaced apart along a second horizontal direction hd2 by an inter-trench spacing; the electrically conductive layers 46 continuously extend between the first memory array region 100A and a second memory array region 100B and comprise a respective bridge region 46B that is located in the inter-array region 200 and having a width along the second horizontal direction hd2 that is less than the inter-trench spacing; the inter-array region 200 comprises a stepped surface region comprising first vertically-extending surface segments VESS1 of the alternating stack (32, 46) that are perpendicular to the first horizontal direction hd1 and second vertically-extending surface segments VESS2 of the alternating stack (32, 46) that are perpendicular to the second horizontal direction hd2.

In one embodiment, the semiconductor structure comprises a retro-stepped dielectric material portion 65 overlying and contacting horizontally-extending surface segments (HESS1, HESS2, HESS3) of the alternating stack (32, 46). In one embodiment, the horizontally-extending surface segments (HESS1, HESS2, HESS3) comprise: first horizontally-extending surface segments HESS1 that are arranged along the first horizontal direction hd1 in a first row; and second horizontally-extending surface segments HESS2 that are arranged along the first horizontal direction hd1 in a second row that is laterally offset from the first row along the second horizontal direction hd2.

In one embodiment, the first row of the first horizontally-extending surface segments HESS1 is vertically offset from the second row of the second horizontally-extending surface segments HESS2 by the second vertically-extending surface segments VESS2. A first row of contact via structures (e.g., 861) extends in the first horizontal direction hd1 and contacts the first row of the first horizontally-extending surface segments HESS1. A second row of contact via structures (e.g., 862) extends in the first horizontal direction hd1 and contacts the second row of the second horizontally-extending surface segments HESS2. The first row of contact via structures is laterally offset from the second row of contact via structures along the second horizontal direction hd2.

In one embodiment, the first horizontally-extending surface segments HESS1 are adjoined to a stepped bottom edge of one of the second vertically-extending surface segments VESS2 that laterally extends along the first horizontal direction hd1; and the second horizontally-extending surface segments HESS2 are adjoined to a stepped top edge of the one of the second vertically-extending surface segments VESS2 that laterally extends along the first horizontal direction hd1.

In one embodiment, each of the second vertically-extending surface segments VESS2 is adjoined to a respective pair of horizontally-extending surface segments (HESS1, HESS2, HESS3) among the horizontally-extending surface segments (HESS1, HESS2, HESS3) of the alternating stack (32, 46) that are laterally spaced from each other along the second horizontal direction hd2.

In one embodiment, the retro-stepped dielectric material portion 65 comprises: a first tapered sidewall TS1 that extends along the first horizontal direction hd1 and has a first taper angle relative to a vertical direction along the second horizontal direction hd2 and contacting the bridge regions 46B of the electrically conductive layers 46; and a second tapered sidewall TS2 that extends along the second horizontal direction hd2, adjoined to an edge of the first tapered sidewall TS1, and has a second taper angle relative to the vertical direction along the first horizontal direction hd1. In one embodiment, the retro-stepped dielectric material portion 65 comprises a lengthwise sidewall LS in contact with one of the two trench fill structures 76 and adjoined to an edge of the second tapered sidewall TS2.

In one embodiment, each first vertically-extending surface segment VESS1 within a first subset of the first vertically-extending surface segments VESS1 is adjoined to a respective neighboring pair among the first horizontally-extending surface segments HESS1; and each first vertically-extending surface segment VESS1 within a second subset of the first vertically-extending surface segments VESS1 is adjoined to a respective neighboring pair among the second horizontally-extending surface segments HESS2.

In one embodiment, a total number of the second horizontally-extending surface segments HESS2 is the same as a total number of the first horizontally-extending surface segments HESS1. In another embodiment, a total number of the second horizontally-extending surface segments HESS2 is less than a total number of the first horizontally-extending surface segments HESS1.

In one embodiment, a first plurality of second vertically-extending surface segments VESS2 is laterally offset from one of the trench fill structures 76 by a same lateral spacing.

In one embodiment, one of the second vertically-extending surface segments VESS2 laterally extends continuously along the first horizontal direction hd1, is adjoined to a first subset of the first vertically-extending surface segments VESS1 that are more proximal to one of the trench fill structures 76 than the one of the second vertically-extending surface segments VESS2, and is adjoined to a second subset of the first vertically-extending surface segments VESS1 that are more distal from the one of the trench fill structures 76 than the one of the second vertically-extending surface segments VESS2.

In one embodiment, each first vertically-extending surface segment VESS1 within the first subset of the first vertically-extending surface segments VESS1 is adjoined to a sidewall of the one of the trench fill structures 76. In one embodiment, the one of the second vertically-extending surface segments VESS2 comprises: a stepped bottom edge that is adjoined to first horizontally-extending surface segments HESS1 of the alternating stack (32, 46); and a stepped top edge that is adjoined to second horizontally-extending surface segments HESS2 of the alternating stack (32, 46).

In one embodiment, an additional one of the second vertically-extending surface segments VESS2 laterally extends continuously along the first horizontal direction hd1, is adjoined to the second subset of the first vertically-extending surface segments VESS1, and is adjoined to a third subset of the first vertically-extending surface segments VESS1 that are more distal from the one of the trench fill structures 76 than the additional one of the second vertically-extending surface segments VESS2.

According to various embodiments of the present disclosure, such as the fourth and five embodiments, a semiconductor structure is provided, which comprises: an alternating stack (32, 46) of insulating layers 32 and electrically conductive layers 46; a first three-dimensional memory array located in a first memory array region 100A; and a second three-dimensional memory array located in a second memory array region 100B that is laterally spaced from the first memory array region 100A along a first horizontal direction hd1 by an inter-array region 200, wherein the electrically conductive layers 46 comprise common word lines for the first three-dimensional memory array and for the second three-dimensional memory array. The alternating stack (32, 46) is laterally bounded by two trench fill structures 76 that are laterally spaced apart along a second horizontal direction hd2 by an inter-trench spacing; the electrically conductive layers 46 continuously extend between the first memory array region 100A and a second memory array region 100B and comprise a respective bridge region 46B that is located in the inter-array region 200; and the bridge region 46B of at least one the electrically conductive layers 46 has a variable width along the second horizontal direction hd2.

The width may increase (e.g., strictly or stepwise) or both increase and decrease with a lateral distance from the first memory array region 100A toward the second memory array region 100B along the first horizontal direction hd1.

In one embodiment, the inter-array region 200 comprises a stepped surface region comprising vertically-extending surface segments VESS of the alternating stack (32, 46) that are perpendicular to the first horizontal direction hd1.

In one embodiment, the stepped surface region comprises horizontally-extending surface segments HESS connecting a respective neighboring pair of vertically-extending surface segments VESS of the vertically-extending surface segments VESS.

In one embodiment, each of the horizontally-extending surface segments HESS has a same lateral extent along the second horizontal direction hd2. In one embodiment, the variable width of the bridge region 46B along the second horizontal direction hd2 increases strictly with the lateral distance from the first memory array region 100A toward the second memory array region 100B. In another embodiment shown in FIG. 29, the variable width of the bridge region 46B increases and then decreases with the lateral distance from the first memory array region 100A toward the second memory array region 100B.

In one embodiment, the horizontally-extending surface segments HESS have a variable lateral extent along the second horizontal direction hd2 including at least one stepwise increase as a function of the lateral distance from the first memory array region 100A toward the second memory array region 100B. In one embodiment, the horizontally-extending surface segments HESS have a strictly decreasing lateral extent within a range of the lateral distance that does not include the at least one stepwise increase. In one embodiment, the variable width of the bridge region 46B along the second horizontal direction hd2 increases stepwise with the lateral distance from the first memory array region 100A toward the second memory array region 100B. In one embodiment, the bridge region 46B has a respective uniform within each range of the lateral distance that does not include any stepwise increase in the variable width.

In one embodiment, the three-dimensional memory device comprises a retro-stepped dielectric material portion 65 overlying, and contacting, horizontally-extending surface segments HESS of the alternating stack (32, 46) in the stepped surface region. In one embodiment, each of the horizontally-extending surface segments HESS of the alternating stack (32, 46) has a respective rectangular shape and has a same lateral extent along the second horizontal direction hd2.

In one embodiment, a plurality of the horizontally-extending surface segments HESS of the alternating stack (32, 46) has a respective trapezoidal shape having parallel edges that laterally extend along the second horizontal direction hd2 and non-parallel edges that laterally extend along the first horizontal direction hd1.

In one embodiment, the retro-stepped dielectric material portion 65 comprises: a first tapered sidewall TS1 that extends along the first horizontal direction hd1 and has a first taper angle relative to a vertical direction along the second horizontal direction hd2 and has a stepped bottom edge that is adjoined to the vertically-extending surface segments VESS of the alternating stack (32, 46); and a second tapered sidewall TS2 that extends along the second horizontal direction hd2, adjoined to an edge of the first tapered sidewall TS1, and has a second taper angle relative to the vertical direction along the first horizontal direction hd1.

In one embodiment, the three-dimensional memory device comprises contact via structures 86 vertically extending through the retro-stepped dielectric material portion 65 and contacting a respective one of the electrically conductive layers 46 in the stepped surface region. The contact via structures 86 comprise a first row of contact via structures (e.g., 861) which extends in the first horizontal direction hd1 and contacts the first row of the first horizontally-extending surface segments HESS1, and a second row of contact via structures (e.g., 862) which extends in the first horizontal direction hd1 and contacts the second row of the second horizontally-extending surface segments HESS2. The first row of contact via structures is laterally offset from the second row of contact via structures along the second horizontal direction hd2.

The first through third embodiments of the present disclosure can provide a compact contact region within a staircase and having at least two rows of contact via structures 86. Electrical contacts to the electrically conductive layers 46 can be provided in a smaller area having a decreased length in the first horizontal direction hd1 than prior art single rows of contact via structures.

Alternatively or additionally, the fourth and fifth embodiments of the present disclosure can provide bridge regions 46B of electrically conductive layers 46 located in an inter-array region 200 and including sections having a greater lateral width W than a minimum width of the bridge regions. Local widening of the bridge regions 46B of the electrically conductive layers 46 in the inter-array region 200 can reduce the resistance of the bridge regions 46B of the electrically conductive layers 46, and thus, can reduce the RC delay for the word lines in the memory array regions 100A and 100B that are connected to each other through the bridge regions 46B in the inter-array region 200.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers;
a first three-dimensional memory array located in a first memory array region; and
a second three-dimensional memory array located in a second memory array region that is laterally spaced from the first memory array region along a first horizontal direction by an inter-array region, wherein the electrically conductive layers comprise common word lines for the first three-dimensional memory array and for the second three-dimensional memory array,
wherein:
the alternating stack is laterally bounded by two trench fill structures that are laterally space apart along a second horizontal direction by an inter-trench spacing;
the electrically conductive layers continuously extend between the first memory array region and the second memory array region and comprise a respective bridge region that is located in the inter-array region and having a width along the second horizontal direction that is less than the inter-trench spacing;
the inter-array region comprises a stepped surface region comprising first vertically-extending surface segments of the alternating stack that are perpendicular to the first horizontal direction and second vertically-extending surface segments of the alternating stack that are perpendicular to the second horizontal direction; and
a first plurality of second vertically-extending surface segments is laterally offset from one of the trench fill structures by a same lateral spacing.

2. The three-dimensional memory device of claim 1, further comprising a retro-stepped dielectric material portion overlying and contacting horizontally-extending surface segments of the alternating stack.

3. The three-dimensional memory device of claim 2, wherein the horizontally-extending surface segments comprise:
first horizontally-extending surface segments that are arranged along the first horizontal direction in a first row; and
second horizontally-extending surface segments that are arranged along the first horizontal direction in a second row that is laterally offset from the first row along the second horizontal direction.

4. The three-dimensional memory device of claim 3, wherein the first row of the first horizontally-extending surface segments is vertically offset from the second row of the second horizontally-extending surface segments by the second vertically-extending surface segments.

5. The three-dimensional memory device of claim 4, further comprising:
- a first row of contact via structures extending in the first horizontal direction and contacting the first row of the first horizontally-extending surface segments;
- a second row of contact via structures extending in the first horizontal direction and contacting the second row of the second horizontally-extending surface segments; and
- the first row of contact via structures is laterally offset from the second row of contact via structures along the second horizontal direction.

6. The three-dimensional memory device of claim 5, wherein:
- the first horizontally-extending surface segments are adjoined to a stepped bottom edge of one of the second vertically-extending surface segments that laterally extends along the first horizontal direction; and
- the second horizontally-extending surface segments are adjoined to a stepped top edge of the one of the second vertically-extending surface segments that laterally extends along the first horizontal direction.

7. The three-dimensional memory device of claim 3, wherein:
- each first vertically-extending surface segment within a first subset of the first vertically-extending surface segments is adjoined to a respective neighboring pair of the first horizontally-extending surface segments; and
- each first vertically-extending surface segment within a second subset of the first vertically-extending surface segments is adjoined to a respective one of the first horizontally-extending surface segments and a respective one of the second horizontally-extending surface segments.

8. The three-dimensional memory device of claim 7, wherein a total number of the second horizontally-extending surface segments is the same as a total number of the first horizontally-extending surface segments.

9. The three-dimensional memory device of claim 7, wherein a total number of the second horizontally-extending surface segments is less than a total number of the first horizontally-extending surface segments.

10. The three-dimensional memory device of claim 2, wherein each of the second vertically-extending surface segments is adjoined to a respective pair of horizontally-extending surface segments among the horizontally-extending surface segments of the alternating stack that are laterally spaced from each other along the second horizontal direction.

11. The three-dimensional memory device of claim 2, wherein the retro-stepped dielectric material portion comprises:
- a first tapered sidewall that extends along the first horizontal direction and has a first taper angle relative to a vertical direction along the second horizontal direction and contacting the bridge regions of the electrically conductive layers; and
- a second tapered sidewall that extends along the second horizontal direction, adjoined to an edge of the first tapered sidewall, and has a second taper angle relative to the vertical direction along the first horizontal direction.

12. The three-dimensional memory device of claim 1, wherein one of the second vertically-extending surface segments laterally extends continuously along the first horizontal direction, is adjoined to a first subset of the first vertically-extending surface segments that are more proximal to one of the trench fill structures than the one of the second vertically-extending surface segments, and is adjoined to a second subset of the first vertically-extending surface segments that are more distal from the one of the trench fill structures than the one of the second vertically-extending surface segments.

13. The three-dimensional memory device of claim 12, wherein each first vertically-extending surface segment within the first subset of the first vertically-extending surface segments is adjoined to a sidewall of the one of the trench fill structures.

14. The three-dimensional memory device of claim 12, wherein the one of the second vertically-extending surface segments comprises:
- a stepped bottom edge that is adjoined to first horizontally-extending surface segments of the alternating stack; and
- a stepped top edge that is adjoined to second horizontally-extending surface segments of the alternating stack.

15. The three-dimensional memory device of claim 12, wherein an additional one of the second vertically-extending surface segments laterally extends continuously along the first horizontal direction, is adjoined to the second subset of the first vertically-extending surface segments, and is adjoined to a third subset of the first vertically-extending surface segments that are more distal from the one of the trench fill structures than the additional one of the second vertically-extending surface segments.

16. A three-dimensional memory device, comprising:
- an alternating stack of insulating layers and electrically conductive layers;
- a first three-dimensional memory array located in a first memory array region; and
- a second three-dimensional memory array located in a second memory array region that is laterally spaced from the first memory array region along a first horizontal direction by an inter-array region, wherein the electrically conductive layers comprise common word lines for the first three-dimensional memory array and for the second three-dimensional memory array, wherein:
- the alternating stack is laterally bounded by two trench fill structures that are laterally spaced apart along a second horizontal direction by an inter-trench spacing;
- the electrically conductive layers continuously extend between the first memory array region and the second memory array region and comprise a respective bridge region that is located in the inter-array region and having a width along the second horizontal direction that is less than the inter-trench spacing;
- the inter-array region comprises a stepped surface region comprising first vertically-extending surface segments of the alternating stack that are perpendicular to the first horizontal direction and second vertically-extending surface segments of the alternating stack that are perpendicular to the second horizontal direction; and
- one of the second vertically-extending surface segments laterally extends continuously along the first horizontal direction, is adjoined to a first subset of the first vertically-extending surface segments that are more proximal to one of the trench fill structures than the one of the second vertically-extending surface segments, and is adjoined to a second subset of the first vertically-extending surface segments that are more distal from the one of the trench fill structures than the one of the second vertically-extending surface segments.

17. The three-dimensional memory device of claim 16, wherein each first vertically-extending surface segment within the first subset of the first vertically-extending surface segments is adjoined to a sidewall of the one of the trench fill structures.

18. The three-dimensional memory device of claim 16, wherein the one of the second vertically-extending surface segments comprises:
a stepped bottom edge that is adjoined to first horizontally-extending surface segments of the alternating stack; and
a stepped top edge that is adjoined to second horizontally-extending surface segments of the alternating stack.

19. The three-dimensional memory device of claim 16, wherein an additional one of the second vertically-extending surface segments laterally extends continuously along the first horizontal direction, is adjoined to the second subset of the first vertically-extending surface segments, and is adjoined to a third subset of the first vertically-extending surface segments that are more distal from the one of the trench fill structures than the additional one of the second vertically-extending surface segments.

20. A three-dimensional memory device, comprising:
an alternating stack of insulating layers and electrically conductive layers;
a first three-dimensional memory array located in a first memory array region;
a second three-dimensional memory array located in a second memory array region that is laterally spaced from the first memory array region along a first horizontal direction by an inter-array region, wherein the electrically conductive layers comprise common word lines for the first three-dimensional memory array and for the second three-dimensional memory array; and
a retro-stepped dielectric material portion overlying and contacting horizontally-extending surface segments of the alternating stack,
wherein:
the alternating stack is laterally bounded by two trench fill structures that are laterally spaced apart along a second horizontal direction by an inter-trench spacing;
the electrically conductive layers continuously extend between the first memory array region and the second memory array region and comprise a respective bridge region that is located in the inter-array region and having a width along the second horizontal direction that is less than the inter-trench spacing;
the inter-array region comprises a stepped surface region comprising first vertically-extending surface segments of the alternating stack that are perpendicular to the first horizontal direction and second vertically-extending surface segments of the alternating stack that are perpendicular to the second horizontal direction; and
the retro-stepped dielectric material portion comprises:
a first tapered sidewall that extends along the first horizontal direction and has a first taper angle relative to a vertical direction along the second horizontal direction and contacting the bridge regions of the electrically conductive layers; and
a second tapered sidewall that extends along the second horizontal direction, adjoined to an edge of the first tapered sidewall, and has a second taper angle relative to the vertical direction along the first horizontal direction.

21. A three-dimensional memory device, comprising:
an alternating stack of insulating layers and electrically conductive layers;
a first three-dimensional memory array located in a first memory array region;
a second three-dimensional memory array located in a second memory array region that is laterally spaced from the first memory array region along a first horizontal direction by an inter-array region, wherein the electrically conductive layers comprise common word lines for the first three-dimensional memory array and for the second three-dimensional memory array; and
a retro-stepped dielectric material portion overlying and contacting horizontally-extending surface segments of the alternating stack,
wherein:
the alternating stack is laterally bounded by two trench fill structures that are laterally spaced apart along a second horizontal direction by an inter-trench spacing;
the electrically conductive layers continuously extend between the first memory array region and the second memory array region and comprise a respective bridge region that is located in the inter-array region and having a width along the second horizontal direction that is less than the inter-trench spacing;
the inter-array region comprises a stepped surface region comprising first vertically-extending surface segments of the alternating stack that are perpendicular to the first horizontal direction and second vertically-extending surface segments of the alternating stack that are perpendicular to the second horizontal direction;
the horizontally-extending surface segments comprise first horizontally-extending surface segments that are arranged along the first horizontal direction in a first row, and second horizontally-extending surface segments that are arranged along the first horizontal direction in a second row that is laterally offset from the first row along the second horizontal direction;
each first vertically-extending surface segment within a first subset of the first vertically-extending surface segments is adjoined to a respective neighboring pair of the first horizontally-extending surface segments; and
each first vertically-extending surface segment within a second subset of the first vertically-extending surface segments is adjoined to a respective one of the first horizontally-extending surface segments and a respective one of the second horizontally-extending surface segments.

22. The three-dimensional memory device of claim 21, wherein a total number of the second horizontally-extending surface segments is the same as a total number of the first horizontally-extending surface segments.

23. The three-dimensional memory device of claim 21, wherein a total number of the second horizontally-extending surface segments is less than a total number of the first horizontally-extending surface segments.

* * * * *